United States Patent [19]

Steiner

[11] 4,227,798

[45] Oct. 14, 1980

[54] PROTECTION SYSTEM FOR ELECTROSTATOGRAPHIC MACHINES

[75] Inventor: Edward Steiner, Macedon, N.Y.

[73] Assignee: Xerox Corporation, Stamford, Conn.

[21] Appl. No.: 933,325

[22] Filed: Aug. 14, 1978

Related U.S. Application Data

[63] Continuation of Ser. No. 677,346, Apr. 15, 1976, abandoned.

[51] Int. Cl.³ .......................... G03G 15/00; G11C 7/00

[52] U.S. Cl. .................................... 355/14 C; 365/222

[58] Field of Search ............................ 355/14 R, 14 C; 365/222

[56] References Cited

U.S. PATENT DOCUMENTS

| | | | |
|---|---|---|---|
| 3,624,295 | 11/1971 | Pederson | 178/69 G |
| 3,810,129 | 5/1974 | Behman et al. | 340/173 DR |
| 3,944,360 | 3/1976 | Deetz et al. | 355/14 C |
| 4,104,726 | 8/1978 | Fisk et al. | 355/14 C X |
| 4,120,034 | 10/1978 | Fisk et al. | 355/14 C X |

*Primary Examiner*—Fred L. Braun
*Attorney, Agent, or Firm*—Ronald F. Chapuran; Frederick E. McMullen; Harvey M. Brownrout

[57] ABSTRACT

An electrostatographic type copying or reproduction machine incorporating a programmable controller to operate the various machine components in an integrated manner to produce copies. The controller carries a master program bearing machine operating parameters from which an operating program for the specific copy run desired is formed and used to operate the machine components to produce the copies programmed. A multiple prioritized interrupt system is employed to distribute the operating program to the machine. In particular, upon periodic interruption, control data is output (refreshed) to the various machine components and failure to refresh within a preset interval inhibits machine operation.

16 Claims, 39 Drawing Figures

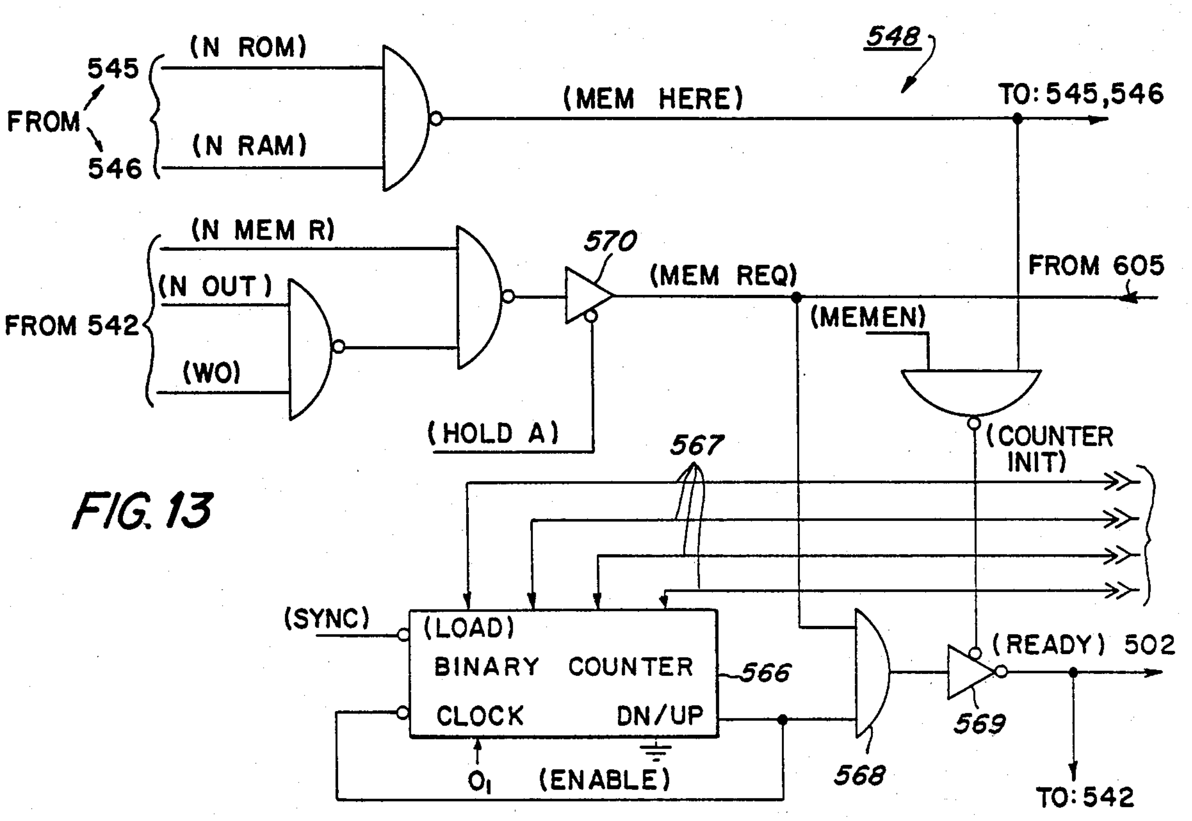
FIG. 13
MEMORY READY
FIG. 16
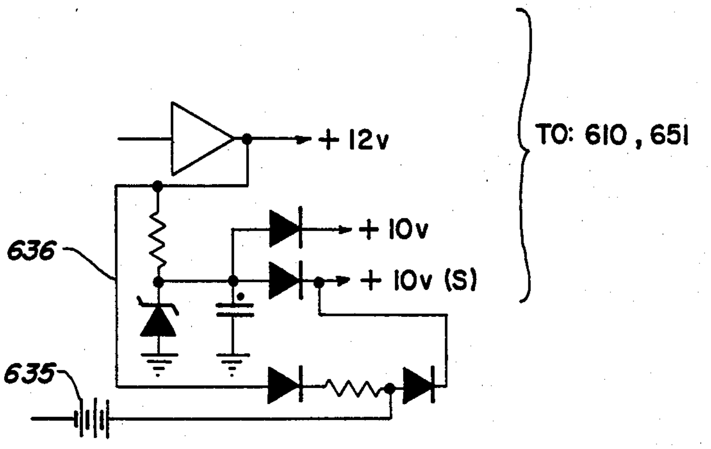

PITCH RESET INTERRUPT ROUTINE

LEGEND:

SR-SHIFT REGISTER
SR@PTR-SHIFT REGISTER POINTER
EV-EVENT
EV@PTR-EVENT POINTER
CNTR-COUNTER
INCRM-INCREMENT

MACHINE INTERRUPT ROUTINE

LEGEND:

PNTR-POINTER
INCRM-INCREMENT
REL-RELATIVE
ADDR-ADDRESS
SR-SHIFT REGISTER
REG-REGISTER
SUBR-SUBROUTINE

REAL TIME INTERRUPT

LEGEND:

PNTR - POINTER
RTC - REAL TIME COUNTER
CNTR - COUNTER
REG - REGISTER

PROTECTION SYSTEM FOR ELECTROSTATOGRAPHIC MACHINES

This is a continuation of application Ser. No. 677,346, filed Apr. 15, 1976 now abandoned.

This invention relates to electrostatographic xerographic type reproduction machines, and more particularly, to an improved control system for such machines.

The advent of higher speed and more complex copiers and reproduction machines has brought with it a corresponding increase in the complexity in the machine control wiring and logic. While this complexity manifests itself in many ways, perhaps the most onerous involves the inflexibility of the typical control logic/wiring systems. For as can be appreciated, simple unsophisticated machines with relatively simple control logic and wiring can be altered and modified easily to incorporate changes, retrofits, and the like. Servicing and repair of the control logic is also fairly simple. On the other hand, some modern high speed machines, which often include sorters, a document handler, choice of copy size, multiple paper trays, jam protection and the like have extremely complex logic systems making even the most minor changes and improvements in the control logic difficult, expensive and time consuming. And servicing or repairing the machine control logic may similarily entail substantial difficulty, time and expense.

To mitigate problems of the type alluded to, a programmable controller may be used, enabling changes and improvements in the machine operation to be made through the expediency of reprogramming the controller. However, the control data which operates the machine and which is stored in the controller memory pending use, must be transferred to the various machine components at the proper time and in the correct sequence without unduly interfering with or intruding unnecessarily upon the other essential functions and operations of the controller.

It is therefore an object of the present invention to provide a new and improved control system for electrostatographic type reproduction machines.

It is a further object of the present invention to provide a system for interrupting operation of the programmable controller for a reproduction machine to permit operating data to be transferred from the controller memory section to the processing section or processor for the reproduction machine.

It is an object of the present invention to provide a multiple, prioritized interrupt system for transferring program operating data to a computer controlled reproduction machine.

It is an object of the present invention to provide an interrupt system driven in synchronization with the reproduction machine being controlled to transfer operating data to the machine.

It is a further object of the present invention to provide a control for an electrostatographic reproduction machine comprised of background and foreground machine operating routines, the latter containing operating data associated with the copy run or runs programmed.

It is an object of the present invention to provide a reproduction machine control comprised of background and foreground operating routines with an arrangement for temporarily interrupting the background routine in progress to transfer operating data from the foreground operating routine to said machine.

It is an object of the present invention to provide a reproduction machine control including machine background and foreground operating control routines, the latter being associated with the copy run or runs programmed, together with means for transferring operating data from the foreground operating control routines to the machine in synchronism with the machine.

It is an object of the present invention to provide a control for an electrostatographic type reproduction machine comprised of background and foreground machine operating routines with a multiple prioritized system for interrupting the background control routine in progress to transfer and/or update operating data from the foreground routine.

It is an object of the present invention to provide a multiple prioritized interrupt system for synchronizing operation of the component parts of a xerographic machine in a real time environment.

The invention relates to a reproduction machine for producing copies of an original having a photosensitive member, plural discrete components cooperable with one another and the photosensitive member to electrostatically produce copies on a support material and timing means for synchronizing operation of the machine components with one another, the combination comprising control means for operating the machine components in accordance with a control program whereby to provide an operative reproduction machine, the control program including background operating routines and foreground operating routines, the foreground operating routines being associated with the timing means; the control means normally operating the machine components in accordance with the control program background routines; and interrupt means to temporarily suspend the background routine in progress and transfer operating control of the machine to the control program foreground routines whereby operating instructions for the machine components from the foreground operating routines are relayed in synchronous fashion.

Other objects and advantages will be apparent from the ensuing description and drawings in which.

Figure 1:
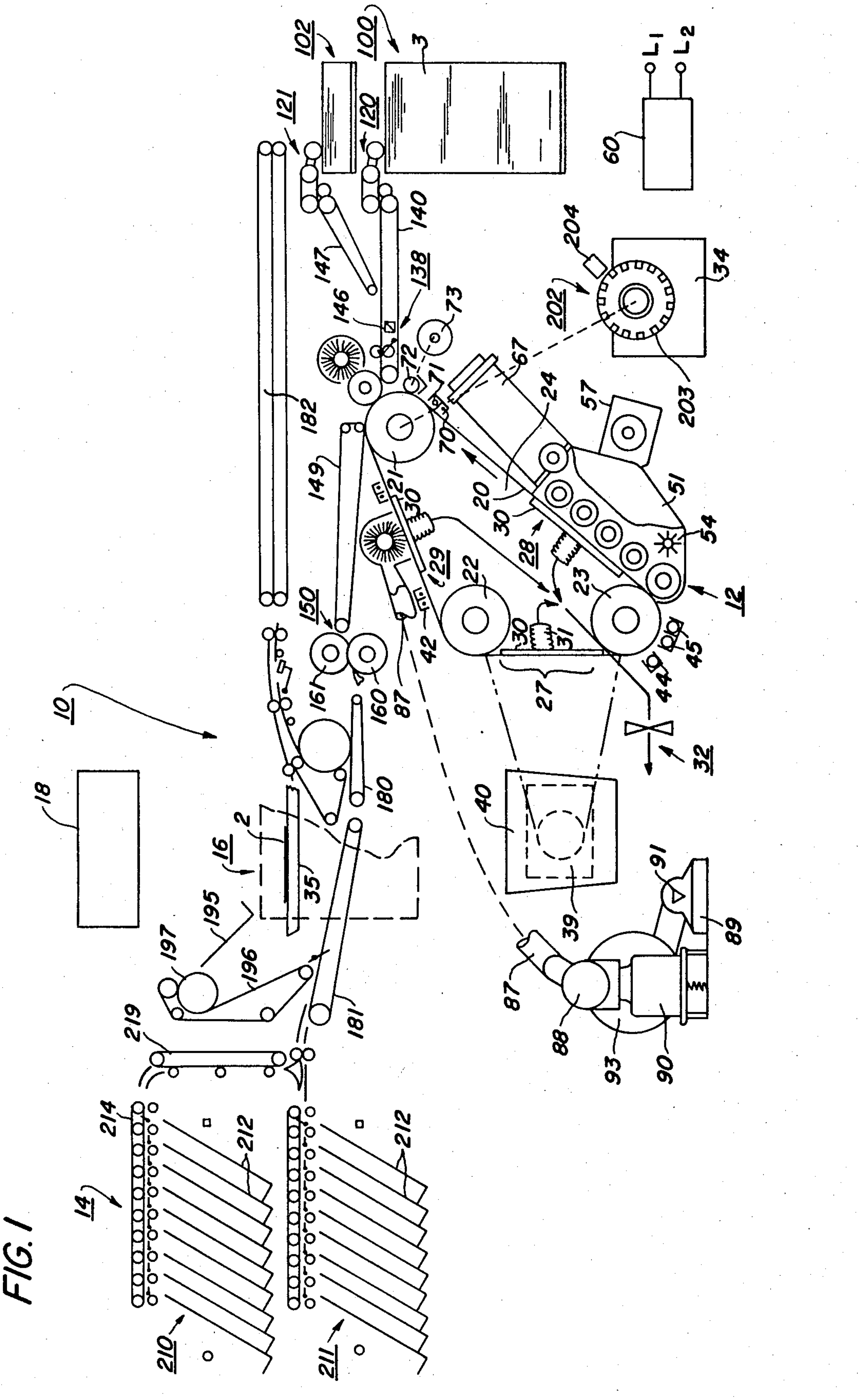
FIG. 1 is a schematic representation of an exemplary reproduction apparatus incorporating the control system of the present invention.
Figure 10A:
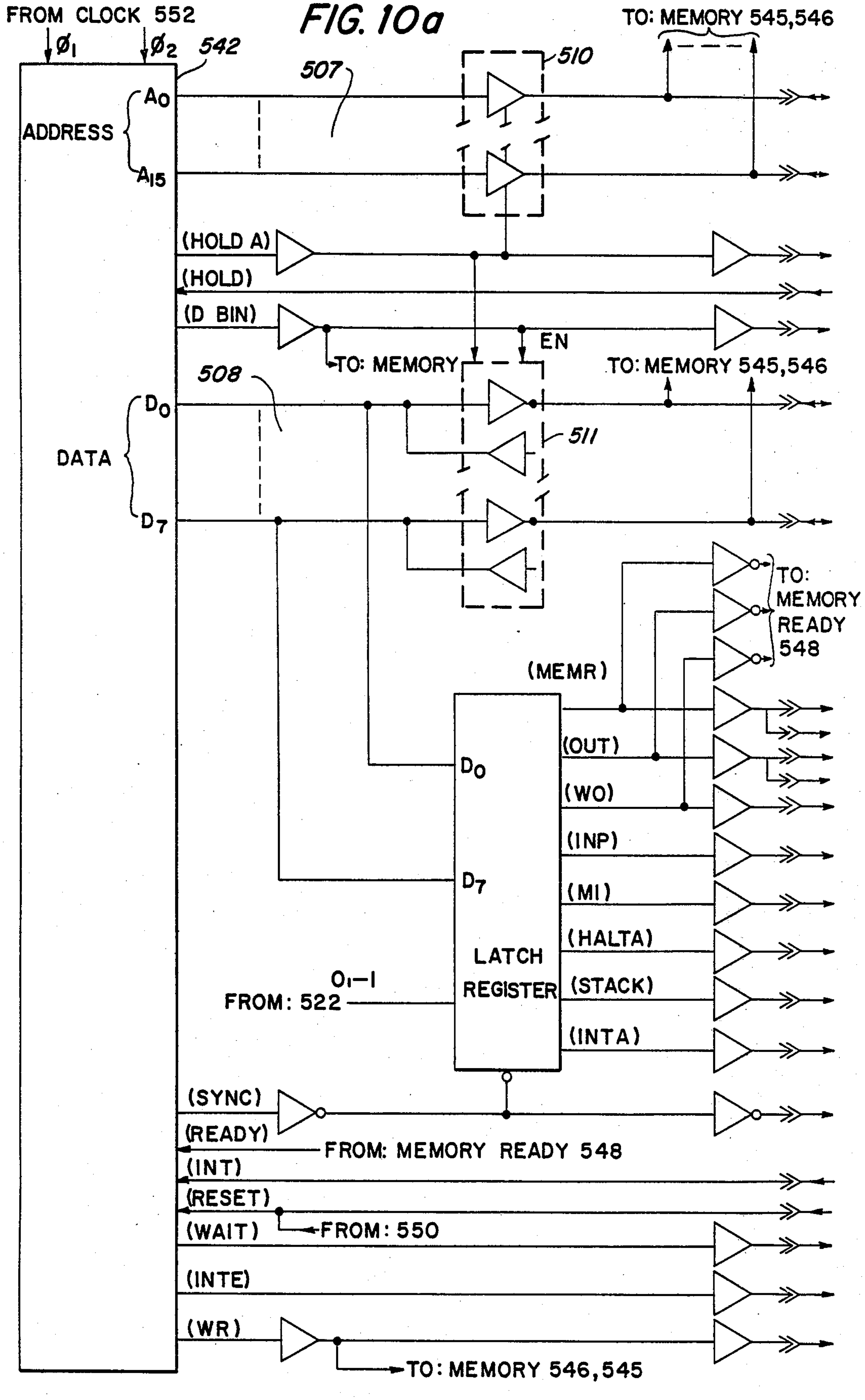
Figure 10B:
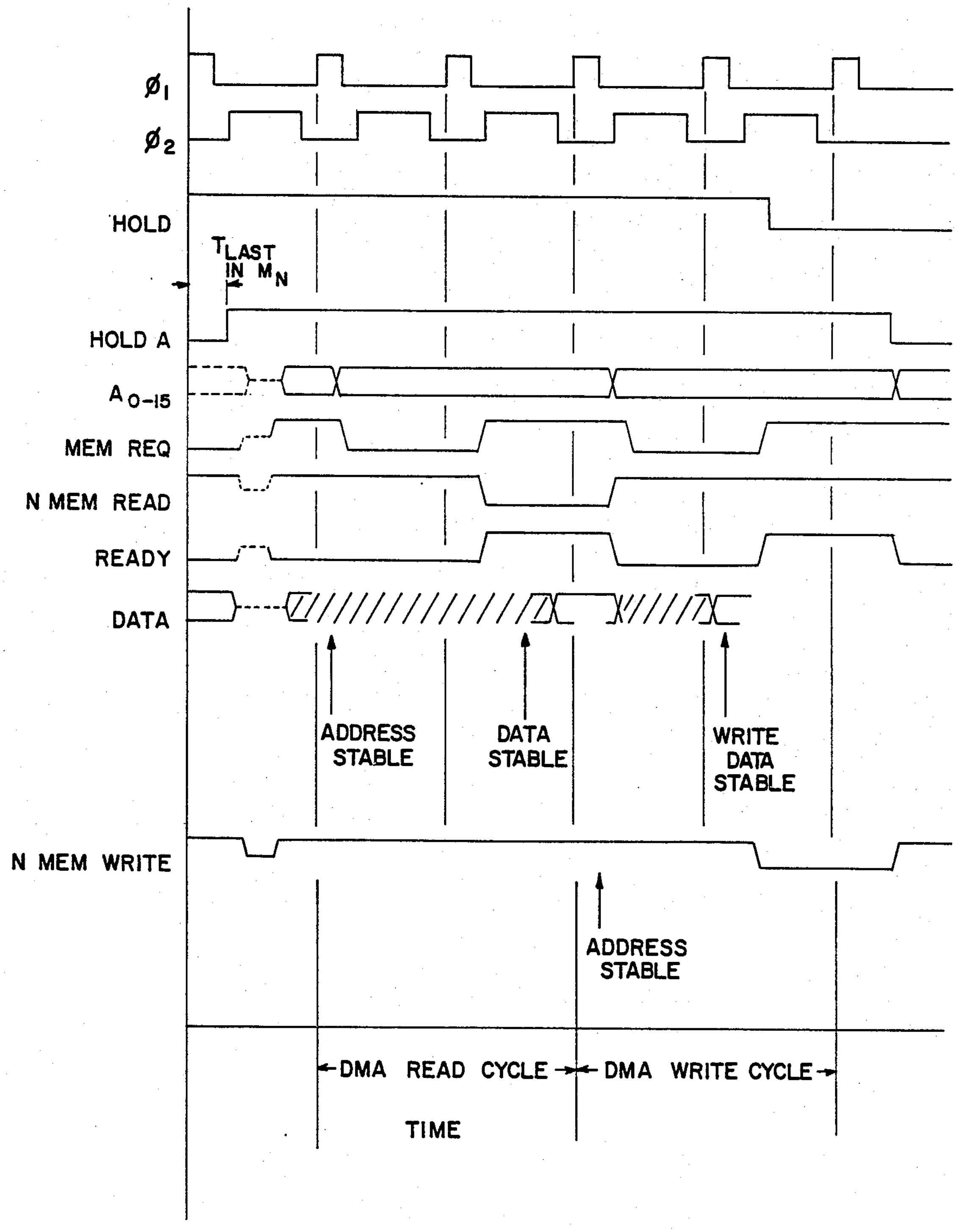
Figure 11A:
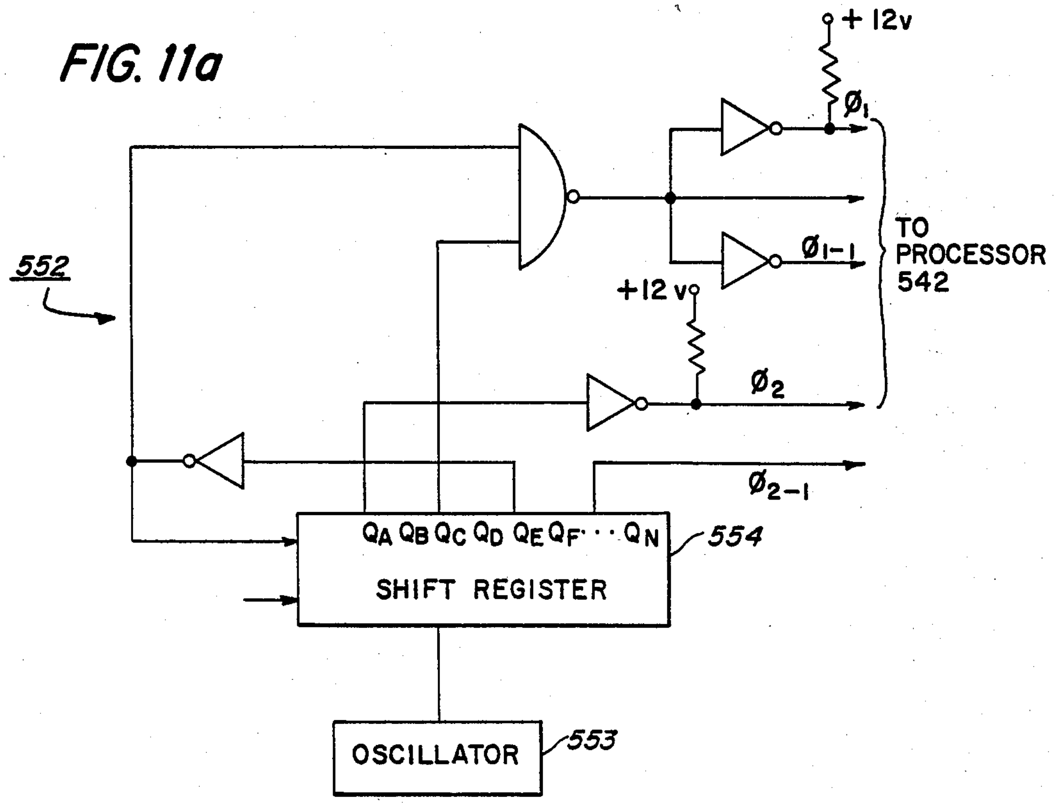
Figure 11B:
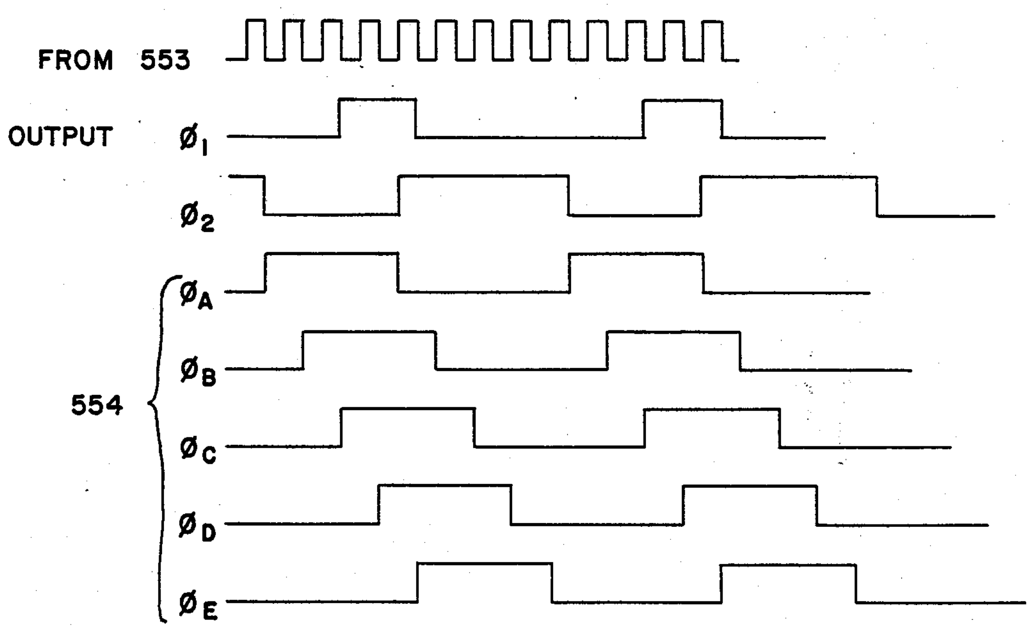
Figure 12:
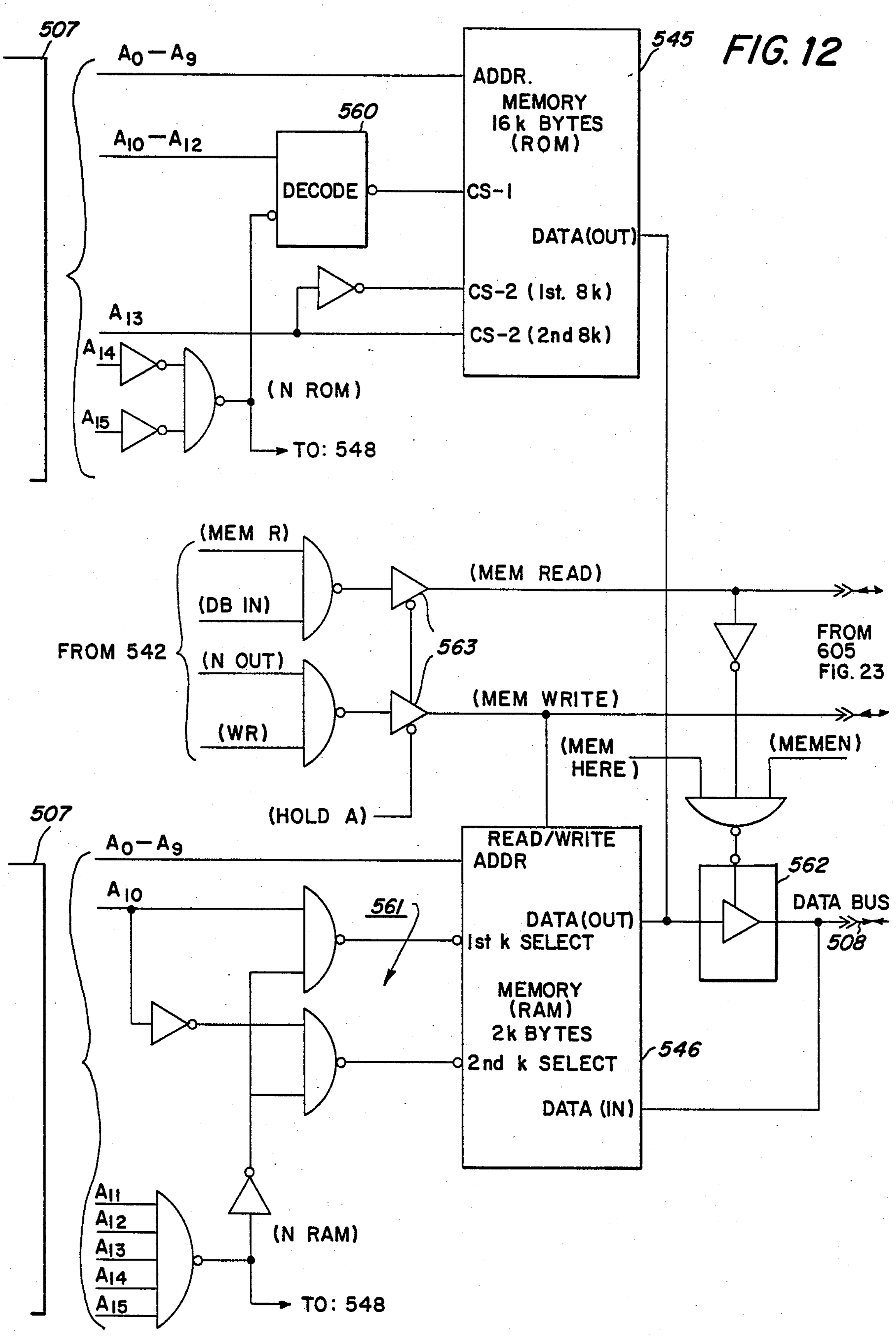
Figure 14A:
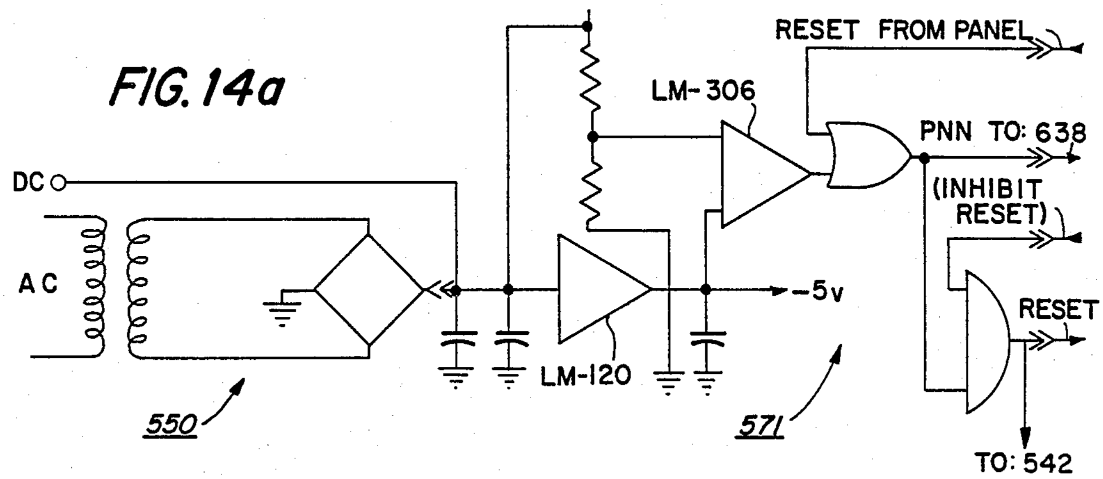
Figure 14B:
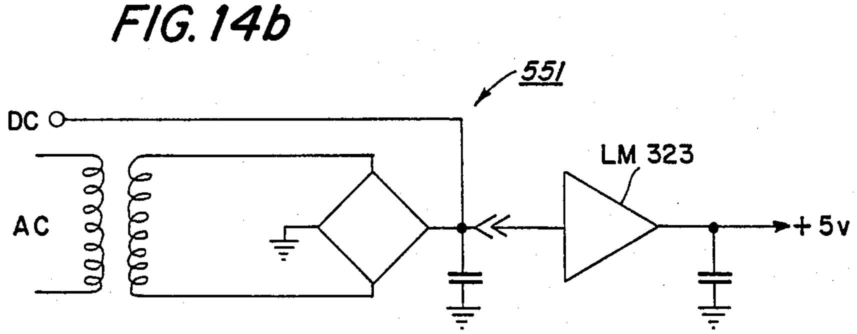
Figure 14C:
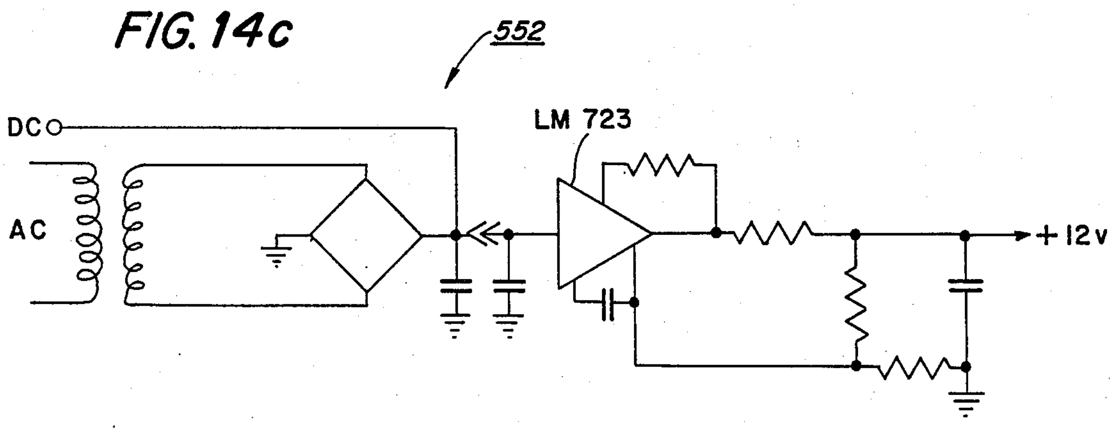
Figure 15A:
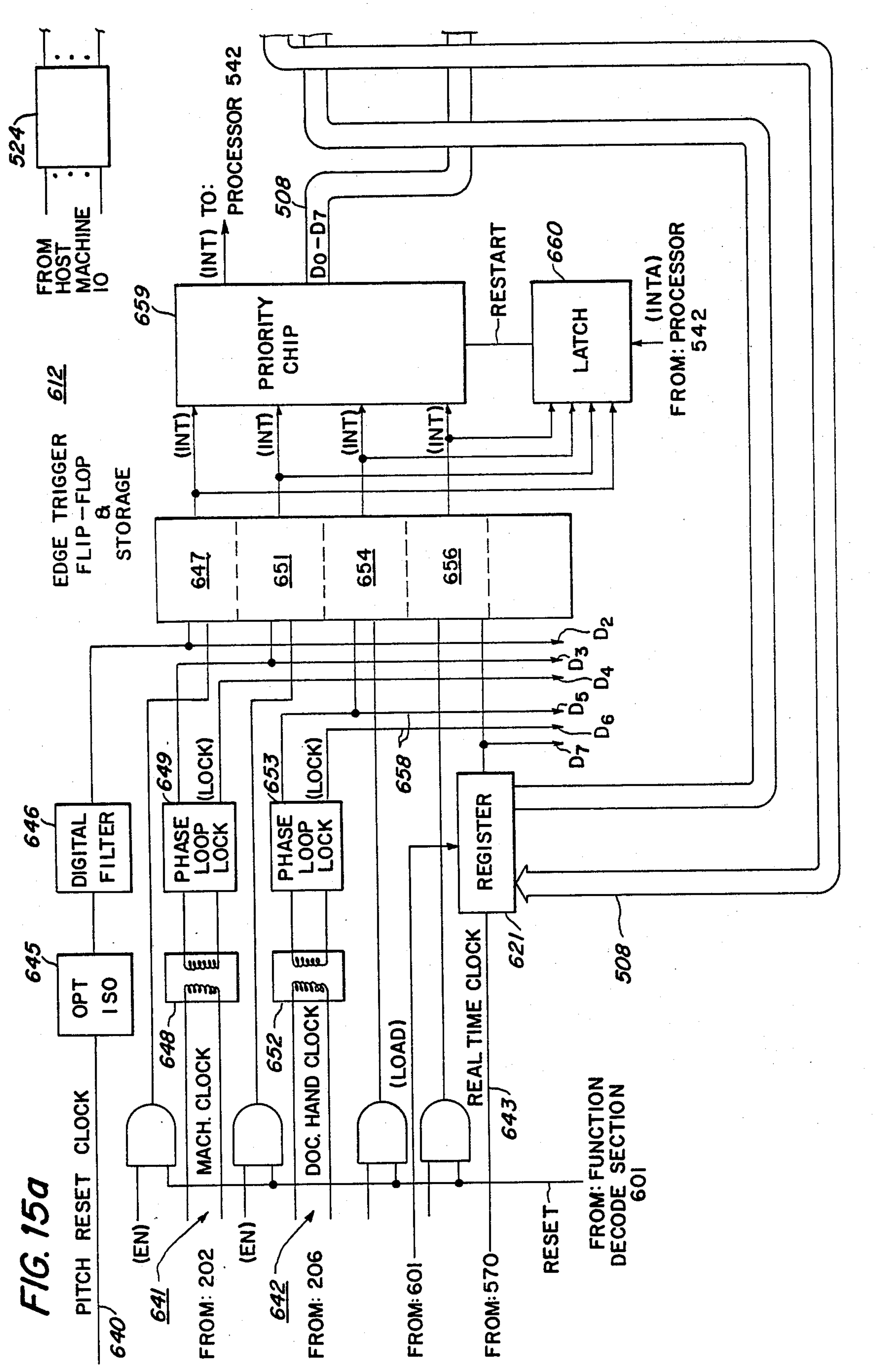
Figure 15B:
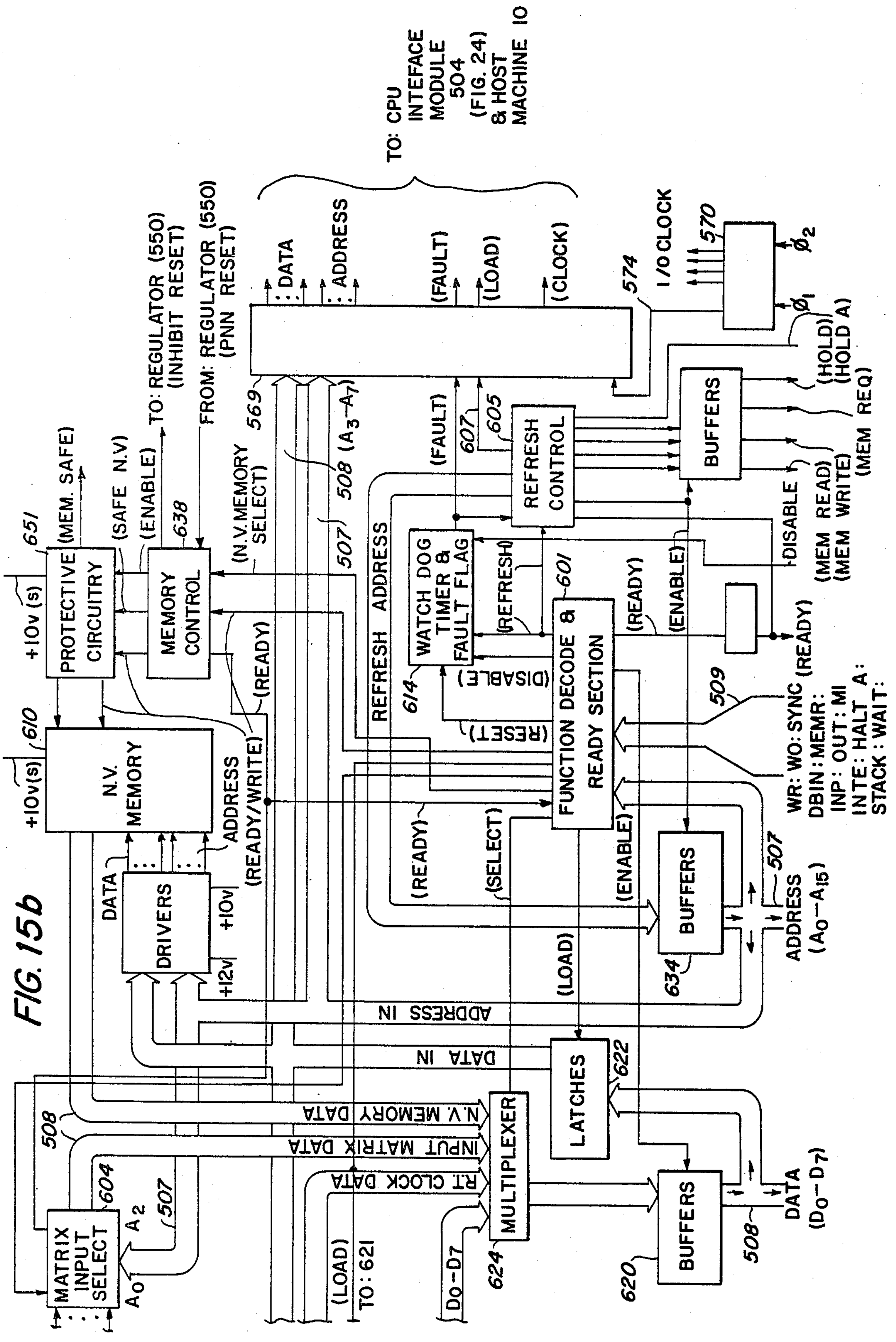
Figure 17:
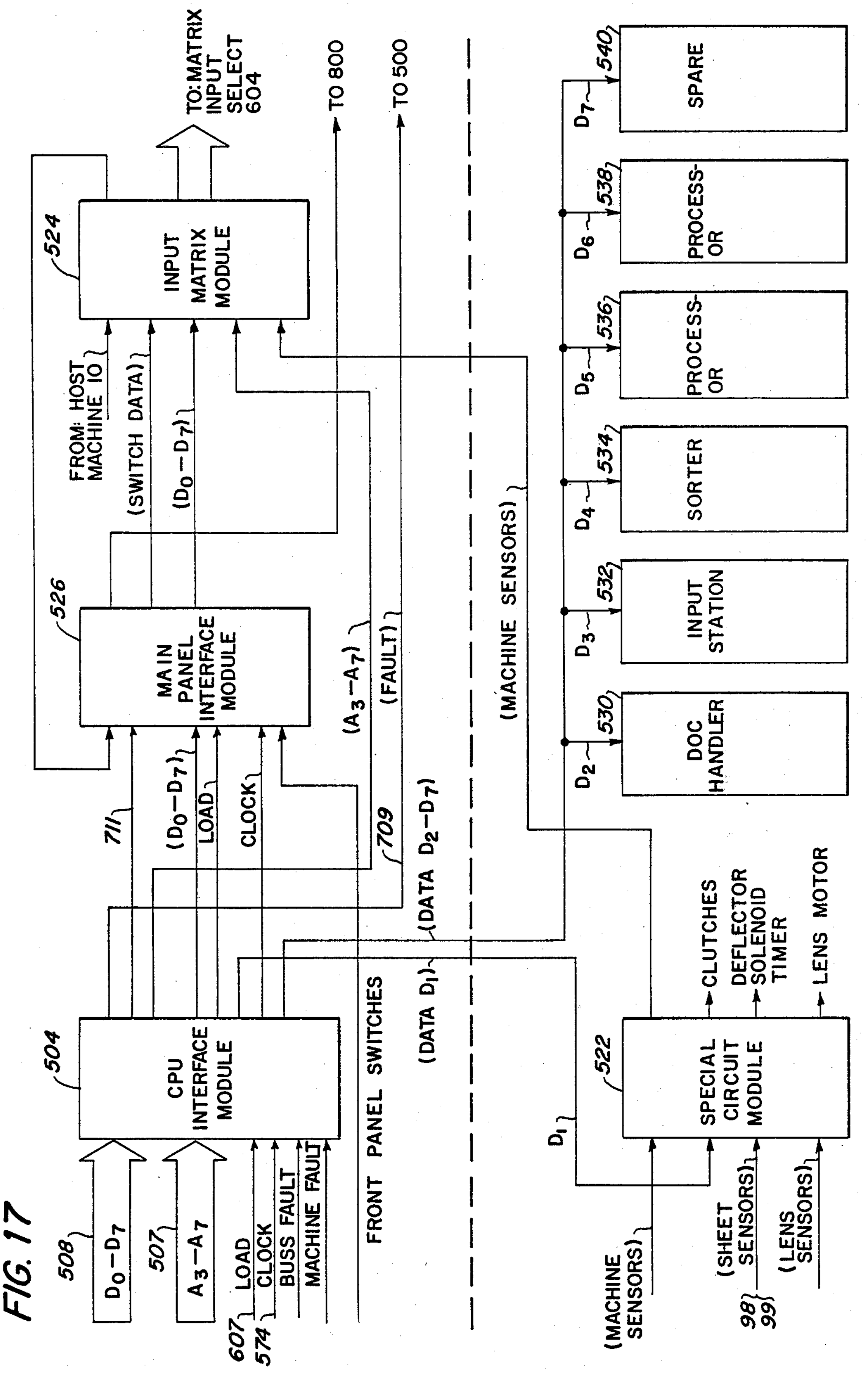
Figure 18:
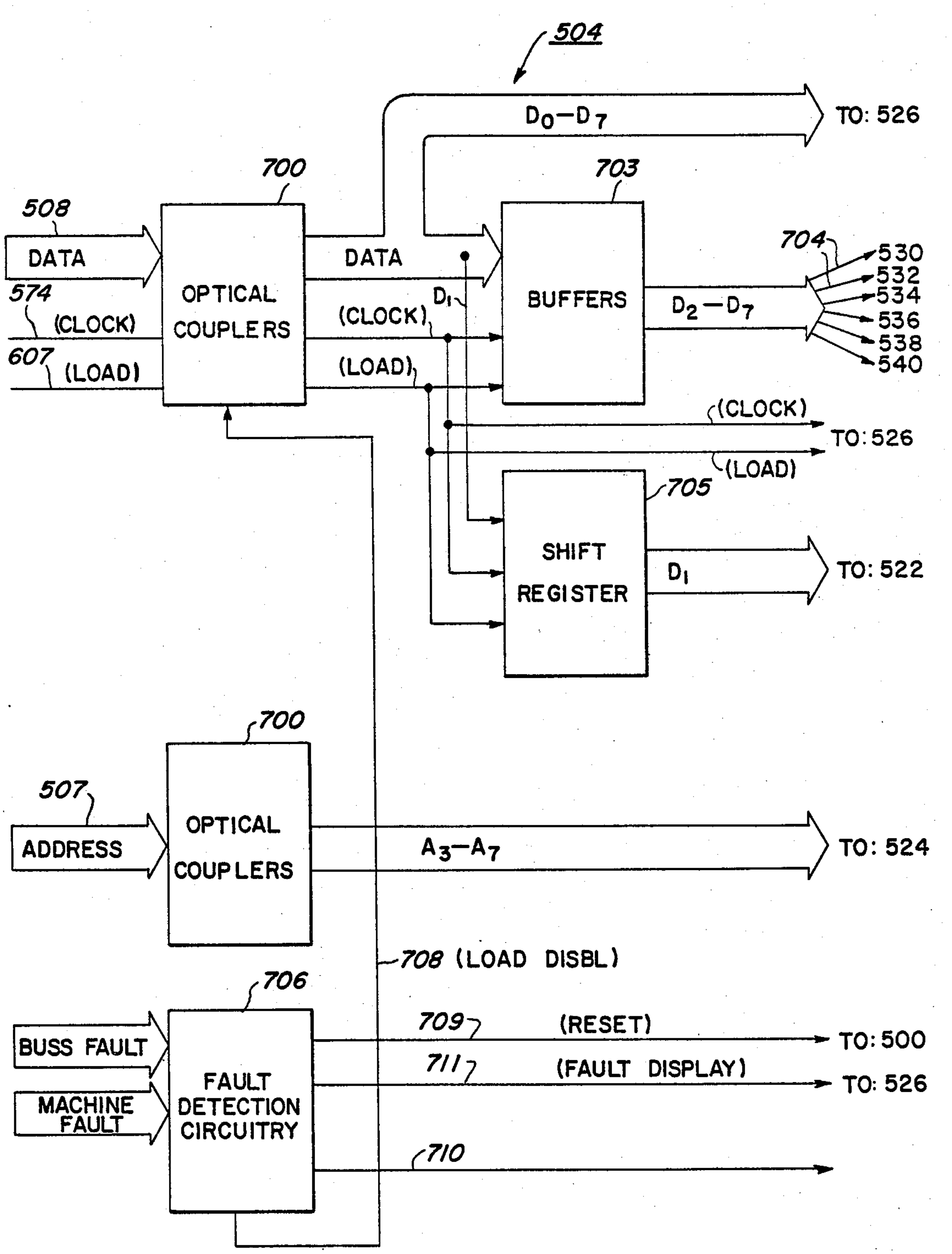
Figure 19:
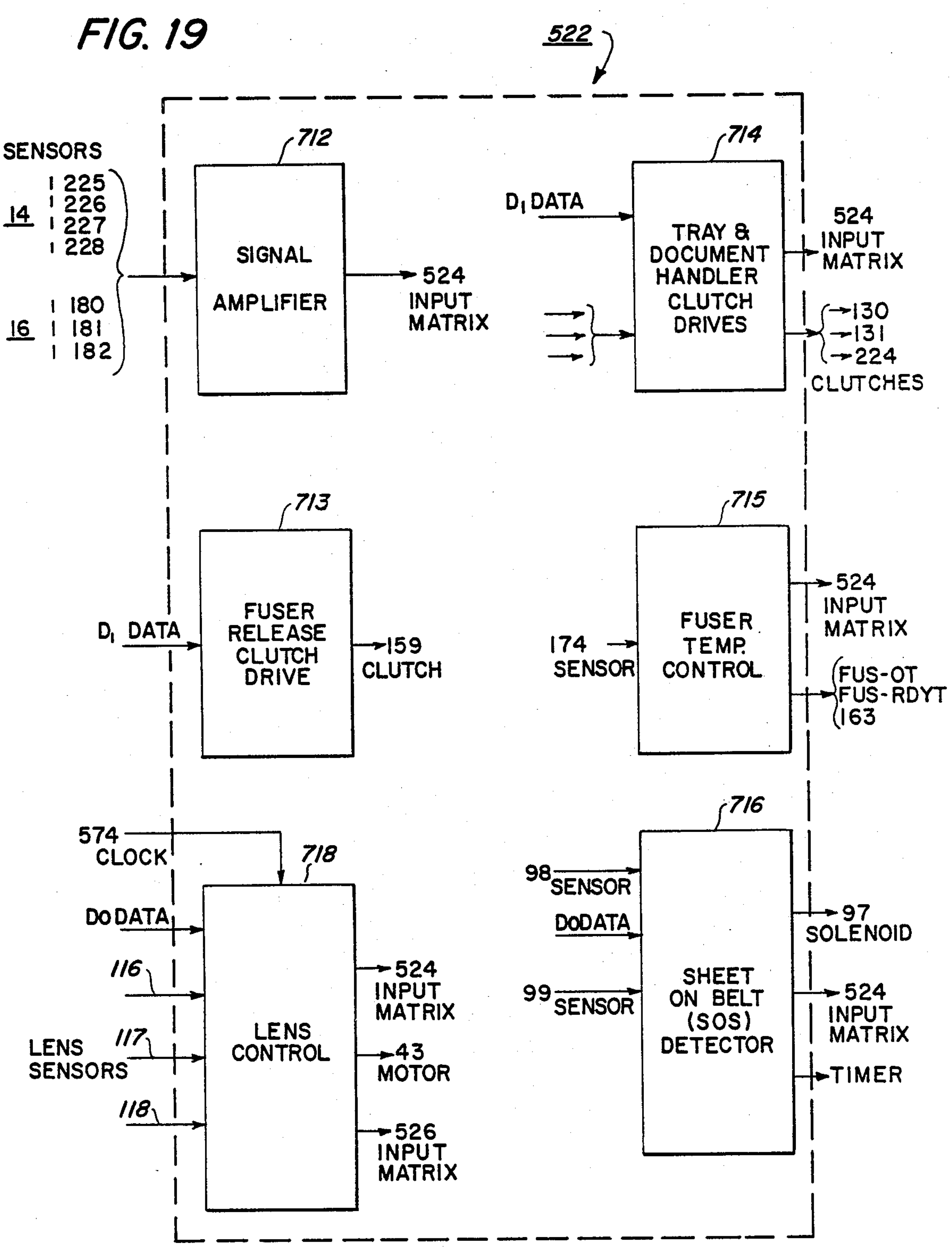
Figure 20:
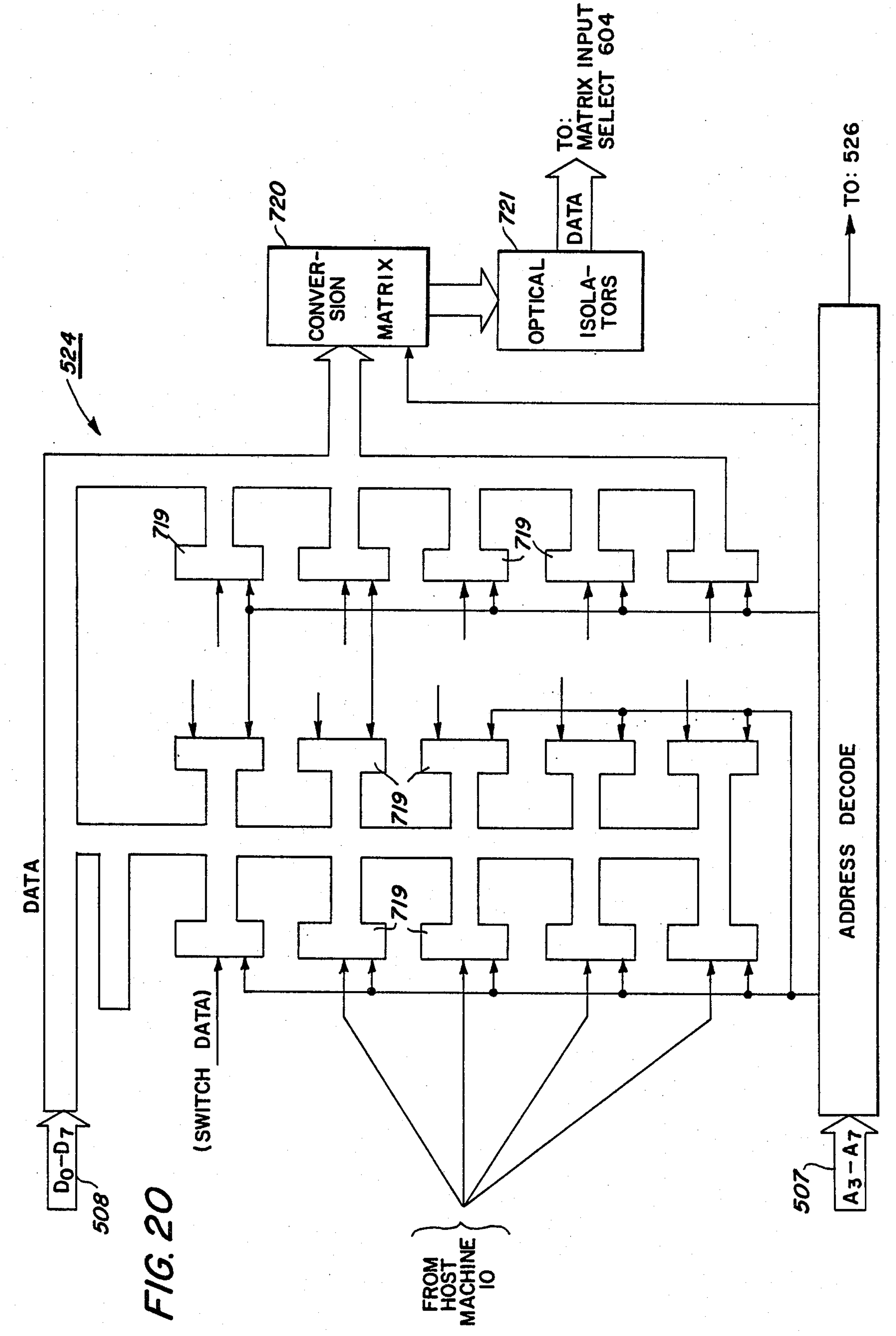
Figure 21:
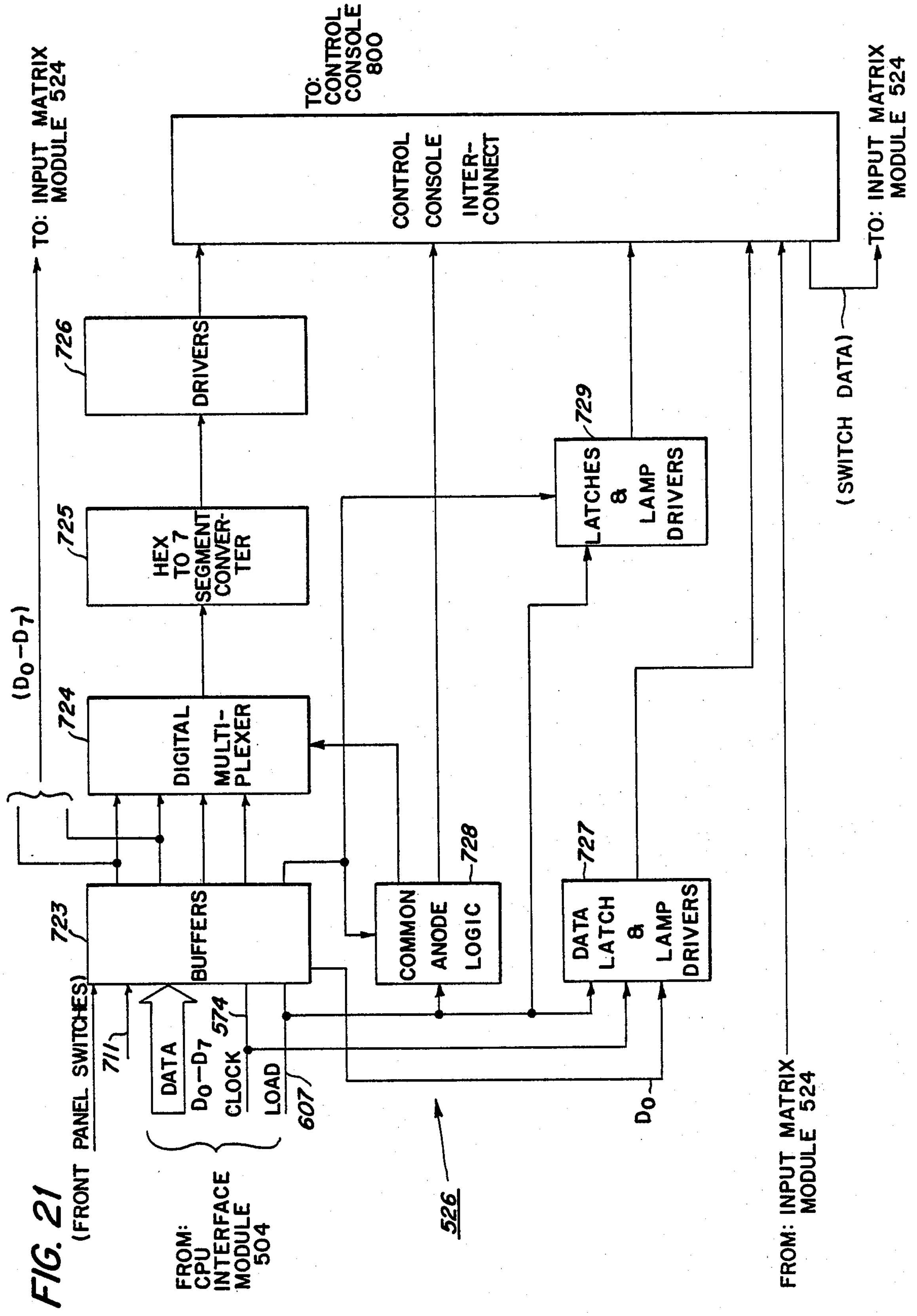
Figure 22:
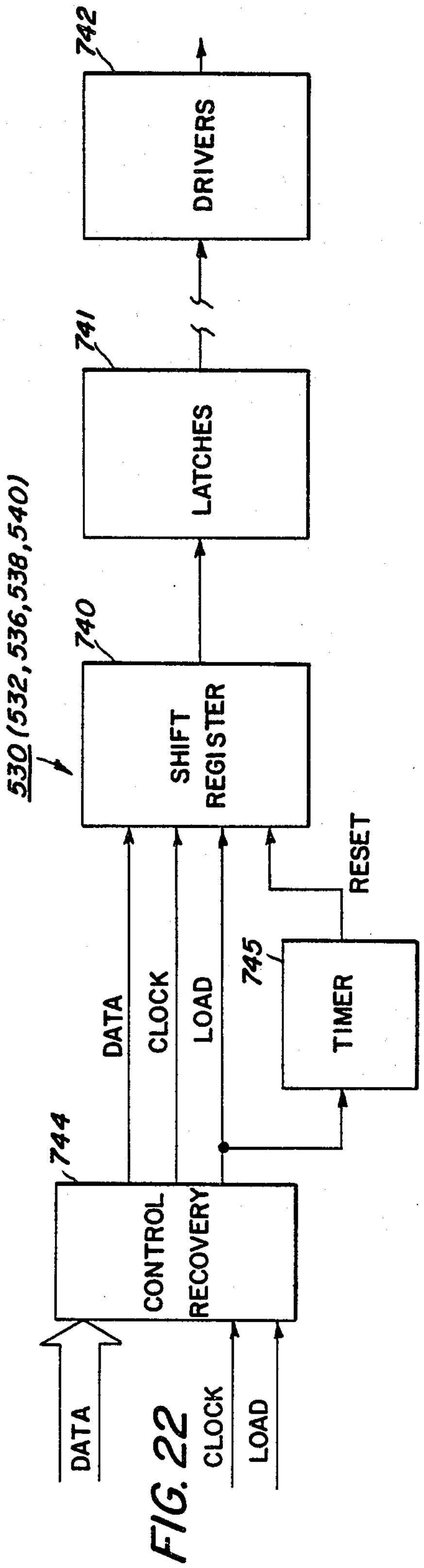
Figure 23:
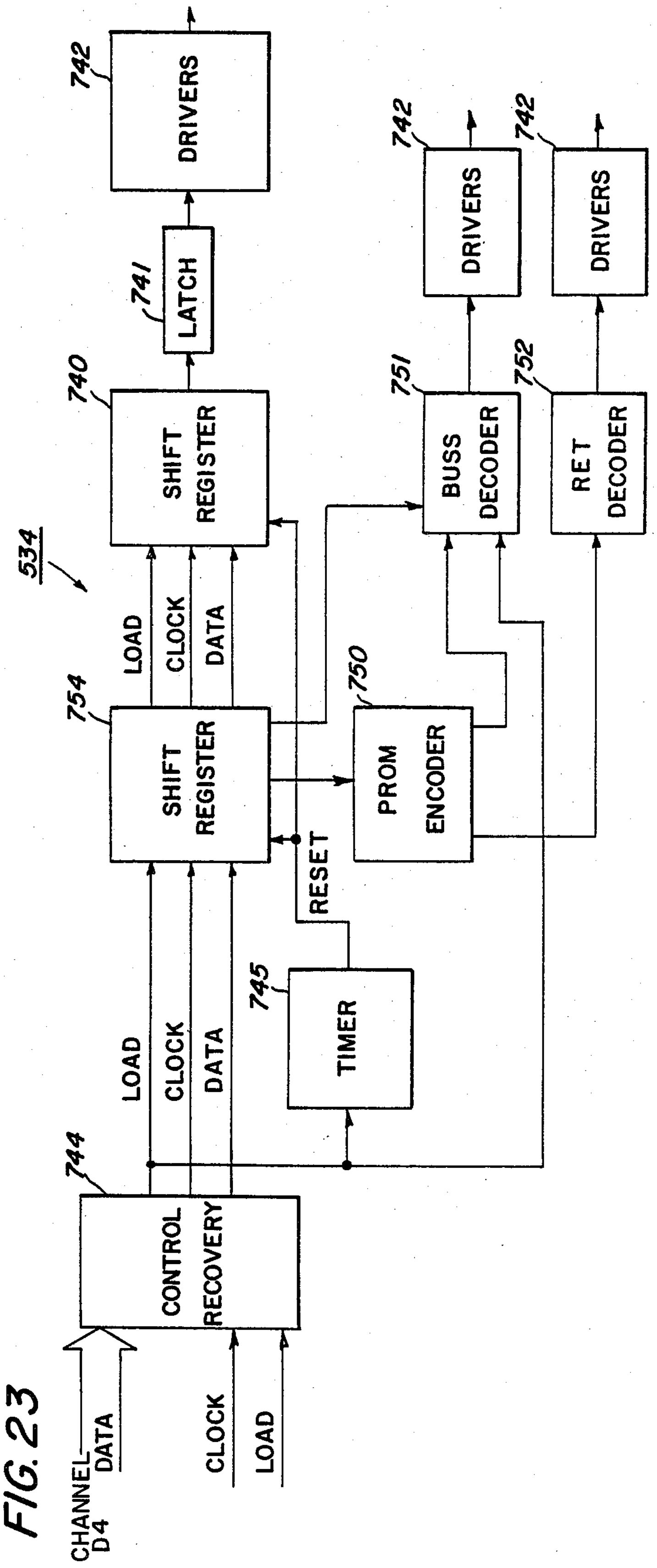
Figure 24:
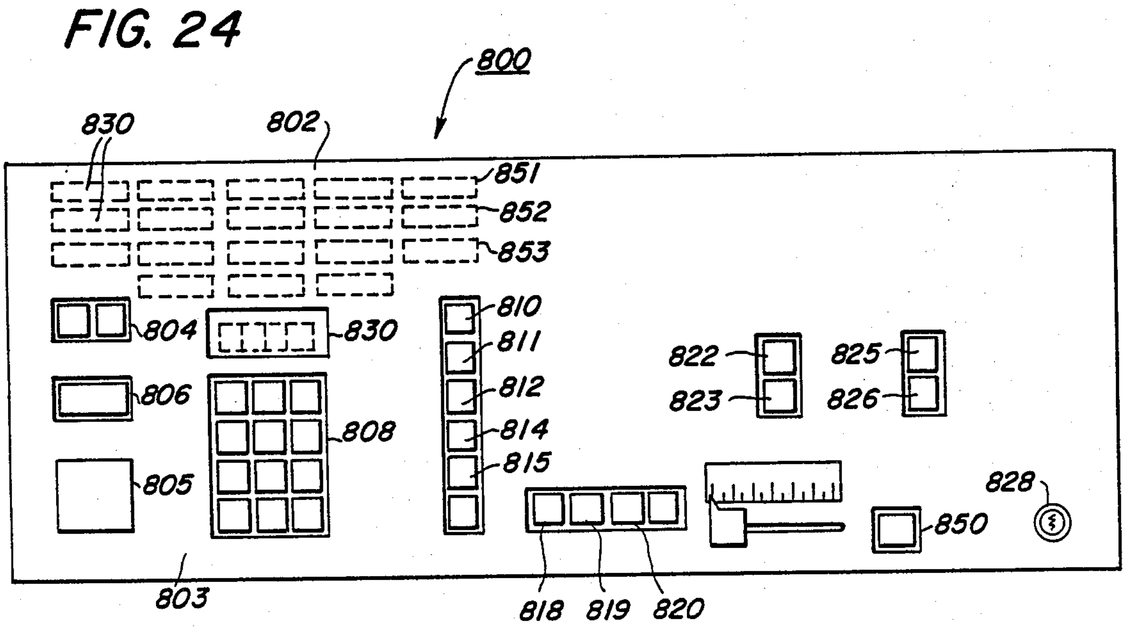
Figure 25:
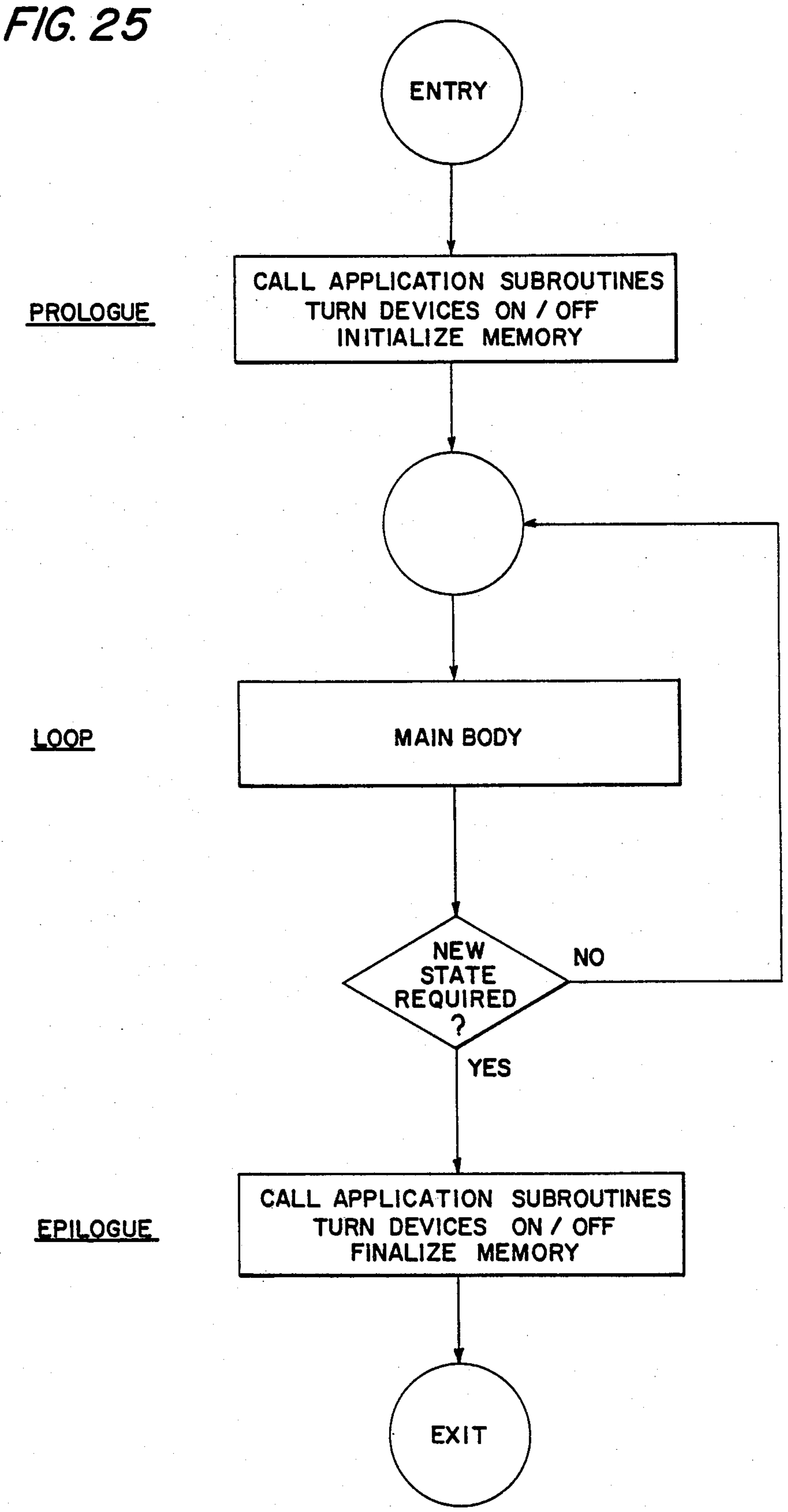
Figure 26A:
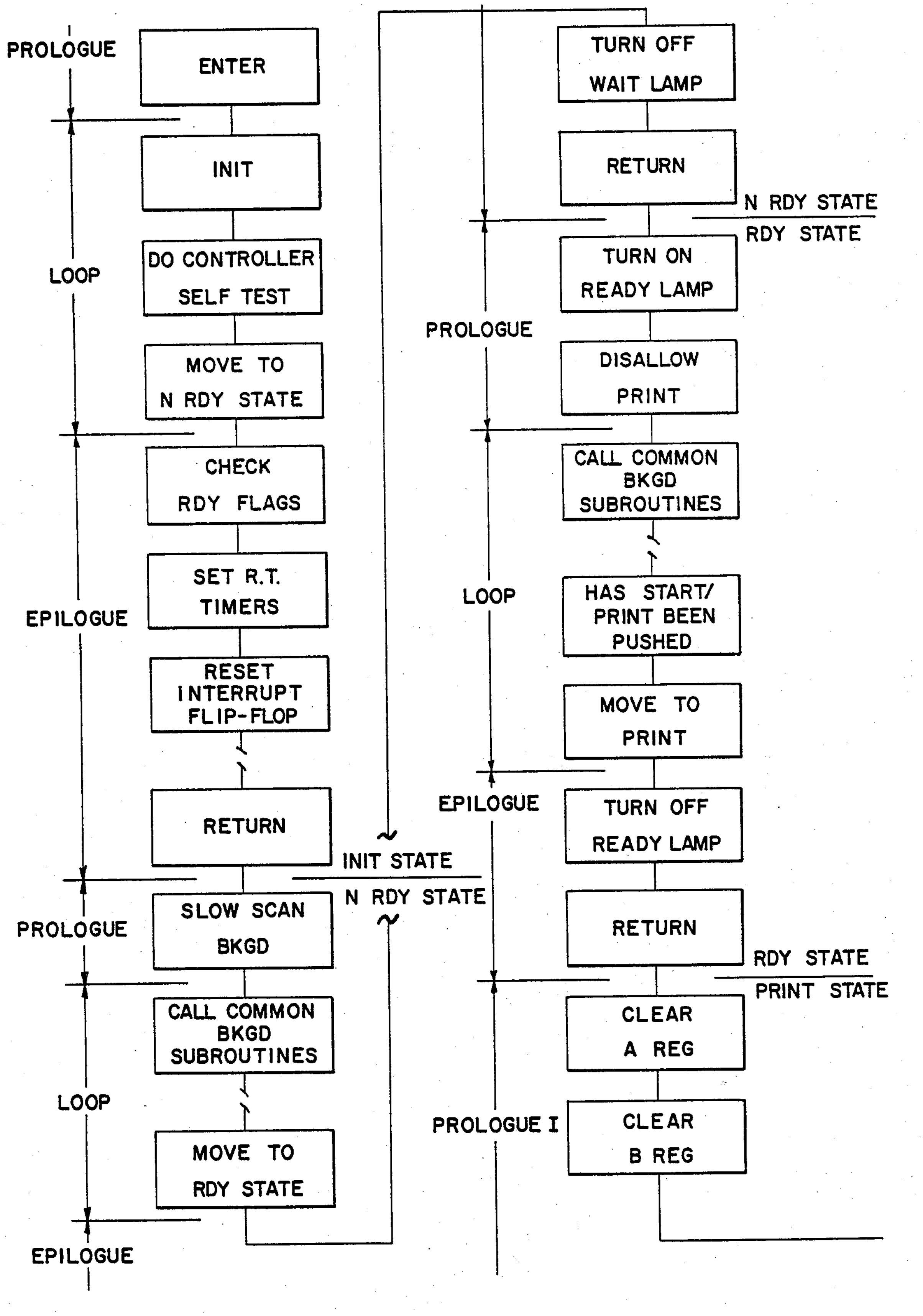
Figure 26B:
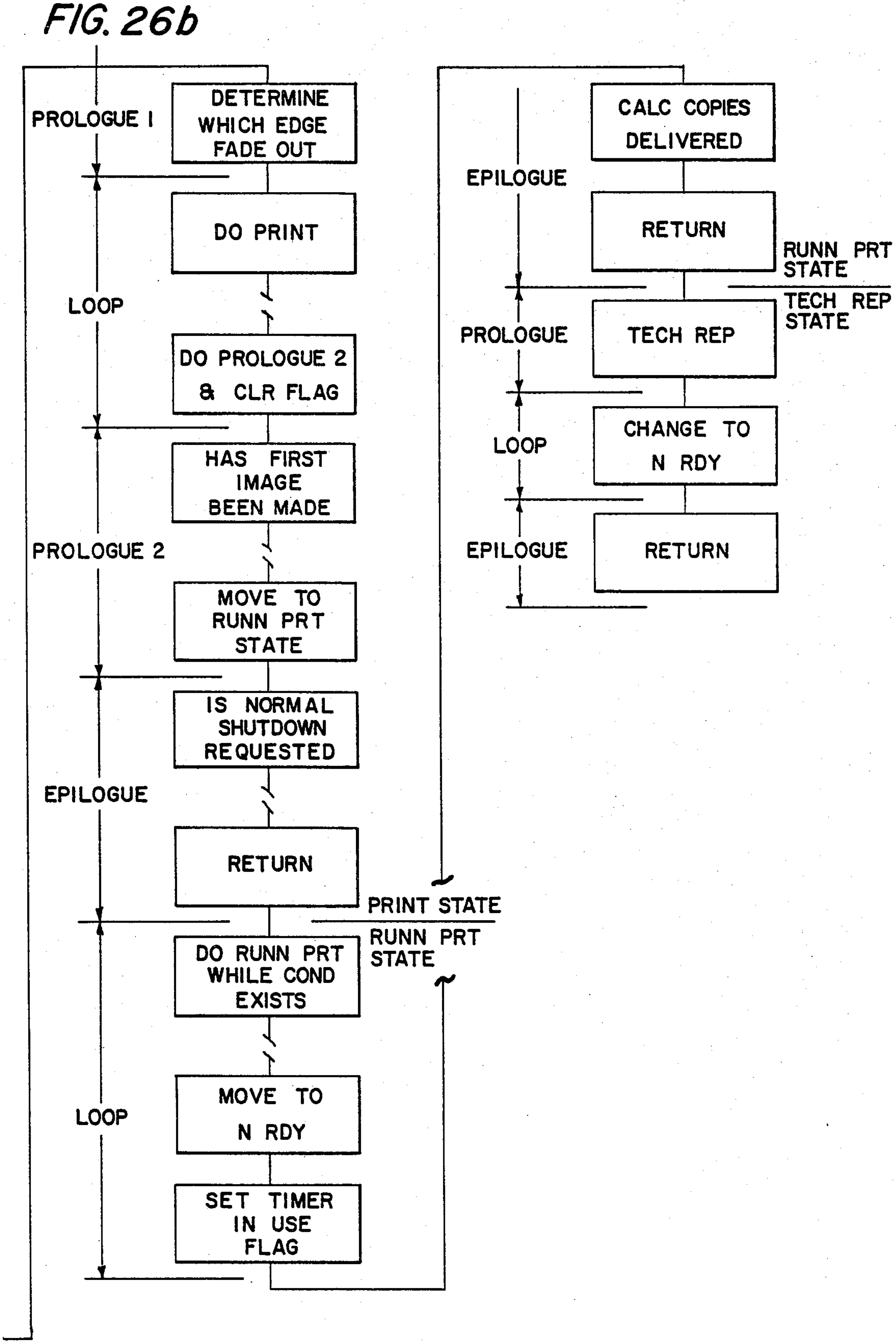
Figure 27:
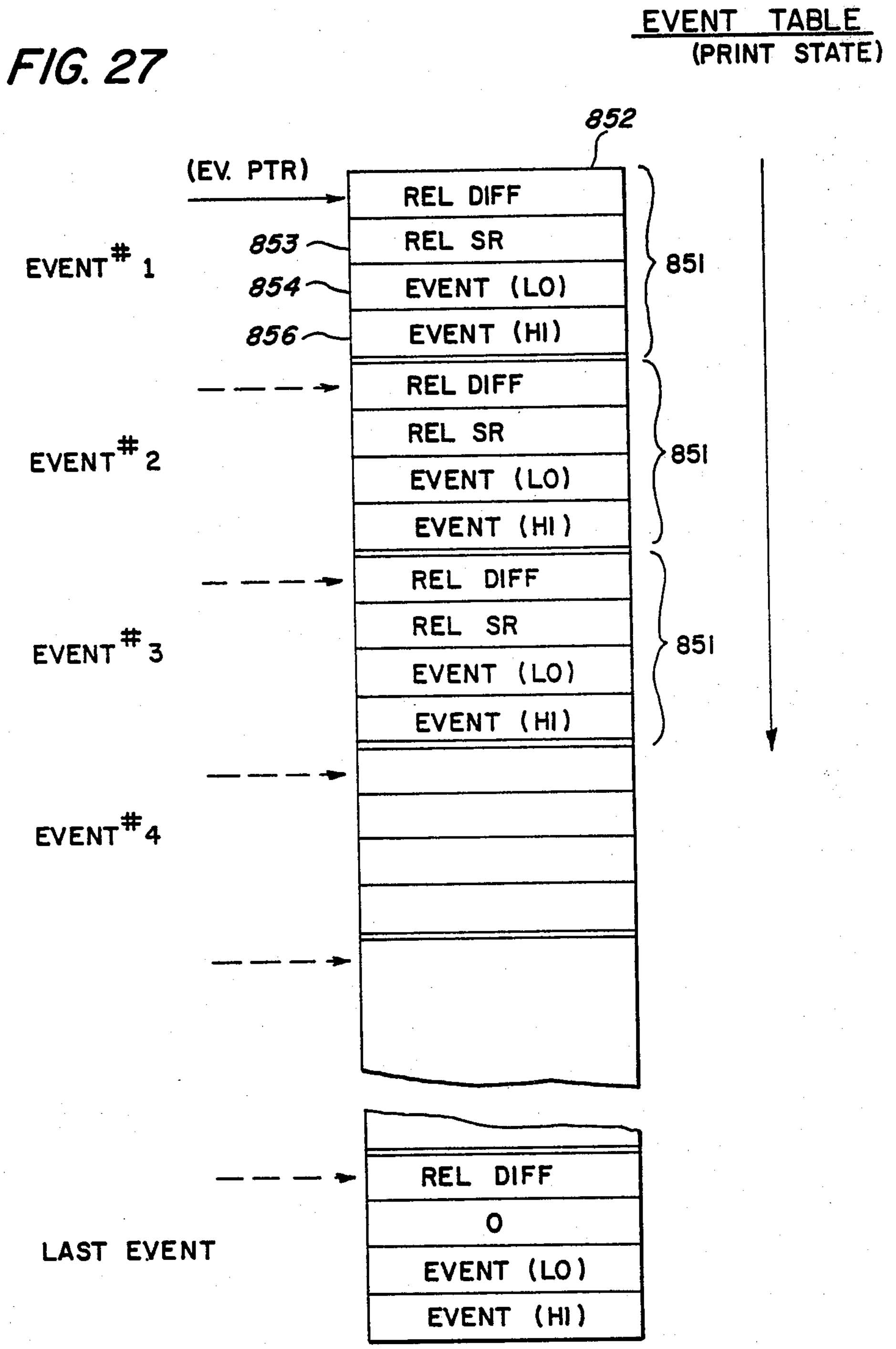
Figure 28:
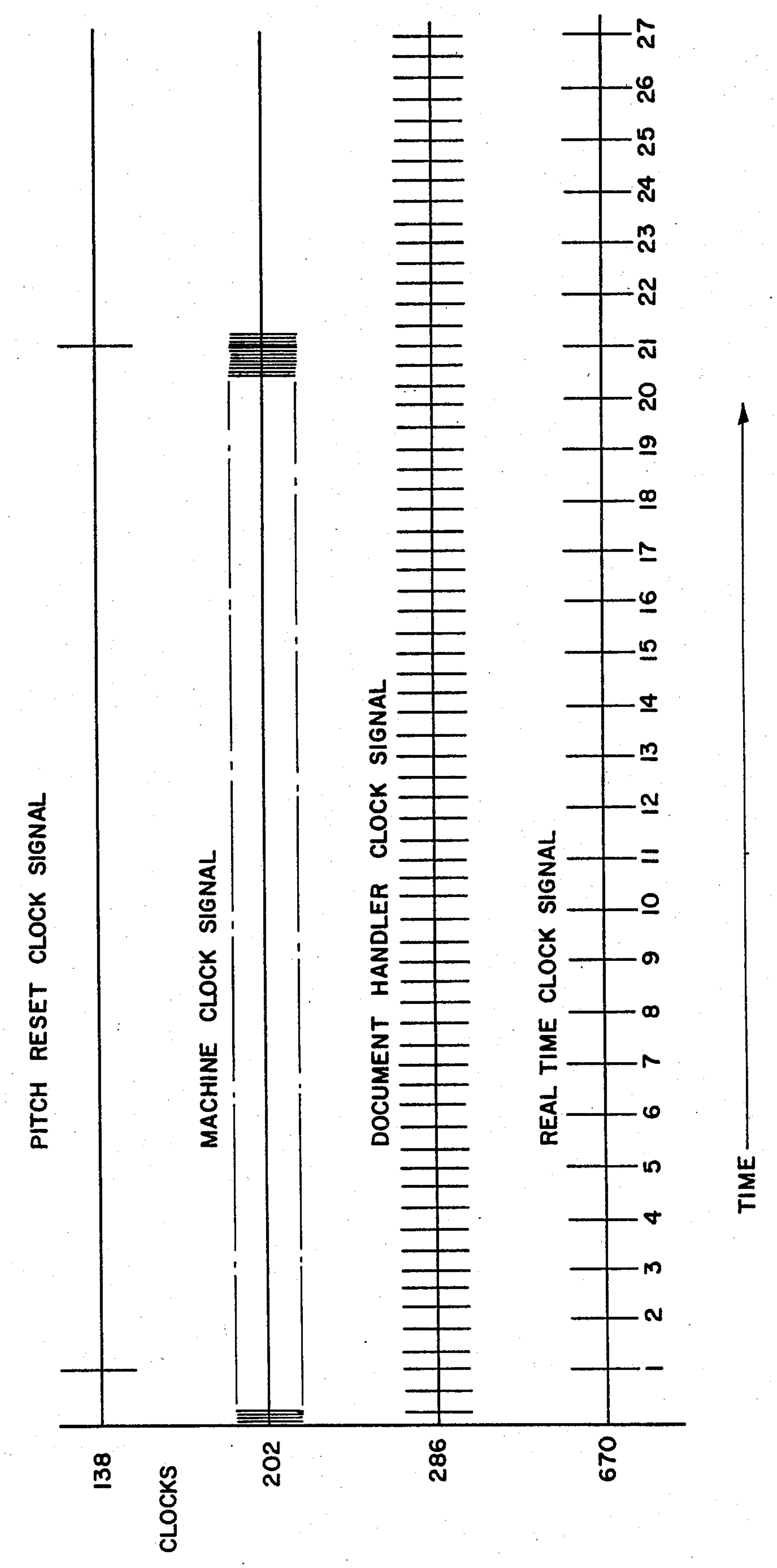
Figure 29:
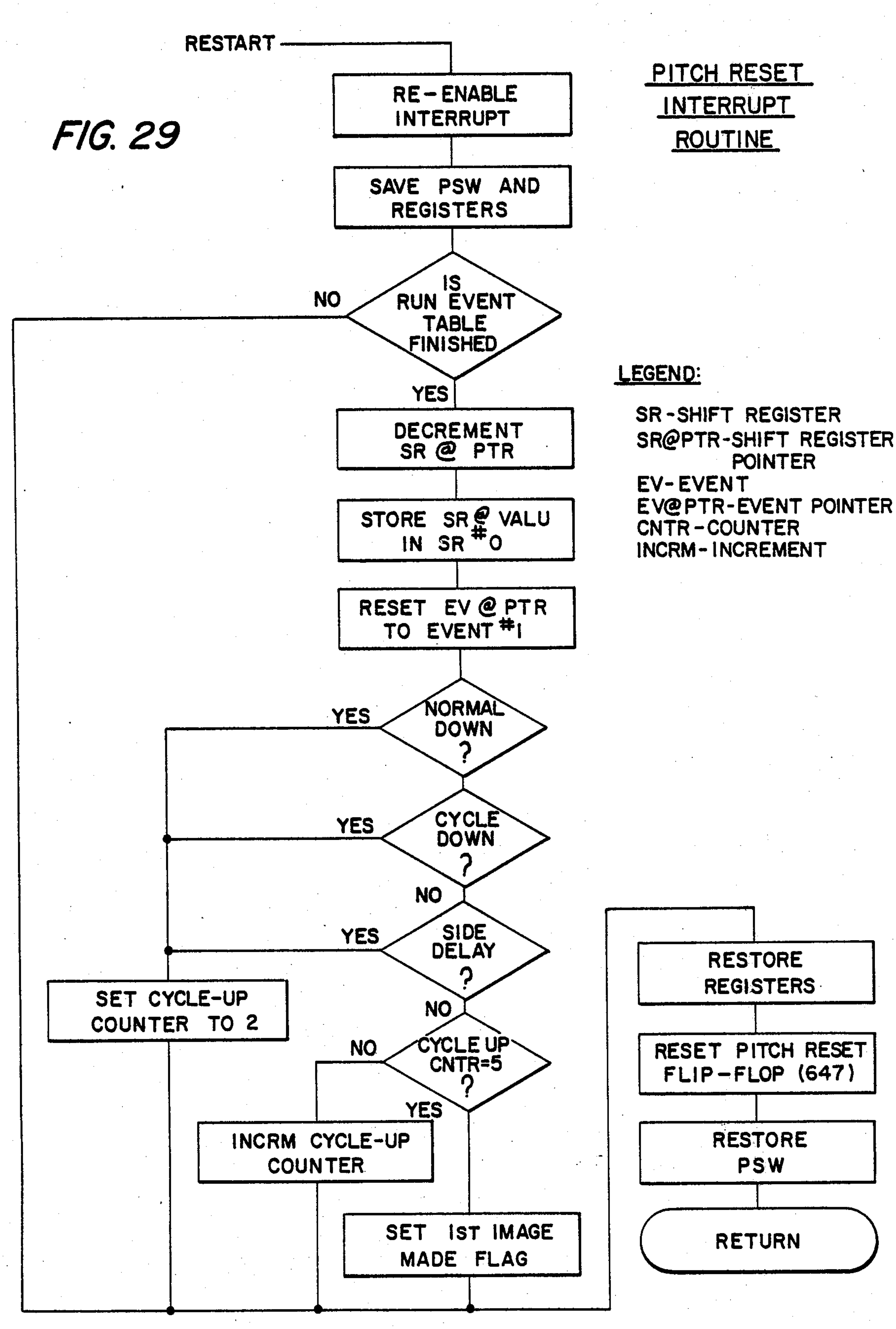
Figure 30:
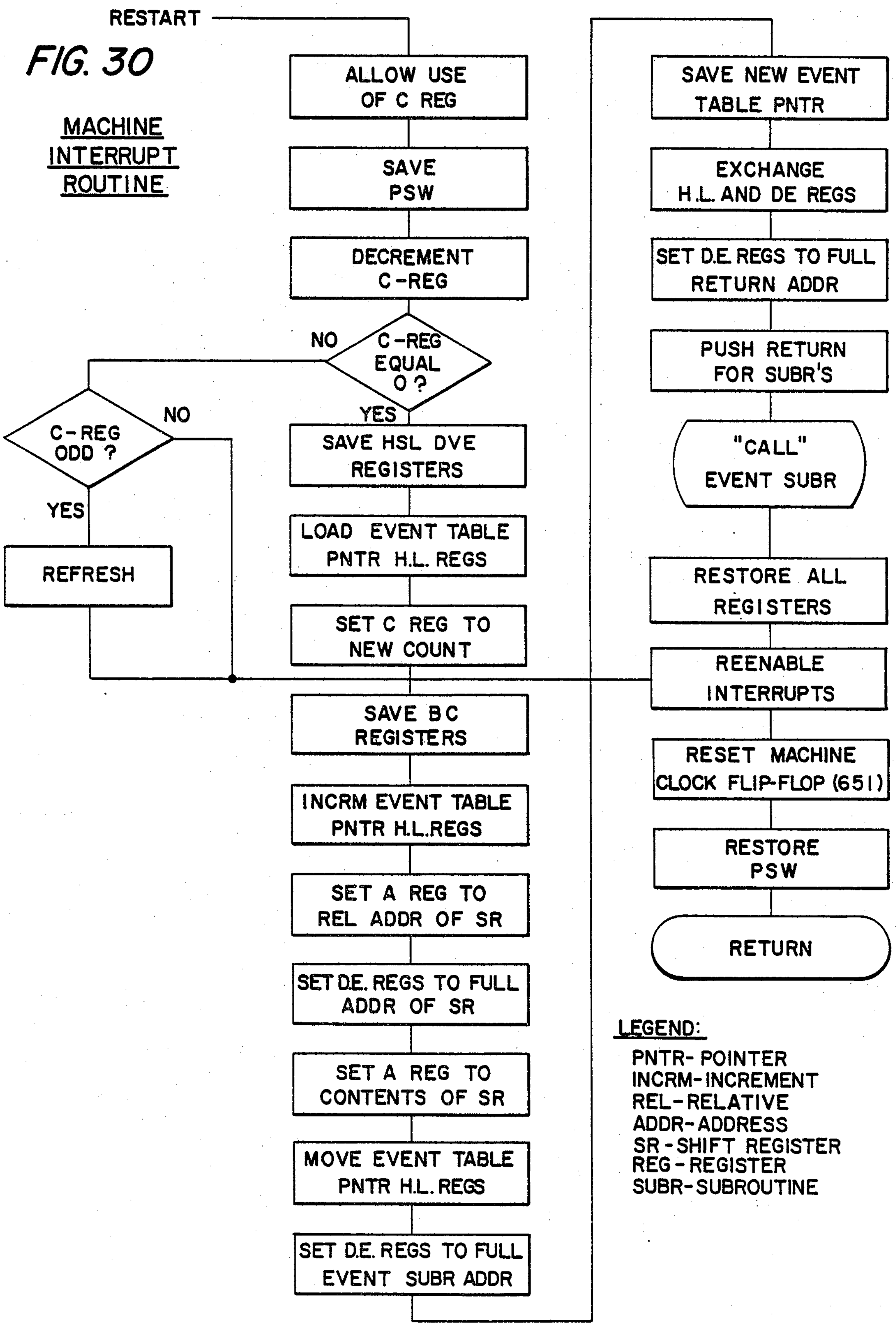
Figure 31:
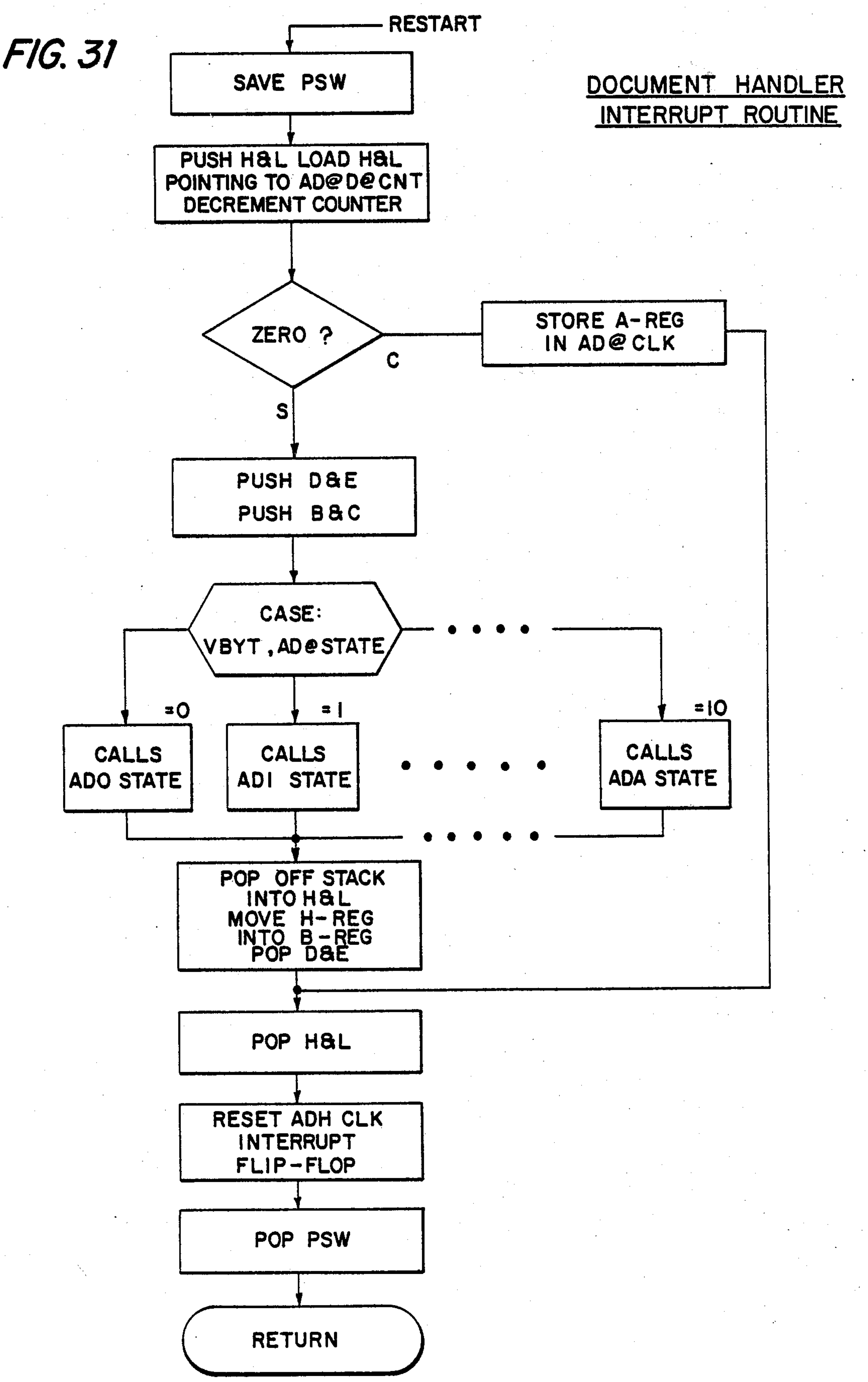
Figure 32A:
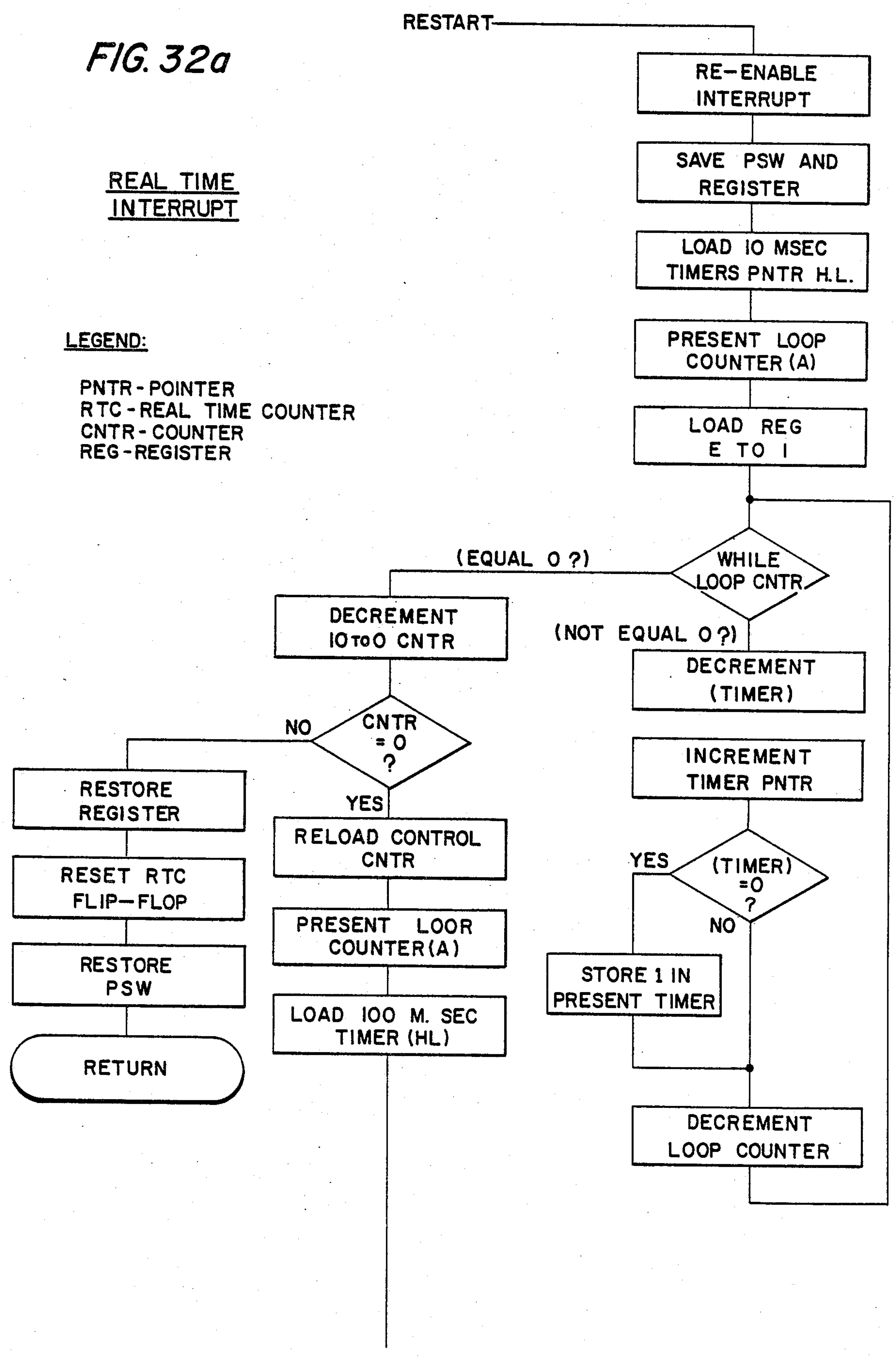
Figure 32B:
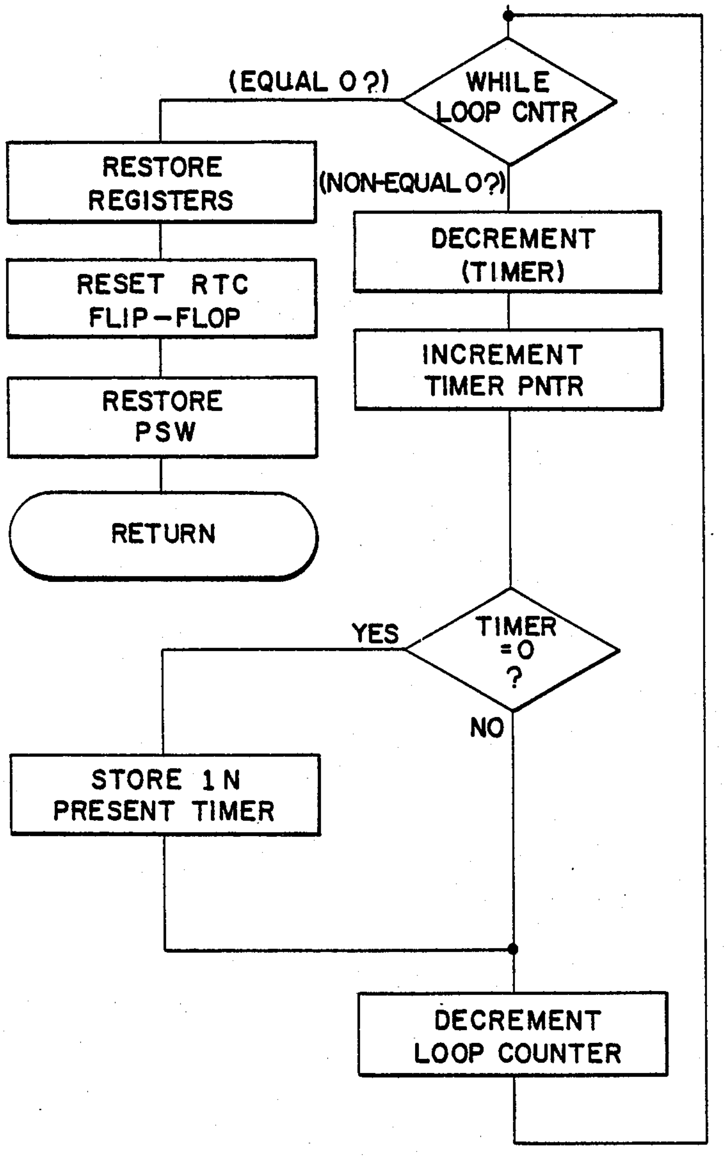
Figure 33A:
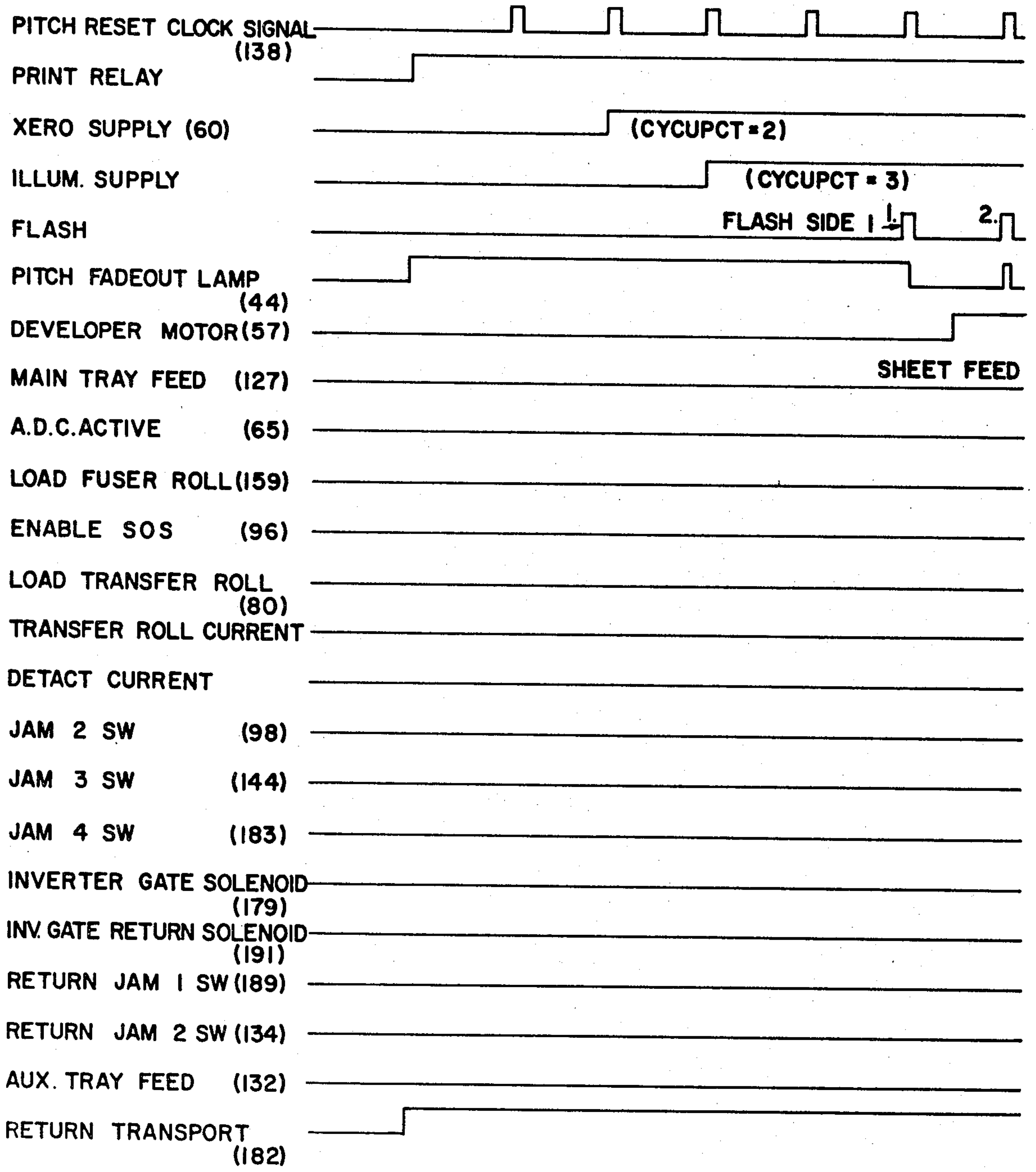
Figure 33B:
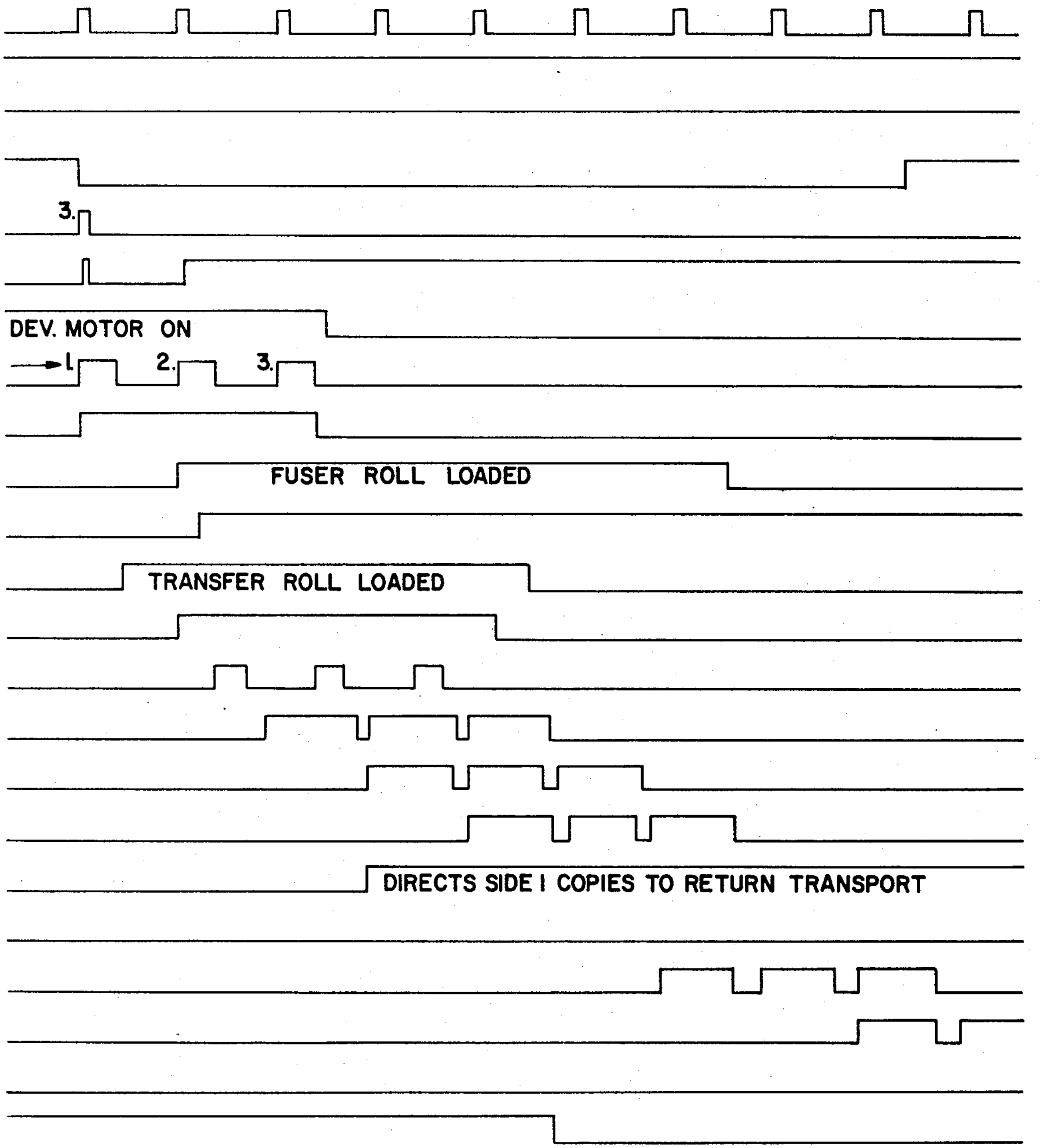
Figure 33C:
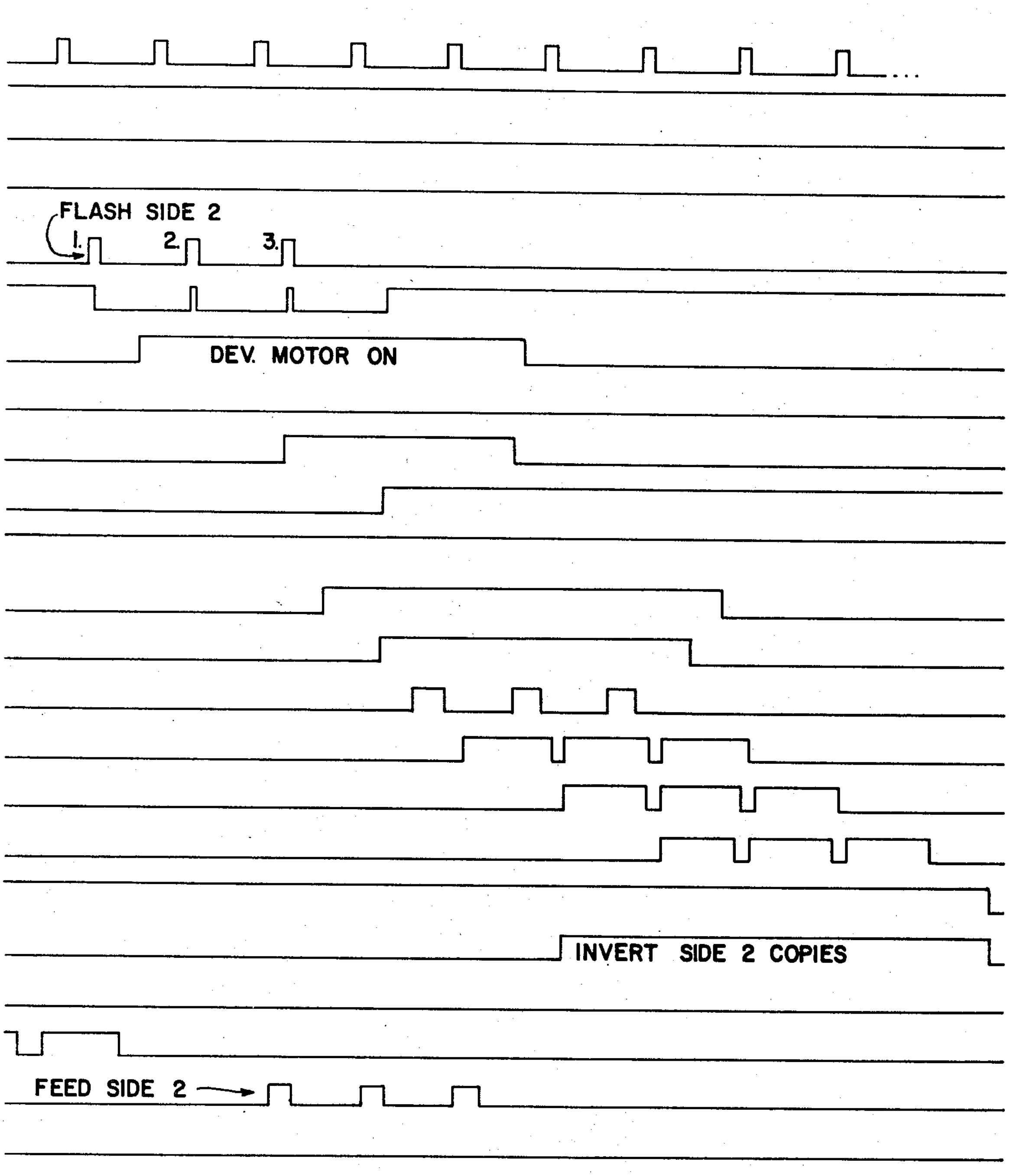

FIG. 10*a* is a block diagram showing the CPU microprocessor input/output connections;

FIG. 10*b* is a timing chart of Direct Memory Access (DMA) Read and Write cycles;

FIG. 11*a* is a logic schematic of the CPU clock;

FIG. 11*b* is a chart illustrating the output wave form of the clock shown in FIG. 19*a*;

FIG. 12 is a logic schematic of the CPU memory;

FIG. 13 is a logic schematic of the CPU memory ready;

FIGS. 14*a*, 14*b*, 14*c* are logic schematics of the CPU power supply stages;

FIGS. 15*a* and 15*b* comprise a block diagram of the controller I/O module;

FIG. 16 is a logic schematic of the nonvolatile memory power supply;

FIG. 17 is a block diagram of the apparatus interface and remote output connections;

FIG. 18 is a block diagram of the CPU interface module;

FIG. 19 is a block diagram of the apparatus special circuits module;

FIG. 20 is a block diagram of the main panel interface module;

FIG. 21 is a block diagram of the input matrix module;

FIG. 22 is a block diagram of a typical remote;

FIG. 23 is a block diagram of the sorter remote;

FIG. 24 is a view of the control console for inputting copy run instructions to the apparatus shown in FIG. 1;

FIG. 25 is a flow chart illustrating a typical machine state;

FIG. 26 is a flow chart of the machine state routine;

FIG. 27 is a view showing the event table layout;

FIG. 28 is a chart illustrating the relative timing sequences of the clock interrupt pulses;

FIG. 29 is a flow chart of the pitch interrupt routine;

FIG. 30 is a flow chart of the machine clock interrupt routine;

FIG. 31 is a flow chart of the document handler interrupt routine;

FIGS. 32*a* and 32*b* comprise a flow chart of the real time interrupt routines and FIG. 33 is a timing chart of the principal operating components of the host machine in an exemplary copy run.

Figure 2:
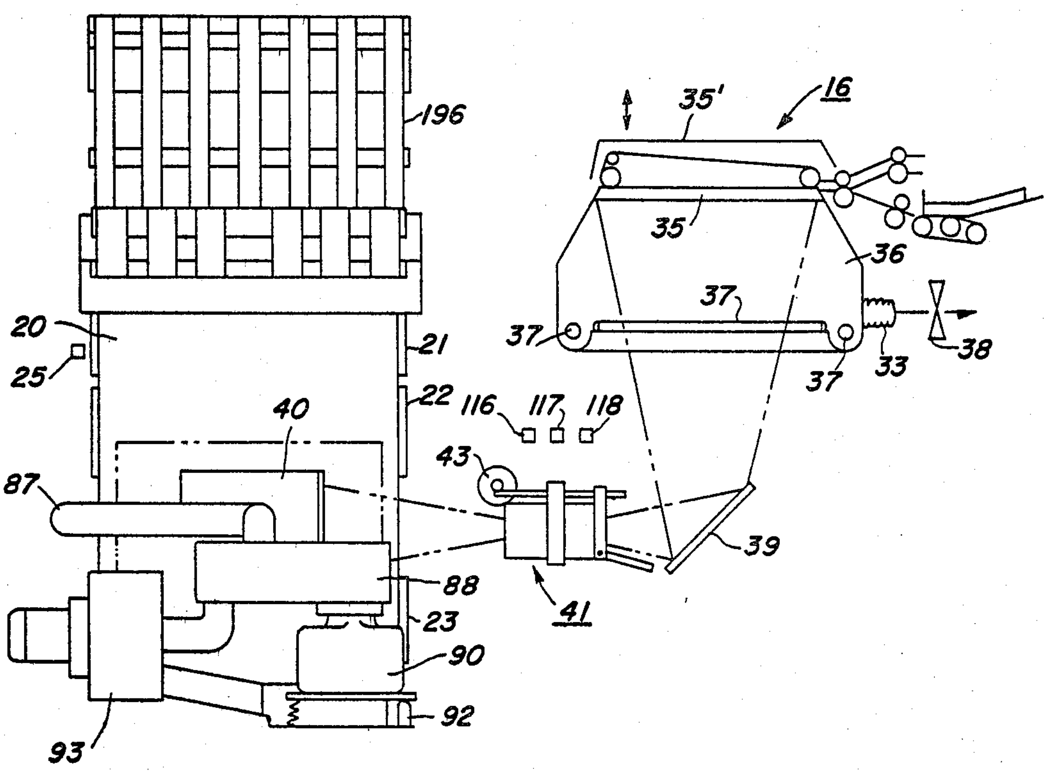
FIG. 2 is a vertical sectional view of the apparatus shown in FIG. 1 along the image plane.
Figure 3:
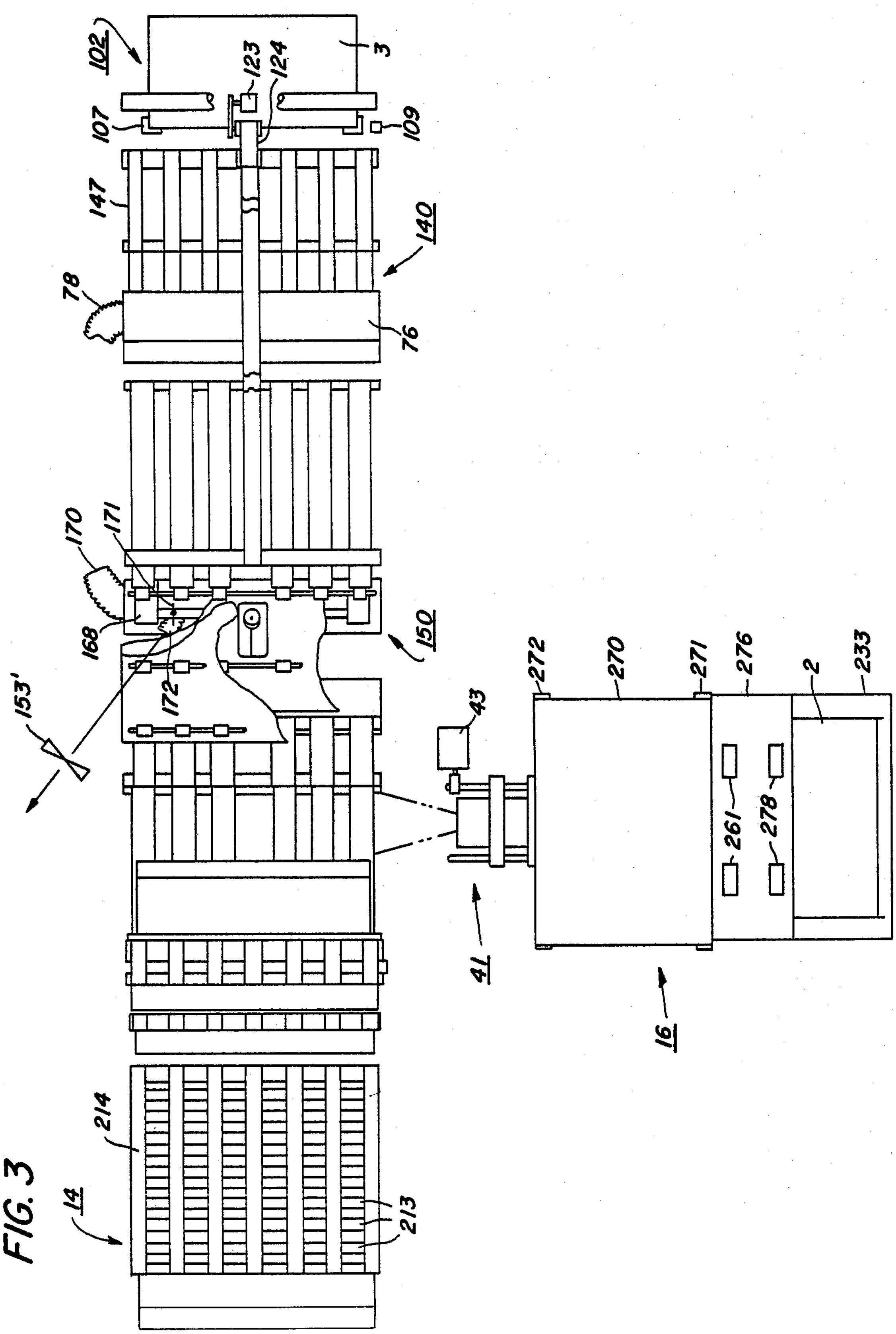
FIG. 3 is a top plane view of the apparatus shown in FIG. 1.

Referring particularly to FIGS. 1-3 of the drawings, there is shown, in schematic outline, an electrostatic reproduction system or host machine, identified by numeral 10, incorporating the control arrangement of the present invention. To facilitate description, the reproduction system 10 is divided into a main electrostatic xerographic processor 12, sorter 14, document handler 16, and controller 18. Other processor, sorter, and/or document handler types and constructions, and different combinations thereof may instead be envisioned.

PROCESSOR

Processor 12 utilizes a photoreceptor in the form of an endless photoconductive belt 20 supported in generally triangular configuration by rolls 21, 22, 23. Belt supporting rolls 21, 22, 23 are in turn rotatably journaled on subframe 24.

In the exemplary processor illustrated, belt 20 comprises a photoconductive layer of selenium, which is the light receiving surface and imaging medium, on a conductive substrate. Other photoreceptor types and forms, such as comprising organic materials or of multilayers or a drum may instead be envisioned. Still other forms may comprise scroll type arrangements wherein webs of photoconductive material may be played in and out of the interior of supporting cylinders.

Figure 4:
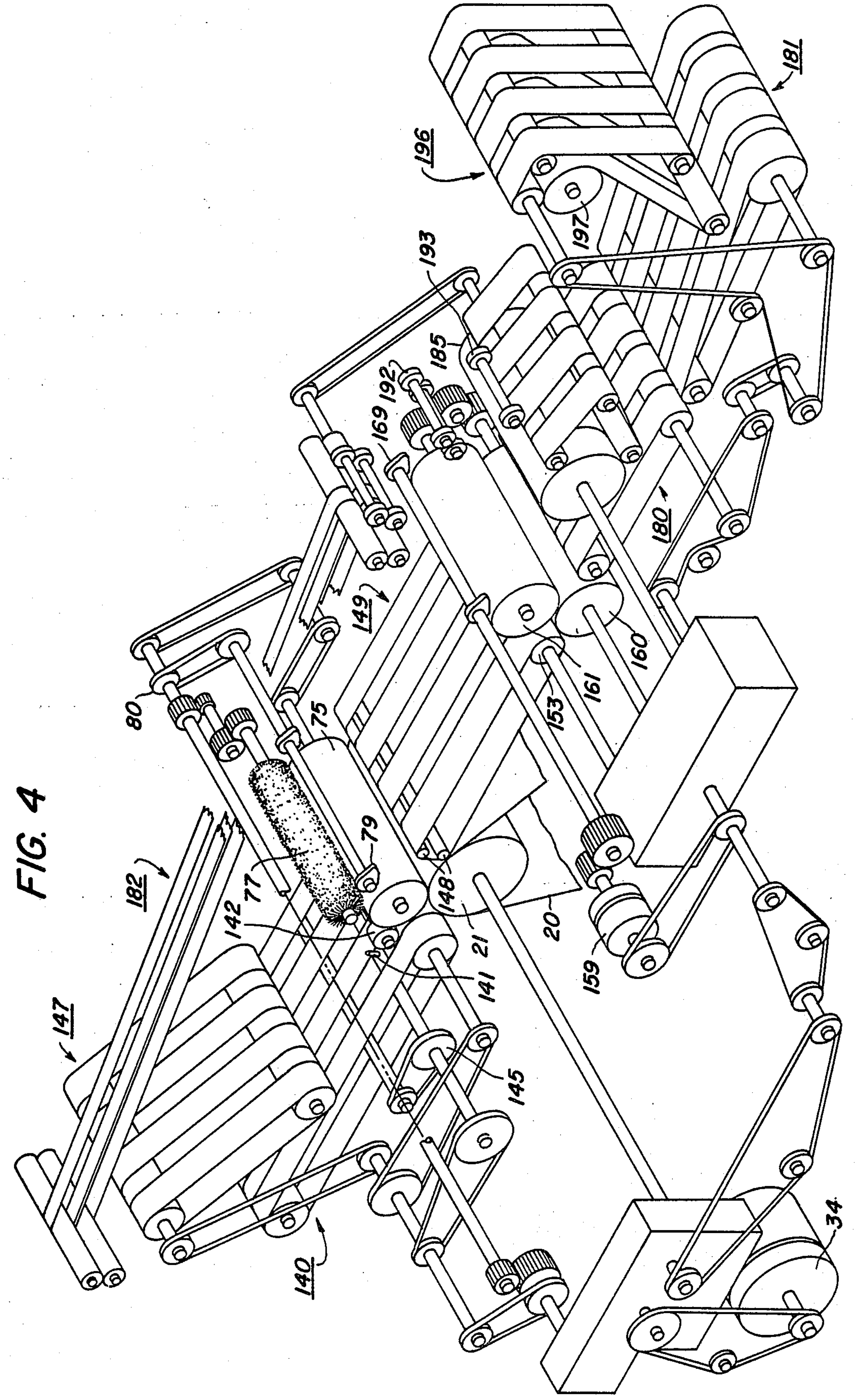
FIG. 4 is an isometric view showing the drive train for the apparatus shown in FIG. 1.

Suitable biasing means (not shown) are provided on subframe 24 to tension the photoreceptor belt 20 and insure movement of belt 20 along a prescribed operating path. Belt tracking switch 25 (shown in FIG. 2) monitors movement of belt 20 from side to side. Belt 20 is supported so as to provide a trio of substantially flat belt runs opposite exposure, developing, and cleaning stations 27, 28, 29 respectfully. To enhance belt flatness at these stations, vacuum platens 30 are provided under belt 20 at each belt run. Conduits 31 communicate vacuum platens 30 with a vacuum pump 32. Photoconductive belt 20 moves in the direction indicated by the solid line arrow, drive thereto being effected through roll 21, which in turn is driven by main drive motor 34, as seen in FIG. 4.

Processor 12 includes a generally rectangular, horizontal transparent platen 35 on which each original 2 to be copied is disposed. A two or four sided illumination assembly, consisting of internal reflectors 36 and flash lamps 37 (shown in FIG. 2) disposed below and along at least two sides of platen 35, is provided for illuminating the original 2 on platen 35. To control temperatures within the illumination space, the assembly is coupled through conduit 33 with a vacuum pump 38 which is adapted to withdraw overly heated air from the space. To retain the original 2 in place on platen 35 and prevent escape of extraneous light from the illumination assembly, a platen cover may be provided.

The light image generated by the illumination system is projected via mirrors 39, 40 and a variable magnification lens assembly 41 onto the photoreceptive belt 20 at the exposure station 27. Reversible motor 43 is provided to move the main lens and add on lens elements that comprise the lens assembly 41 to different predetermined positions and combinations to provide the preselected image sizes corresponding to push button selectors 818, 819, 820 on operator module 800. (See FIG. 32) Sensors 116, 117, 118 signal the present disposition of lens assembly 41. Exposure of the previously charged belt 20 selectively discharges the photoconductive belt to produce on belt 20 an electrostatic latent image of the original 2. To prepare belt 20 for imaging, belt 20 is uniformly charged to a preselected level by charge corotron 42 upstream of the exposure station 27.

To prevent development of charged but unwanted image areas, erase lamps 44, 45 are provided. Lamp 44, which is referred to herein as the pitch fadeout lamp, is supported in transverse relationship to belt 20, lamp 44 extending across substantially the entire width of belt 20 to erase (i.e. discharge) areas of belt 20 before the first image, between successive images, and after the last image. Lamps 45, which are referred to herein as edge fadeout lamps, serve to erase areas bordering each side of the images.

Figure 5:
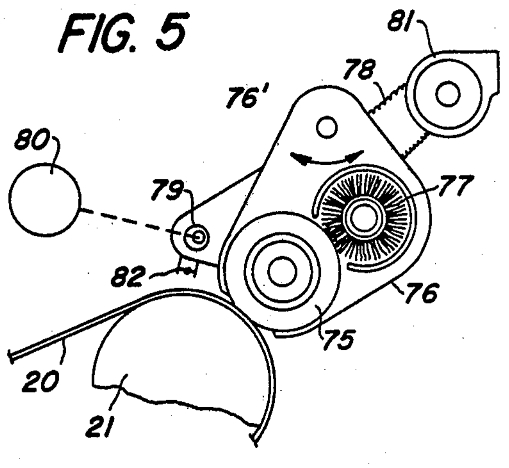
FIG. 5 is an enlarged view showing details of the transfer roll support mechanism for the apparatus shown in FIG. 1.
Figure 7:
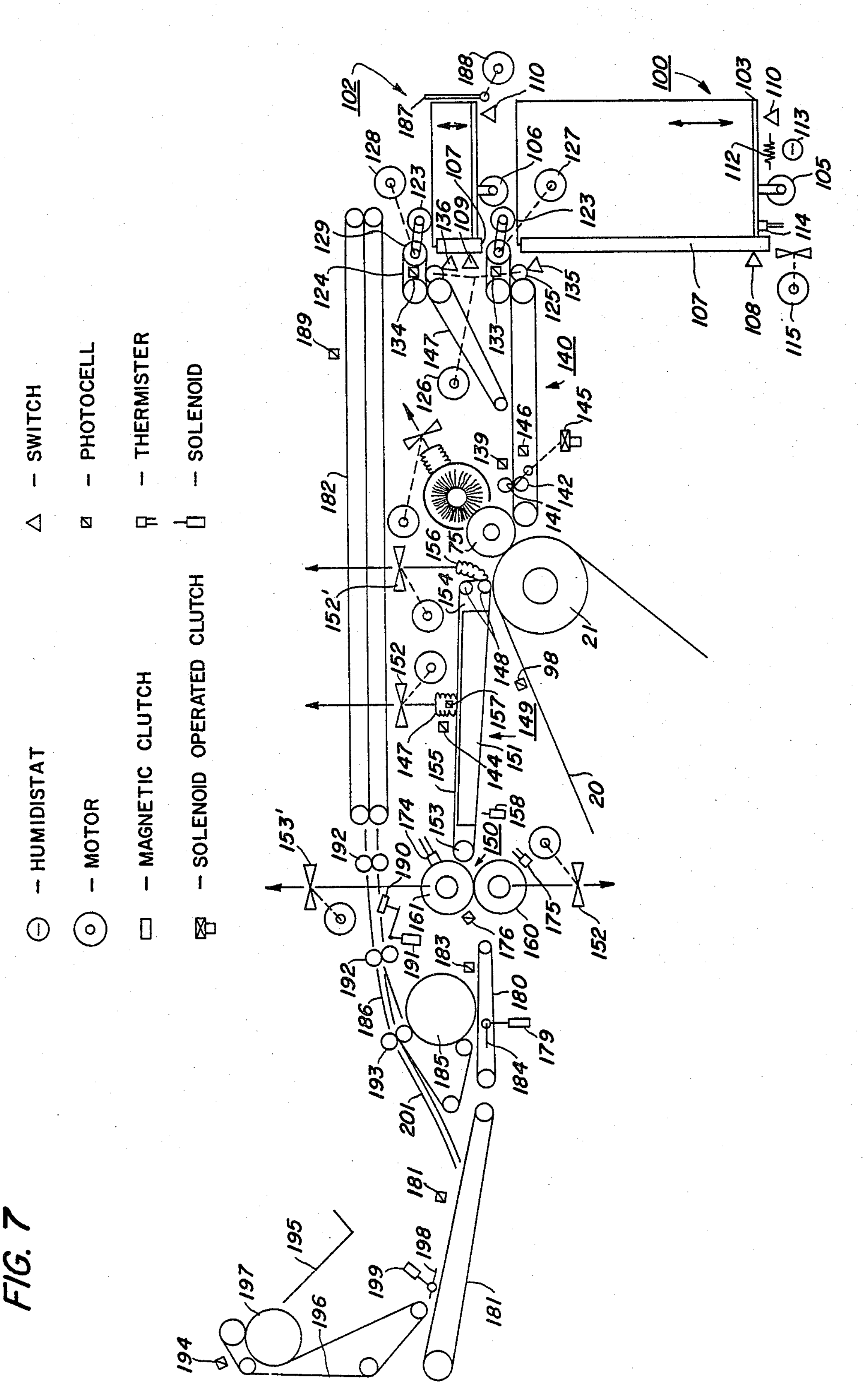
FIG. 7 is a schematic view showing the paper path and sensors of the apparatus shown in FIG. 1.

Referring to FIGS. 4, 5 and 7, to transfer developed images from belt 20 to the copy sheets 3, a transfer roll 75 is provided. Transfer roll 75, which forms part of the copy sheet feed path, is rotatably supported within a transfer roll housing opposite belt support roll 21. Housing 76 is pivotally mounted to permit the transfer roll assembly to be moved into and out of operative relationship with belt 20. A transfer roll cleaning brush 77 is rotatably journalled in transfer roll housing 76 with the brush periphery in contact with transfer roll 90. Transfer roll 75 is driven through contact with belt 20 while cleaning brush 77 is coupled to main drive motor 34. To remove toner, housing 76 is connected through conduit 78 with vacuum pump 81. To facilitate the control transfer of the developed images from belt 20 to the copy sheets 3, a suitable electrical bias is applied to transfer roll 75.

To permit transfer roll 75 to be moved into and out of operative relationship with belt 20, cam 79 is provided in driving contact with transfer roll housing 76. Cam 79 is driven from motor 34 through an electromagnetically operated one revolution clutch 80. Spring means (not shown) serves to maintain housing 76 in driving engagement with cam 79.

To facilitate separation of the copy sheets 3 from belt 20 following transfer of developed images, a detack corotron 82 is provided. Corotron 82 generates a charge designed to neutralize or reduce the charges tending to retain the copy sheet on belt 20. Corotron 82 is supported on transfer roll housing 76 opposite belt 20 and downstream of transfer roll 75.

Figure 6:
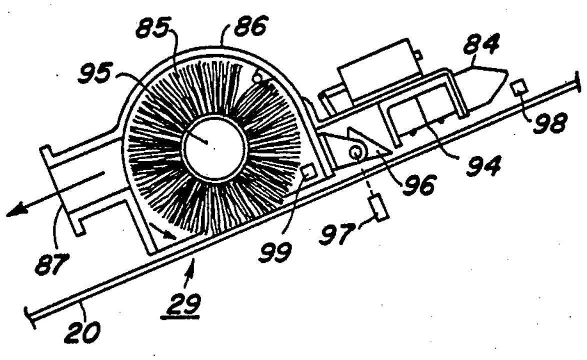
FIG. 6 is an enlarged view showing details of the photoreceptor cleaning mechanism for the apparatus shown in FIG. 1.

Referring to FIGS. 1, 2 and 6, to prepare belt 20 for cleaning, residual charges on belt 20 are removed by discharge lamp 84 and preclean corotron 94. A cleaning brush 85, rotatably supported within an evacuated semicircular shaped brush housing 86 at cleaning station 29, serves to remove residual developer from belt 20. Motor 95 drives brush 85, brush 85 turning in a direction opposite that of belt 20.

Vacuum conduit 87 couples brush housing 86 through a centrifugal type separator 88 with the suction side of vacuum pump 93. A final filter 89 on the outlet of motor 93 traps particles that pass through separator 88. The heavier toner particles separated by separator 88 drop into and are collected in one or more collecting bottles 90. Pressure sensor 91 monitors the condition of final filter 89 while a sensor 92 monitors the level of toner particles in collecting bottles 90.

To obviate the danger of copy sheets remaining on belt 20 and becoming entangled with the belt cleaning mechanism, a deflector 96 is provided upsteam of cleaning brush 85. Deflector 96, which is pivotally supported on the brush housing 86, is operated by solenoid 97. In the normal or off position, deflector 96 is spaced from belt 20 (the solid line position shown in the drawings). Energization of solenoid 97 pivots deflector 96 downwardly to bring the deflector leading edge into close proximity to belt 20.

Sensors 98, 99 are provided on each side of deflector 96 for sensing the presence of copy material on belt 20. A signal output from upstream sensor 98 triggers solenoid 97 to pivot deflector 96 into position to intercept the copy sheet on belt 20. The signal from sensor 98 also initiates a system shutdown cycle (mis strip jam) wherein the various operating components are, within a prescribed interval, brought to a stop. The interval permits any copy sheet present in fuser 150 to be removed, sheet trap solenoid 158 having been actuated to prevent the next copy sheet from entering fuser 150 and becoming trapped therein. The signal from sensor 99, indicating failure of deflector 96 to intercept or remove the copy sheet from belt 20, triggers an immediate or hard stop (sheet on selenium jam) of the processor. In this type of power to drive motor 34 is interrupted to bring belt 20 and the other components driven therefrom to an immediate stop.

Referring particularly to FIGS. 1 and 7, copy sheets 3 comprise precut paper sheets supplied from either main or auxiliary paper trays 100, 102. Each paper tray has a platform or base 103 for supporting in stack like fashion a quantity of sheets. The tray platforms 103 are supported for vertical up and down movement as motors 105, 106. Side guide pairs 107, in each tray 100, 102 delimit the tray side boundaries, the guide pairs being adjustable toward and away from one another in accommodation of different size sheets. Sensors 108, 109 respond to the position of each side guide pair 107, the output of sensors 108, 109 serving to regulate operation of edge fadeout lamps 45 and fuser cooling valve 171. Lower limit switches 110 on each tray prevent overtravel of the tray platform in a downward direction.

A heater 112 is provided below the platform 103 of main tray 100 to warm the tray area and enhance feeding of sheets therefrom. Humidstat 113 and thermostat 114 control operation of heater 112 in response to the temperature/humidity conditions of main tray 100. Fan 115 is provided to circulate air within tray 100.

To advance the sheets 3 from either main or auxiliary tray 100, 102, main and auxiliary sheet feeders 120, 121 are provided. Feeders 120, 121 each include a nudger roll 123 to engage and advance the topmost sheet in the paper tray forward into the nip formed by a feed belt 124 and retard roll 125. Retard rolls 125, which are driven at an extremely low speed by motor 126, cooperate with feed belts 124 to restrict feeding of sheets from trays 100, 102 to one sheet at a time.

Feed belts 124 are driven by main and auxiliary sheet feed motors 127, 128 respectively. Nudger rolls 123 are supported for pivotal movement about the axis of feed belt drive shaft 129 with drive to the nudger rolls taken from drive shaft 129. Stack height sensors 133, 134 are provided for the main and auxiliary trays, the pivoting nudger rolls 123 serving to operate sensors 133, 134 in response to the sheet stack height. Main and auxiliary tray misfeed sensors 135, 136 are provided at the tray outlets.

Main transport 140 extends from main paper tray 100 to a point slightly upstream of the nip formed by photoconductive belt 20 and transfer roll 75. Transport 140 is driven from main motor 34. To register sheets 3 with the images developed on belt 20, sheet register fingers 141 are provided, fingers 141 being arranged to move into and out of the path of the sheets on transport 140 once each revolution. Registration fingers 141 are driven from main motor 34 through electromagnetic clutch 145. A timing or reset switch 146 is set once on each revolution of sheet register fingers 141. Sensor 139 monitors transport 140 for jams. Further amplification of sheet register system may be found in U.S. Pat. No. 3,781,004, issued Dec. 25, 1973 to Buddendeck et al.

Pinch roll pair 142 is interspaced between transport belts that comprise main transport 140 on the downstream side of register fingers 141. Pinch roll pair 142 are driven from main motor 34.

Auxiliary transport 147 extends from auxiliary tray 102 to main transport 140 at a point upstream of sheet register fingers 141. Transport 147 is driven from motor 34.

To maintain the sheets in driving contact with the belts of transports 140, 147, suitable guides or retainers (not shown) may be provided along the belt runs.

The image bearing sheets leaving the nip formed by photoconductive belt 20 and transfer roll 75 are picked off by belts 155 of the leading edge of vacuum transport 149. Belts 155, which are perforated for the admission of vacuum therethrough, ride on forward roller pair 148 and rear roll 153. A pair of internal vacuum plenums 151, 154 are provided, the leading plenum 154 cooperating with belts 155 to pick up the sheets leaving the belt/transfer roll nip. Transport 149 conveys the image bearing sheets to fuser 150. Vacuum conduits 147, 156 communicate plenums 151, 154 with vacuum pump 152. A pressure sensor 157 monitors operation of vacuum pump 152. Sensor 144 monitors transport 149 for jams.

To prevent the sheet on transport 149 from being carried into fuser 150 in the event of a jam or malfunction, a trap solenoid 158 is provided below transport 149. Energization of solenoid 158 raises the armature thereof into contact with the lower face of plenum 154 to intercept and stop the sheet moving therepast.

Referring particularly to FIGS. 4, 10 and 12, fuser 150 comprises a lower heated fusing roll 160 and upper pressure roll 161. Rolls 160, 161 are supported for rotation in fuser housing 162. The core of fusing roll 160 is hollow for receipt of heating rod 163 therewithin.

Housing 162 includes a sump 164 for holding a quantity of liquid release agent, herein termed oil. Dispensing belt 165, moves through pump 164 to pick up the oil, belt 165 being driven by motor 166. A blanket-like wick 167 carries the oil from belt 165 to the surface of fusing roll 160.

Pressure roll 161 is supported within an upper pivotal section 168 of housing 162. This enables pressure roll 161 to be moved into and out of operative contact fusing roll 160. Cam shaft 169 in the lower portion of fuser housing 162 serves to move housing section 168 and pressure roll 161 into operative relationship with fusing roll 160 against a suitable bias (not shown). Cam shaft 169 is coupled to main motor 34 through an electromagnetically operated one revolution clutch 159.

Fuser section 168 is evacuated, conduit 170 coupling housing section 168 with vacuum pump 152. The ends of housing section 168 are separated into vacuum compartments opposite the ends of pressure roll 161 thereunder to cool the roll ends where smaller size copy sheets 3 are being processed. Vacuum valve 171 in conduit 172 regulates communication of the vacuum compartments with vacuum pump 152 in response to the size sheets as sensed by side guide sensors 108, 109 in paper trays 100, 102.

Fuser roll 160 is driven from main motor 34. Pressure roll 161 is drivingly coupled to fuser roll 160 for rotation therewith.

Thermostat 174 in fuser housing 162 controls operation of heating rod 163 in response to temperature. Sensor 175 protects against fuser over-temperature. To protect against trapping of a sheet in fuser 150 in the event of a jam, sensor 176 is provided.

Following fuser 150, the sheet is carried by post fuser transport 180 to either discharge transport 181 or, where duplex or two sided copies are desired, to return transport 182. Sheet sensor 183 monitors passage of the sheets from fuser 150. Transports 180, 181 are driven from main motor 34. Sensor 181' monitors transport 181 for jams. Suitable retaining means may be provided to retain the sheets on transports 180, 181.

A deflector 184, when extended routes sheets on transport 180 onto conveyor roll 185 and into chute 186 leading to return transport 182. Solenoid 179, when energized raises deflector 184 into the sheet path. Return transport 182 carries the sheets back to auxiliary tray 102. Sensor 189 monitors transport 182 for jams. The forward stop 187 of tray 102 are supported for oscillating movement. Motor 188 drives stop 187 to oscillate stops 187 back and forth and tap sheets returned to auxiliary tray 102 into alignment for refeeding.

To invert duplex copy sheets following fusing of the second or duplex image, a displaceable sheet stop 190 is provided adjacent the discharge end of chute 186. Stop 190 is pivotally supported for swinging movement into and out of chute 186. Solenoid 191 is provided to move stop 190 selectively into or out of chute 186. Pinch roll pairs 192, 193 serve to draw the sheet trapped in chute 186 by stop 190 and carry the sheet forward onto discharge transport 181. Further description of the inverter mechanism may be found in U.S. Pat. No. 3,856,295, issued Dec. 24, 1974, to John H. Looney.

Output tray 195 receives unsorted copies. Transport 196 a portion of which is wrapped around a turn around roll 197, serves to carry the finished copies to tray 195. Sensor 194 monitors transport 196 for jams. To route copies into output tray 195, a deflector 198 is provided. Deflector solenoid 199, when energized, turns deflector 198 to intercept sheets on conveyor 181 and route the sheets onto conveyor 196.

When output tray 195 is not used, the sheets are carried by conveyor 181 to sorter 14.

As described, a second machine clock, termed a pitch reset clock 138 herein, and comprising timing switch 146 is provided. Switch 146 cooperates with sheet register fingers 141 to generate an output pulse once each revolution of fingers 141. As will appear, the pulse like output of the pitch reset clock is used to reset or resynchronize controller 18 with host machine 10.

CONTROLLER

Figure 8:
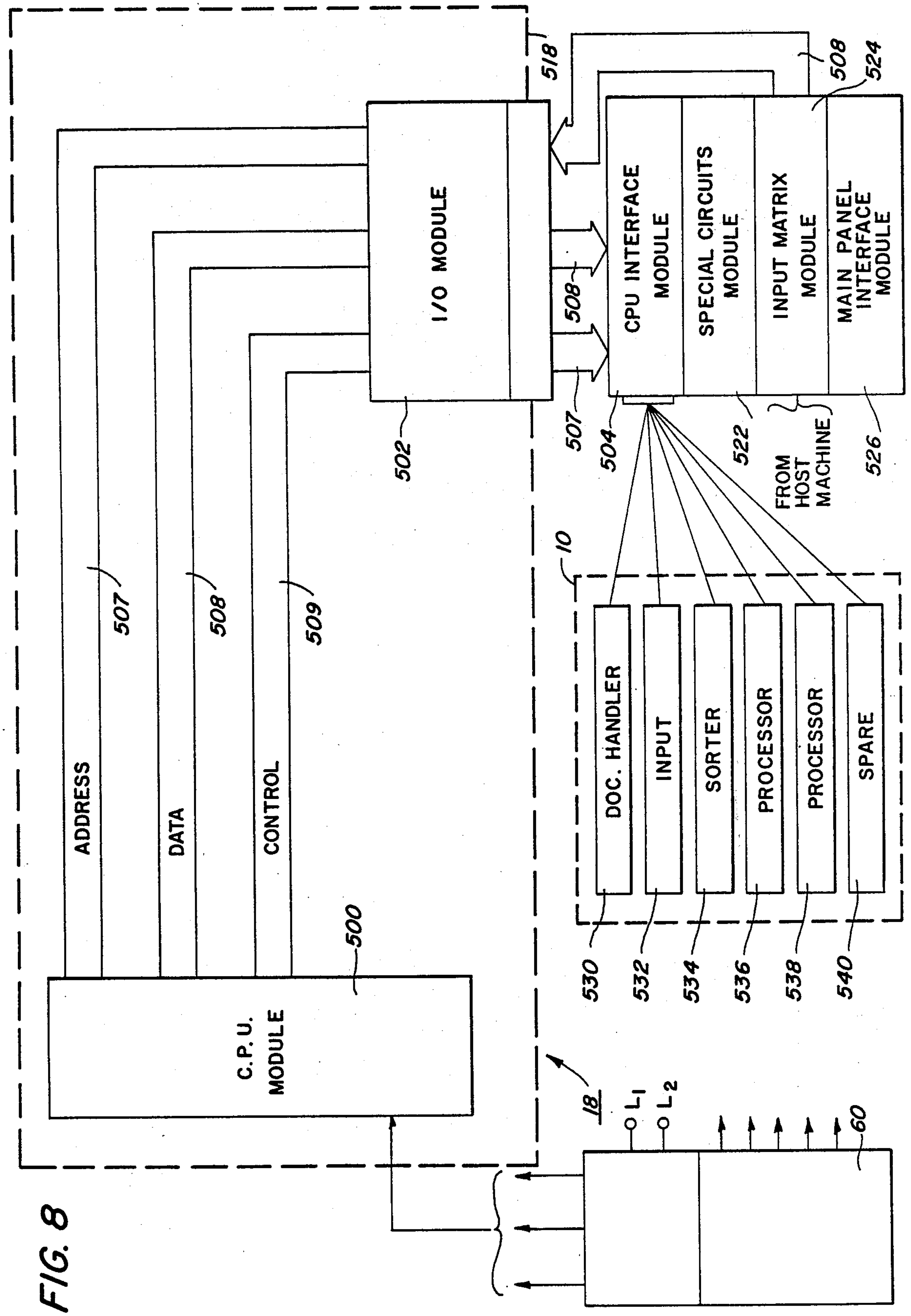
FIG. 8 is a block diagram of the controller for the apparatus shown in FIG. 1.

Referring to FIG. 8 controller 18 includes a Computer Processor Unit (CPU) Module 500, Input/Output (I/O) Module 502, and Interface 504. Address, Data, and Control Buses 507, 508, 509 respectively operatively couple CPU Module 500 and I/O Module 502. CPU Module 500 and I/O Module 502 are disposed within a shield 518 to prevent noise interference.

Interface 504 couples I/O Module 502 with special circuits module 522, input matrix module 524, and main panel interface module 526. Module 504 also couples I/O Module 502 to operating sections of the machine, namely, document handler section 530, input section 532, sorter section 534 and processor sections 536, 538. A spare section 540, which may be used for monitoring operation of the host machine, or which may be later utilized to control other devices, is provided.

Figure 9:
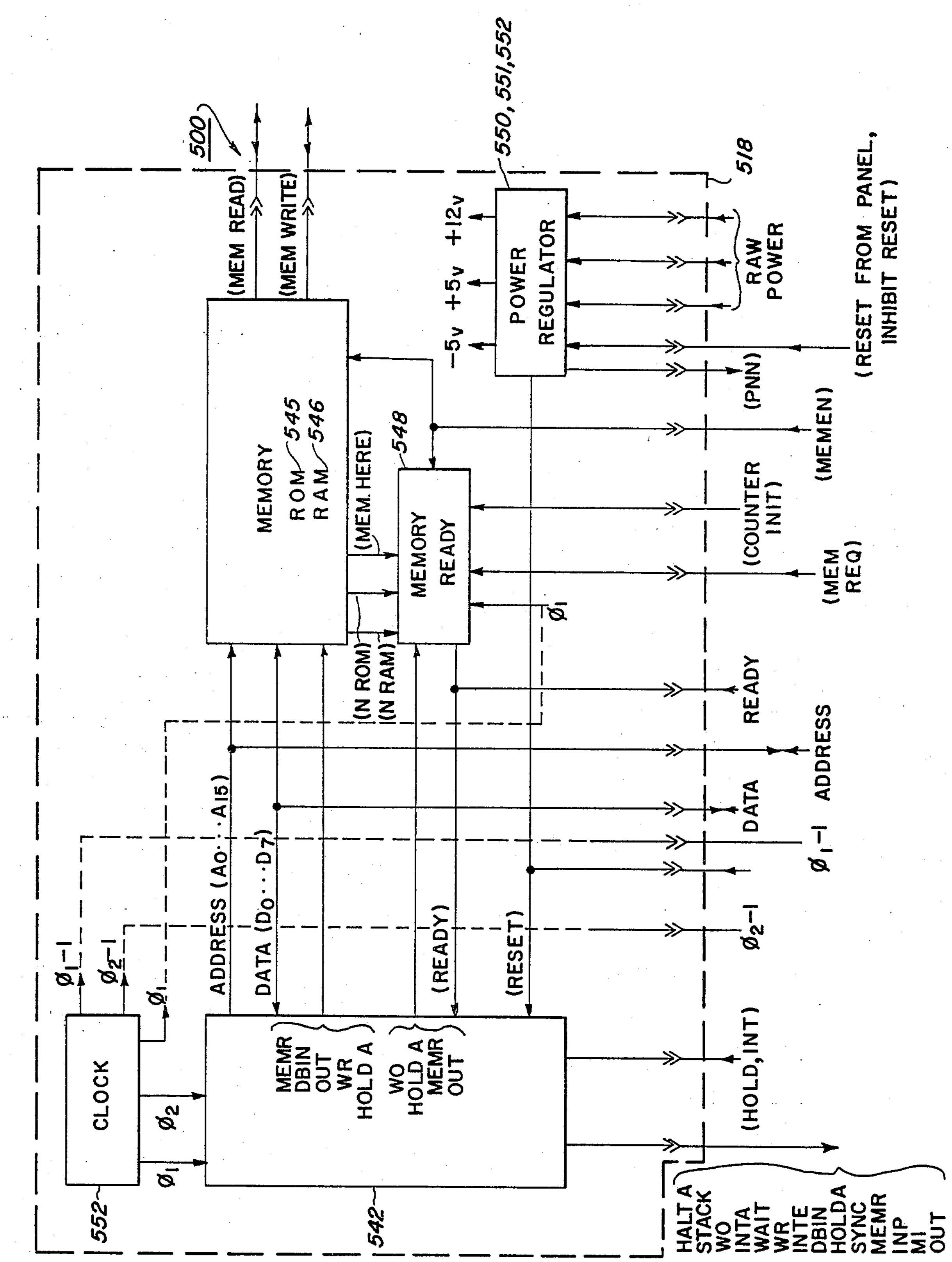
FIG. 9 is a block diagram of the controller CPU.

Referring to FIGS. 9, 10, CPU module 500 comprises a processor 542 such as an Intel 8080 microprocessor manufactured by Intel Corporation, Santa Clara, California, 16K Read Only Memory (herein ROM) and 2K Random Access Memory (herein RAM) sections 545, 546, Memory Ready section 548, power regulator section 550, and onboard clock 552. Bipolar tri-state buffers 510, 511 in Address and Data buses 507, 508 disable the bus on a Direct Memory Access (DMA) signal (HOLD A) as will appear. While the capacity of memory sections 545, 546 are indicated throughout as being 16K and 2K respectively, other memory sizes may be readily contemplated.

Referring particularly to FIG. 11, clock 552 comprises a suitable clock oscillator 553 feeding a multi-bit (Qa–Qn) shift register 554. Registers 554 includes an internal feedback path from one bit to the serial input of register 554. Output signal waveforms $\phi_1$, $\phi_2$, $\phi_{1-1}$ and $\phi_{2-1}$ are produced for use by the system.

Referring to FIG. 12, the memory bytes in ROM section 545 are implemented by Address signals (Ao–A 15) from processor 542, selection being effected by 3 to 8 decode chip 560 controlling chip select 1 (CS-1) and a 1 bit selection (A 13) controlling chip select 2 (CS-2). The most significant address bits (A 14, A 15) select the first 16K of the total 64K bytes of addressing space. The memory bytes in RAM section 546 are implemented by Address signals (Ao–A 15) through selector circuit 561. Address bit A 10 serves to select the memory bank while the remaining five most significant bits (A 11–A 15) select the last 2K bytes out of the 64K bytes of addressing space. RAM memory section 546 includes a 40 bit output buffer 546', the output of which is tied together with the output from ROM memory section 545 and goes to tri-state buffer 562 to drive Data bus 508. Buffer 562 is enabled when either memory section 545 or 546 is being addressed and either a (MEM READ) or DMA (HOLD A) memory request exists. An enabling signal (MEMEN) is provided from the machine control or service panel (not shown) which is used to permit disabling of buffer 562 during servicing of CPU Module 500. Write control comes from either processor 542 (MEM WRITE) or from DMA (HOLD A) control. Tri-state buffers 563 permit Refresh Control 605 of I/O Module 502 to access MEM READ and MEM WRITE control channels directly on a DMA signal (HOLD A) from processor 542 as will appear.

Referring to FIG. 13, memory ready section 548 provides a READY signal to processor 542. A binary counter 566, which is initialized by a SYNC signal ($\phi_1$) to a prewired count as determined by input circuitry 567, counts up at a predetermined rate. At the maximum count, the output at gate 568 comes true stopping the counter 566. If the cycle is a memory request (MEM REQ) and the memory location is on board as determined by the signal (MEM HERE) to tri-state buffer 569, a READY signal is sent to processor 542. Tri-state buffer 570 in MEM REQ line permits Refresh Control 605 of I/O Module 502 to access the MEM REQ channel directly on a DMA signal (HOLD A) from processor 542 as will appear.

Referring to FIG. 14, power regulators 550, 551, 552 provide the various voltage levels, i.e. +5 v, +12 v, and −5 v D.C. required by the module 500. Each of the three on board regulators 550, 551, 552 employ filtered D.C. inputs. Power Not Normal (PNN) detection circuitry 571 is provided to reset processor 542 during the power up time. Panel reset is also provided via PNN. An enabling signal (INHIBIT RESET) allows completion of a write cycle in Non Volatile (N.V.) Memory 610 of I/O Module 502.

Referring to FIGS. 10, 12, 13 and the DMA timing chart (FIG. 18*a*) data transfer from RAM section 546 to host machine 10 is effected through Direct Memory Access (DMA), as will appear. To initiate DMA, a signal (HOLD) is generated by Refresh Control 605 (FIG. 15*a*). On acceptance, processor 542 generates a signal HOLD ACKNOWLEDGE (HOLD A) which works through tri-state buffers 510, 511 and through buffers 563 and 570 to release Address bus 507, Data bus 508 and MEM READ, MEM WRITE, and MEM REQ channels (FIGS. 12, 13) to Refresh Control 605 of I/O Module 502.

Referring to FIG. 15, I/O module 502 interfaces with CPU module 500 through bi-directional Address, Data and Control buses 507, 508, 509. I/O module 502 appears to CPU module 500 as a memory portion. Data transfers between CPU and I/O modules 500, 502, and commands to I/O module 502 except for output refresh are controlled by memory reference instructions executed by CPU module 500. Output refresh which is initiated by one of several uniquely decoded memory reference commands, enables Direct Memory Access (DMA) by I/O Module 502 to RAM section 546.

I/O module 502 includes Matrix Input Select 604 (through which inputs from the host machine 10, are received), Refresh Control 605, Nonvolatile (NV) memory 610, Interrupt Control 612, Watch Dog Timer and Failure Flag 614 and clock 570.

A Function Decode Section 601 receives and interprets commands from CPU section 500 by decoding information on address bus 507 along with control signals from processor 542 on control bus 509. On command, decode section 601 generates control signals to perform the function indicated. These functions include (a) controlling tri-state buffers 620 to establish the direction of data flow in Data bus 508; (b) strobing data from Data bus 508 into buffer latches 622; (c) controlling multiplexer 624 to put data from Interrupt Control 612, Real Time clock register 621, Matrix Input Select 604 or N.V. memory 610 onto data bus 508; (d) actuating refresh control 605 to initiate a DMA operation; (e) actuating buffers 634 to enable address bits Ao–A 7 to be sent to the host machine 10 for input matrix read operations; (f) commanding operation of Matrix Input Select 604; (g) initiating read or write operation of N.V. memory 610 through Memory Control 638; (h) loading Real Time clock register 621 from data bus 508; and (i) resetting the Watch dog timer or setting the Fault Failure flag 614. In addition, section 601 includes logic to control and synchronize the READY control line to CPU module 500, the READY line being used to advise module 500 when data placed on the Data Bus by I/O Module 502 is valid.

Watch Dog timer and failure flag 614, which serves to detect certain hardwired and software malfunctions, comprises a free running counter which under normal circumstances is periodically reset by an output refresh command (REFRESH) from Function Decode Section 601. If an output refresh command is not received within a preset time interval, (i.e. 25 m sec) a fault flip flop is set and a signal (FAULT) sent to the host machine 10. The signal (FAULT) also raises the HOLD line to disable CPU Module 500. Clearing of the fault flip flop may be by cycling power or generating a signal (RESET). A selector (not shown) may be provided to disable (DISABLE) the watch dog timer when desired. The fault flip flop may also be set by a command from the CPU Module to indicate that the operating program detected a fault.

Matrix Input Select 604 has capacity to read up to 32 groups of 8 discrete inputs from host machine 10. Lines $A_2$ through $A_7$ of Address bus 507 are routed to host machine 10 via CPU Interface Module 504 to select the desired group of 8 inputs. The selected inputs from machine 10 are received via Input Matrix Module 524 (FIG. 28) and are placed by matrix 604 onto data bus 508 and sent to CPU Module 500 via multiplexer 624. Bit selection is effected by lines $A_0$ through $A_2$ of Address bus 507.

Output refresh control 605, when initiated, transfers either 16 or 32 sequential words from RAM memory output buffer 546' to host machine 10 at the predetermined clock rate in line 574. Direct Memory Access (DMA) is used to facilitate transfer of the data at a relatively high rate. On a Refresh signal from Function Decode Section 601, Refresh Control 605 generates a HOLD signal to processor 542. On acknowledgement (HOLD A) processor 542 enters a hold condition. In this mode, CPU Module 500 releases address and data buses 507, 508 to the high impedance state giving I/O module 502 control thereover. I/O module 502 then sequentially accesses the 32 memory words from output buffer 546' (REFRESH ADDRESS) and transfers the contents to the host machine 10. CPU Module 500 is dormant during this period.

A control signal (LOAD) in line 607 along with the predetermined clock rate determined by the clock signal (CLOCK) in line 574 is utilized to generate eight 32 bit serial words which are transmitted serially via CPU Interface Module 504 to the host machine remote locations where serial to parallel transformation is performed. Alternatively, the data may be stored in addressable latches and distributed in parallel directly to the required destinations.

N.V. memory 610 comprises a predetermined number of bits of non-volatile memory stored in I/O Module 502 under Memory Control 638. N.V. memory 610 appears to CPU module 500 as part of the CPU module memory complement and therefore may be accessed by the standard CPU memory reference instruction set. Referring particularly to FIG. 16, to sustain the contents of N.V. memory 610 should system power be interrupted, one or more rechargeable batteries 635 are provided exterior to I/O module 502. CMOS protective circuitry 636 couples batteries 635 to memory 610 to preserve memory 610 on a failure of the system power. A logic signal (INHIBIT RESET) prevents the CPU Module 500 from being reset during the N.V. memory write cycle interval so that any write operation in progress will be completed before the system is shut down.

For tasks that require frequent servicing, high speed response to external events, or synchronization with the operation of host machine 10, a multiple interrupt system is provided. These comprise machine based interrupts, herein referred to as Pitch Reset, Machine, and Document Handler interrupts. A fourth clock driven interrupt, the Real Time interrupt, is also provided.

Referring particularly to FIGS. 15(*b*) and 26, the highest priority interrupt signal, Pitch Reset signal 640, is generated by the signal output of pitch reset clock 138. The clock signal is fed via optical isolator 645 and digital filter 646 to edge trigger flip flop 647.

The second highest priority interrupt signal, machine clock signal 641, is sent directly from machine clock 202 through isolation transformer 648 to a phase clock loop 649. Loop 649, which serves as bandpath filter and signal conditioner, sends a square wave signal to edge trigger flip flop 651. The second signal output (LOCK) serves to indicate whether loop 649 is locked into a valid signal input or not.

The third highest priority interrupt signal, Document Handler Clock signal 642, is sent directly from document handler clock 286 via isolation transformer 652 and phase locked loop 653 to flip flop 654. The signal (LOCK) serves to indicate the validity of the signal input to loop 653.

The lowest priority interrupt signal, Real Time Clock signal 643, is generated by register 621. Register 621 which is loaded and stored by memory reference instructions from CPU module 500 is decremented by a clock signal in line 643 which may be derived from I/O Module clock 570. On the register count reaching zero, register 621 sends an interrupt signal to edge trigger flip flop 656.

Setting of one or more of the edge trigger flip flops 647, 651, 654, 656 by the interrupt signals 640, 641, 642, 643 generates a signal (INT) via priority chip 659 to processor 542 of CPU Module 500. On acknowledgement, processor 542, issues a signal (INTA) transferring the status of the edge trigger flip flops 647, 651, 654, 656 to a four bit latch 660 to generate an interrupt instruction code (RESTART) onto the data bus 508.

Each interrupt is assigned a unique RESTART instruction code. Should an interrupt of higher priority be triggered, a new interrupt signal (INT) and RESTART instruction code are generated resulting in a nesting of interrupt software routines whenever the interrupt recognition circuitry is enabled within the CPU 500.

Priority chip 659 serves to establish a handling priority in the event of simultaneous interrupt signals in accordance with the priority schedule described.

Once triggered, the edge trigger flip flop 647, 651, 654, or 656 must be reset in order to capture the next occurrence of the interrupt associated therewith. Each interrupt subroutine serves, in addition to performing the functions programmed, to reset the flip flops (through the writing of a coded byte in a uniquely selected address) and to re-enable the interrupt (through execution of a re-enabling instruction). Until re-enabled, initiation of a second interrupt is precluded while the first interrupt is in progress.

Lines 658 permit interrupt status to be interrogated by CPU module 500 on a memory reference instruction.

I/O Module 502 includes a suitable pulse generator or clock 570 for generating the various timing signals required by module 502. Clock 570 is driven by the pulse-like output $\phi_1$, $\phi_2$ of processor clock 552 (FIG. 11*a*). As described, clock 570 provides a reference clock pulse (in line 574) for synchronizing the output refresh data and is the source of clock pulses (in line 643) for driving Real Time register 621.

CPU interface module 504 interfaces I/O module 502 with the host machine 10 and transmits operating data stored in RAM section 546 to the machine. Referring particularly to FIG. 25 and 26, data and address information are inputted to module 504 through suitable means such as optical type couplers 700 which convert the information to single ended logic levels. Data in bus 508 on a signal from Refresh Control 605 in line 607 (LOAD), is clocked into module 546 at the reference clock rate in line 574 parallel by bit, serial by byte for a preset byte length, with each data bit of each successive byte being clocked into a separate data channel D0–D7. As best seen in FIG. 14, each data channel D0–D7 has an assigned output function with data channel D0 being used for operating the front panel lamps 830 in the digital display, (see FIG. 24), data channel D1 for special circuits module 522, and remaining data channels D2–D7 allocated to the host machine operating sections 530, 532, 534, 536, 538 and 540. Portions of data channels D1–D7 have bits reserved for front panel lamps and digital display.

Since the bit capacity of the data channels D2–D7 is limited, a bit buffer 703 is preferably provided to catch any bit overflow in data channels D2–D7.

Inasmuch as the machine output sections 530, 532, 534, 536, 538 and 540 are electrically a long distance away, i.e. remote, from CPU interface module 504, and the environment is electrically "noisy", the data stream in channels D2–D7 is transmitted to remote sections 530, 532, 534, 536, 538 and 540 via a shielded twisted pair 704. By this arrangement, induced noise appears as a differential input to both lines and is rejected. The associated clock signal for the data is also transmitted over line 704 with the line shield carrying the return signal currents for both data and clock signals.

Data in channel $D_1$ destined for special circuits module 522 is inputted to shift register type storage circuitry 705 for transmittal to module 522. Data is also inputted to main panel interface module 526. Address information in bus 507 is converted to single ended output by couplers 700 and transmitted to Input Matrix Module 524 to address host machine inputs.

CPU interface module 504 includes fault detector circuitry 706 for monitoring both faults occurring in host machine 10 and faults or failures along the buses, the latter normally comprising a low voltage level or failure in one of the system power lines. Machine faults may comprise a fault in CPU module 500, a belt mistrack signal from sensor 27 (see FIG. 2), opening one of the machine doors or covers as responded to by conventional cover interlock sensors (not shown), a fuser over temperature as detected by sensor 175, etc. In the event of a bus fault, a reset signal (RESET) is generated automatically in line 709 to CPU module 500 (see FIGS. 17 and 18) until the fault is removed. In the event of a machine fault, a signal is generated by the CPU in line 710 to actuate a suitable relay (not shown) controlling power to all or a portion of host machine 10. A load disabling signal (LOAD DISBL) is inputted to optical couplers 700 via line 708 in the event of a fault in CPU module 500 to terminate input of data to host machine 10. Other fault conditions are monitored by the software background program. In the event of a fault, a signal is generated in line 711 to the digital display on control console 800 (via main panel interface module 526) signifying a fault.

Referring particularly to FIGS. 17 and 19, special circuits module 522 comprises a collection of relatively independent circuits for either monitoring operation of and/or driving various elements of host machine 10. Module 522 incorporates suitable circuitry 712 for amplifying the output of sensors 225, 226, 227, 228 and 280, 281, 282 of sorter 14 and document handler 16 respectively; circuitry 713 for operating fuser release clutch 159; and circuitry 714 for operating main and auxiliary paper tray feed roll clutches 130, 131 and document handler feed clutch 244.

Additionally, fuser detection circuitry 715 monitors temperature conditions of fuser 150 as responded to by sensor 174. On overheating of fuser 150, a signal (FUS-OT) is generated to turn heater 163 off, actuate clutch 159 to separate fusing and pressure rolls 160, 161; trigger trap solenoid 158 to prevent entrance of the next copy sheet into fuser 150, and initiate a shutdown of host machine 10. Circuitry 715 also cycles fuser heater 163 to maintain fuser 150 at proper operating temperatures and signals (FUS-RDUT) host machine 10 when fuser 150 is ready for operation.

Circuitry 716 provides closed loop control over sensor 98 which responds to the presence of a copy sheet 3 on belt 20. On a signal from sensor 98, solenoid 97 is triggered to bring deflector 96 into intercepting position adjacent belt 20. At the same time, a backup timer (not shown) is actuated. If the sheet is lifted from the belt 20 by deflector 96 within the time allotted, a signal from sensor 99 disables the timer and a mis strip type jam condition of host machine 10 is declared and the machine is stopped. If the signal from sensor 99 is not received within the allotted time, a sheet on selenium (SOS) type jam is declared and an immediate machine stop is effected.

Circuitry 718 controls the position (and hence the image reduction effected) by the various optical elements that comprise main lens 41 in response to the reduction mode selected by the operator and the signal inputs from lens position responsive sensors 116, 117, 118. The signal output of circuitry 718 serves to operate lens drive motor 43 as required to place the optical elements of lens 41 in proper position to effect the image reduction programmed by the operator.

Referring to FIG. 20, input matrix module 524 provides analog gates 719 for receiving data from the various host machine sensors and inputs (i.e. sheet sensors 135, 136; pressure sensor 157; etc), module 524 serving to convert the signal input to a byte oriented output for transmittal to I/O module 502 under control of Input Matrix Select 604. The byte output to module 524 is selected by address information inputted on bus 507 and decoded on module 524. Conversion matrix 720, which may comprise a diode array, converts the input logic signals of "0" to logic "1" true. Data from input matrix module 524 is transmitted via optical isolators 721 and Input Matrix Select 604 of I/O module 502 to CPU Module 500.

Referring particularly to FIG. 21, main panel interface module 526 serves as interface between CPU interface module 504 and operator control console 800 for display purposes and as interface between input matrix module 524 and the console switches. As described, data channels D0–D7 have data bits in each channel associated with the control console digital display or lamps. This data is clocked into buffer circuitry 723 and from there, for digital display, data in channels D1–D7 is inputted to multiplexer 724. Multiplexer 724 selectively multiplexes the data to HEX to 7 segment converter 725. Software controlled output drivers 726 are provided for each digit which enable the proper display digit in response to the data output of converter 725. This also provides blanking control for leading zero suppression or inter digit suppression.

Buffer circuitry 723 also enables through anode logic 728 the common digit anode drive. The signal (LOAD) to latch and lamp driver control circuit 729 regulates the length of the display cycle.

For console lamps 830, data in channel D0 is clocked to shift register 727 whose output is connected by drivers to the console lamps. Access by input matrix module 524 to the console switches and keyboard is through main panel interface module 526.

The machine output sections 530, 532, 534, 536, 538, 540 are interfaced with I/O module 502 by CPU interface module 504. At each interrupt/refresh cycle, data is outputted to sections 530, 532, 534, 536, 538, 540 at the clock signal rate in line 574 over data channels D2, D3, D4, D5, D6, D7 respectively.

Referring to FIG. 22, wherein a typical output section i.e. document handler section 530 is shown, data inputted to section 530 is stored in shift register/latch circuit combination 740, 741 pending output to the individual drivers 742 associated with each machine component. Preferably d.c. isolation between the output sections is maintained by the use of transformer coupled differential outputs and inputs for both data and clock signals and a shielded twisted conductor pair. Due to transformer coupling, the data must be restored to a d.c. waveform. For this purpose, control recovery circuitry 744, which may comprise an inverting/non-inverting digital comparator pair and output latch is provided.

The LOAD signal serves to lockout input of data to latches 741 while new data is being clocked into shift register 740. Removal of the LOAD signal enables commutation of the fresh data to latches 741. The LOAD signal also serves to start timer 745 which imposes a maximum time limit within which a refresh period (initiated by Refresh Control 605) must occur. If refresh does not occur within the presecribed time limit, timer 745 generates a signal (RESET) which sets shift register 740 to zero.

With the exception of sorter section 534 discussed below, output sections 532, 536, 538 and 540 are substantially identical to document handler section 530.

Referring to FIG. 23 wherein like numbers refer to like parts, to provide capacity for driving the sorter deflector solenoids 221, a decode matrix arrangement consisting of a Prom encoder 750 controlling a pair of decoders 751, 752 is provided. The output of decoders 751, 752 drive the sorter solenoids 221 of upper and lower bin arrays 210, 211 respectively. Data is inputted to encoder 750 by means of shift register 754.

Referring now to FIG. 24, control console 800 serves to enable the operator to program host machine 10 to perform the copy run or runs desired. At the same time, various indicators on console 800 reflect the operational condition of machine 10. Console 800 includes a bezel housing 802 suitably supported on host machine 10 at a convenient point with decorative front or face panel 803 on which the various machine programming buttons and indicators appear. Programming buttons include power on/off buttons 804, start print (PRINT) button 805, stop print (STOP) button 806 and keyboard copy quantity selector 808. A series of feature select buttons consisting of auxiliary paper tray button 810, two sided copy button 811, copy lighter button 814, and copy darker button 815, are provided.

Additionally, image size selector buttons 818, 819, 820; multiple or single document select buttons 822, 823 for operation of document handler 14; and sorter sets or stacks buttons 825, 826 are provided. An on/off service selector 828 is also provided for activation during machine servicing.

Indicators comprise program display lamps 830 and displays such as READY, WAIT, SIDE 1, SIDE 2, ADD PAPER, CHECK STATUS PANEL, PRESS FAULT CODE, QUANTITY COMPLETED, CHECK DOORS, UNLOAD AUX TRAY, CHECK DOCUMENT PATH, CHECK PAPER PATH, and UNLOAD SORTER. Other display information may be envisioned.

OPERATION

As will appear, host machine 10 is conveniently divided into a number of operational states. The machine control program is divided into Background routines and Foreground routines with operational control normally residing in the Background routine or routines appropriate to the particular machine state then in effect. The output buffer 546' of RAM memory section 546 is used to transfer/refresh control data to the various remote locations in host machine 10, control data from both Background and Foreground routines being inputted to buffer 546' for subsequent transmittal to host machine 10. Transmittal/refresh of control data presently in output buffer 546' is effected through Direct Memory Access (DMA) under the aegis of a Machine Clock interrupt routine.

Foreground routine control data which includes a Run Event Table built in response to the particular copy run or runs programmed, is transferred to output buffer 546' by means of a multiple prioritized interrupt system wherein the Background routine in process is temporarily interrupted while fresh Foreground routine control data is inputted to buffer 546' following which the interrupted Background routine is resumed.

The operating program for host machine 10 is divided into a collection of foreground tasks, some of which are driven by the several interrupt routines and background or non-interrupt routines. Foreground tasks are tasks that generally require frequent servicing, high speed response, or synchronization with the host machine 10. Background routines are related to the state of host machine 10, different background routines being performed with different machine states. A single background software control program (STATCHK), (TABLE I) composed of specific sub-programs associated with the principal operating states of host machine 10 is provided. A byte called STATE contains a number of indicative of the current operating state of host machine 10. The machine STATES are as follows:

| STATE NO. | MACHINE STATE | CONTROL SUBR. |
|---|---|---|
| 0 | Software Initialize | INIT |
| 1 | System Not Ready | NRDY |
| 2 | System Ready | RDY |
| 3 | Print | PRINT |
| 4 | System Running, Not Print | RUNNPRT |
| 5 | Service | TECHREP |

Referring to FIG. 25, each STATE is normally divided into PROLOGUE, LOOP and EPILOGUE sections. As will be evident from the exemplary program STATCHK reproduced in TABLE I, entry into a given STATE (PROLOGUE) normally causes a group of operations to be performed, these consisting of operations that are performed once only at the entry into the STATE. For complex operations, a CALL is made to an applications subroutine therefor. Relatively simpler operations (i.e. turning device on or off, clearing memory, presetting memory, etc.) are done directly.

Once the STATE PROLOGUE is completed, the main body (LOOP) is entered. The program (STATCHK) remains in this LOOP until a change of STATE request is received and honored. On a change of STATE request, the STATE EPILOGUE is entered wherein a group of operations are performed, following which the STATE moves into the PROLOGUE of the next STATE to be entered.

Referring to FIG. 26 and the exemplary program (STATCHK) in TABLE I, on actuation of the machine POWER-ON button 804, the software Initialize STATE (INIT) is extered. In this STATE, the controller is initialized and a software controlled self test subroutine is entered. If the self test of the controller is successfully passed, the System Not Ready STATE (NRDY) is entered. If not, a fault condition is signalled.

In the System Not Ready STATE (NRDY), background subroutines are entered. These include setting of Ready Flags, control registers, timers, and the like; turning on power supplies, the fuser, etc., initializing the Fault Handler, checking for paper jams (left over form a previous run), door and cover interlocks, fuser temperatures, etc. During this period, the WAIT lamp on console 800 is lit and operation of host machine 10 precluded.

When all ready conditions have been checked and found acceptable, the controller moves to the System Ready State (RDY). The READY lamp on console 800 is lit and final ready checks made. Host machine 10 is now ready for operation upon completion of input of a copy run program, loading of one or more originals 2 into document handler 16 (if selected by the operator), and actuation of START PRINT button 805. As will appear hereinafter, the next state is PRINT wherein the particular copy run programmed is carried out.

Following the copy run, (PRINT), the controller normally enters the System Not Ready state (NRDY) for rechecking of the ready conditions. If all are satisfied, the system proceeds to the System Ready State (RDY) unless the machine is turned off by actuation of POWER OFF button 804 or a malfunction inspired shutdown is triggered. The last state (TECH REP) is a machine servicing state wherein certain service routines are made available to the machine/repair personal, i.e. Tech Reps.

Referring particularly to FIG. 24 and Tables II, III, IV, V, VI and VII, the machine operator uses control console 800 to program the machine for the copy run desired. Programming may be done during either the System Not Ready (NRDY) or System Ready (RDY) states, although the machine will not operate during the System Not Ready state should START PRINT button 805 be pushed. The copy run includes selecting (using keyboard 808) the number of copies to be made, and such other ancilliary program features as may be desired, i.e. use of auxiliary paper tray 102, (push button 810), image size selection (push buttons 818, 819, 820), document handler/sorter selection (push buttons 822, 823, 825 826), copy density (push buttons 814, 815) etc. On completion of the copy run program, START PRINT button 805 is actuated to start the copy run programmed (presuming the READY lamp is on and an original or originals 2 have been placed in tray 233 of document handler 16 if the document handler has been selected).

With programming of the copy run instructions, controller 18 enters a Digit Input routine in which the program information is transferred to RAM section 546. The copy run program data passes via Main Panel Interface Module 526 to Input Matrix Module 524 and from there is addressed through Matrix Input Select 604, Multiplexer 624, and Buffers 620 of I/O Module 502 to RAM section 546 of CPU Module 500.

On entering PRINT STATE, a Run Event Table (FIG. 27) comprised of Foreground tasks is built for operating in cooperation with the Background tasks the various components of host machine 10 in an integrated manner to produce the copies programmed. The Run Event Table is formed by controller 18 through merger of a Fixed Pitch Event Table (TABLE II) (stored in ROM 545 and Non Volatile Memory 610) and a Variable Pitch Event Table (TABLE III) in a fashion appropriate to the parameters of the job selected.

The Fixed Pitch Event Table (TABLE II) is comprised of machine events whose operational timing is fixed during each pitch cycle such as the timing of bias to transfer roll 75, (TRN 2 CUPR), actuating toner concentration sensor 65 (ADC ACT), loading roll 161 of fuser 150 (FUS*LOAD), and so forth, irrespective of the particular copy run programmed. The Variable Pitch Table (TABLE III) is comprised of machine events whose operational timing varies with the individual copy run programmed, i.e. timing of pitch fade-out lamp 44 (FO*ONBSE), timing of flash illumination lamps 37 (FLSH BSE), etc. The variable Pitch Table is built by the Pitch Table Builder (TABLE IV) from the copy run information programmed in by controller 18 (using the machine control program stored in ROM section 545 and Non-Volatile Memory 610), coupled with event address information from ROM section 545, sorted by absolute clock count (TABLE V), and stored in RAM section 546 (TABLE VI). The Fixed Pitch Event Table and Variable Pitch Table are merged with the relative clock count differences between Pitch events calculated to form a Run Event Table (TABLE VII).

Referring particularly to FIG. 35, the Run Event Table consists of successive groups of individual events 851. Each event 851 is comprised of four data blocks, data block 852 containing the number of clock pulses (from machine clock 202) to the next scheduled pitch event (REL DIFF), data block 853 containing the shift register position associated with the even (REL SR), and data blocks 854, 855 (EVENT LO) (EVENT HI) containing the address of the event subroutine.

In machine states other than PRINT, data blocks 852, 853 (REL DIFF) (REL SR) are set to zero. Data blocks 854, 855 hold the address information for the non-Print state event.

Control data in the Run Event Table represents a portion of the foreground tasks and is transferred to the output buffer 546' of RAM memory section 546 by the Pitch Reset and Machine Clock interrupt routines. Other control data, representing foreground tasks not in the Run Event Table is transferred to RAM output buffer 546' by the Document Handler Clock and Real Time Clock interrupt routines. Transfer of the remainder of the control data to output buffer 546' is by means of background (non-interrupt) routines.

Transfer of control data from output buffer 546' of RAM memory section 546 to the various locations in host machine 10 is through output Refresh via Direct Memory Access (DMA) in response to machine clock interrupt signals as will appear. The interrupt routines are initiated by the respective interrupt signals 640, 641, 642, 643.

Referring particularly to FIG. 15 and 27–29 and TABLES VII, the interrupt having the highest priority, the Pitch Reset interrupt signal 640, is operable only during the PRINT State, and occurs once each revolution of sheet register fingers 141 as responded to by sensor 146 of pitch reset clock 138. At each pitch reset interrupt signal, after a determination of priority by Priority Chip 659 in the event of multiple interrupt signals, an interrupt signal (INT) is generated. The acknowledgement signal (INTA) from processor 542 initiates the pitch reset interrupt routine.

On entering the pitch reset routine, the interrupt is re-enabled and the contents of the program working registers stored. A check is made to determine if building of the Run Event Table is finished. Also checks are made to insure that a new shift register valve has been build and at least 910 clock counts since last pitch reset have elapsed. If not, an immediate machine shutdown is initiated.

Presuming that the above checks are satisfactory, the shift register pointer (SR PTR), which is the byte variable containing the address of a pre-selected shift register position (SR O), is decremented by one and adjusted for overflow and the shift register contents are updated with a byte variable (SR+VALUV) containing the new shift register value to be shifted in following the pitch reset interrupt. The event pointer (EV*PTR), a two byte variable containing the full address of the next scheduled event, is reset to Event #1. The count in the C register equals the time to the first event.

Machine Cycle Down, Normal Down, and Side One Delay checks are made, and if negative, the count on a cycle up counter (CYC UP CT) is checked. If the count is less than a predetermined control count (i.e. 5), the counter (CYC UP CT) is incremented by one. When the count on the cycle up counter equals the control count, an Image Made Flag is set.

If a Normal Down, Cycle Down, or Side One Delay has been initiated, the cycle up counter (CYC UP CT) is reset to a preset starting count (i.e. 2). The pitch reset interrupt routine is exited with restoration of the working registers and resetting of pitch reset flip flop 647.

The Machine Clock Interrupt routine, which is second in priority, is operative in all operational states of host machine 10. Although nominally driven by machine clock 202, which is operative only during Print state when processor main drive motor 34 is energized, machine clock pulses are also provided by phase locked loop 649 when motor 34 is stopped.

Referring particularly to FIG. 30 and TABLE IX entry to the Machine Clock interrupt routine there shown is on signal (INTA) from processor 542 following a machine clock interrupt signal 642 as described earlier. On entry, the event control register (CREG) is obtained and the working register contents stored. The C REG is decremented by one, the register having been previously set to a count corresponding to the next event in the Event Run Table.

The control register (C REG) is checked for zero. If the count is not zero and is an odd number, an output refresh cycle is initiated to effect transfer/refresh of data in RAM output buffer 546' to host machine 10. If the number is even, or following an output refresh, the interrupt system is re-enabled, the machine clock interrupt flip flop 651 is reset and the working registers are restored. Return is then made to the interrupted routine.

If the control register (C REG) count is zero, the Event Pointer (EV*PTR), which identifies the clock count (in data block 852) for the next scheduled event (REL DIFF), is loaded and the control register (C REG) reset to a new count equal the time to the next event. The Event Pointer (EV*PTR) is incremented to the relative shift register address for the event (REL SR, data block 853), and the shift register address information is set in appropriate shift registers (B, D, E, A registers).

The Event Pointer (EV*PTR) is incremented successively to the Event subroutine address information (EVENT LO) (EVENT HI) in the Event Run Table, and the address information therefrom loaded into a register pair (D&E registers). The Event Pointer (EV PTR) is incremented to the first data block (REL DIFF) of the next succeeding event in the Run Event Table, saved, and the register pair (H&L registers) that comprise the Event Pointer are loaded with the event subroutine address from the register pair (D&E registers) holding the information. The register pair (D&E registers) are set to the return address for the Event Subroutine. Using the address information, the Event Subroutine is called and the subroutine data transferred to RAM output buffer 546' for transfer to the host machine on the next Output Refresh.

Following this, the Machine Clock interrupt routine is exited as described earlier.

The Output Refresh cycle alluded to earlier functions, when entered, to transfer/refresh data from the output buffer of 546' RAM section 546 to host machine 10. Direct Memory Access (DMA) is used to insure a high data transfer rate.

On a refresh, Refresh Control 605 (see FIG. 15) raises the HOLD line to processor 542, which on completion of the operation then in progress, acknowledges by a HOLD A signal. With processor 542 in a hold mode and Address and Data buses 507, 508 released to I/O Module 502 (through operation of tri-state buffers 510, 511, 563, 570), the I/O module then sequentially accesses the output buffer 546' of RAM section 546 and transfers the contents thereof to host machine 10. Data previously transferred is refreshed.

The Document Handler interrupt routine operates only when document handler drive motor 236 is energized. The Document Handler interrupt is third in priority.

Referring particularly to FIG. 31 and TABLE X, the Document Handler interrupt routine is effected in the same manner as described earlier in connection with the Pitch Reset and Machine interrupts, entry being in response to a specific RESTART instruction code for this routine. On entry, the interrupt is enabled and the program registers stored. A control counter which counts clock counts between events is decremented and the count queried. Based on the count, the appropriate document handler routine (AD-STATE) is called. The registers are then restored and the Document handler interrupt re-enabled.

The Real Time Interrupt, which carries the lowest priority, is active in all machine states. Primarily, the interrupt acts as an interval timer by decrementing a series of timers which in turn serve to control initiation of specialized background subroutines used for control and error checking purposes.

Referring particularly to FIG. 32, and TABLE XI, the Real Time interrupt routine is entered in the same manner as the interrupt routines previously described, entry being in response to a specific RESTART instruction code assigned to the Real Time interrupt. On entry, the interrupt is re-enabled and the register contents stored. The timer pointer (PNTR) for the first class of timers (i.e. 10 msec TIMERS) is loaded, and a loop counter identifying the number of timers of this class (i.e 10 msec TIMERS) preset. A control register (E REG) is loaded and a timer decrementing loop is entered for the first timer. The loop decrements the particular timer, increments the timer pointer (PNTR) to the location of the next timer in this class, checks the timer count, and decrements the loop counter. The decrementing loop routine is repeated for each timer in the class (i.e. 10 msec TIMERS) following which a control counter (CNTR) for the second group of timers (i.e. 100 msec TIMERS) is decremented by one and the count checked.

The control counter (CNTR) is initially set to a count equal to the number of times the first timer interval is divisible into the second timer interval. For example, if the first class of timers are 10 msec timers and the second timer class are 100 msec timers, the control counter (CNTR) is set at 10 initially and decremented on each Real Time interrupt by one down to zero.

If the count on the control counter (CNTR) is not zero, the registers are restored, Real Time interrupt flip flop 856 reset, and the routine exited. If the count on the control counter is zero, the counter is reloaded to the original maximum count (i.e. 10) and a loop is entered decrementing individually the second group of timers (i.e. 100 msec TIMERS). On completion, the routine is exited as described previously.

In the following TABLES:

"*"—is used to indicate flags, counters and subroutine names.

"#"—is used to indicate output signals.

"$"—is used to indicate macro instructions, system subroutines, system flags, and data, etc.

":"—is used to indicate macro instructions, system subroutines, system flags, and data, etc.

TABLE I

STATE CHECKER ROUTINE (STATCHK)

```
                       INITIALIZATION STATE BACKGROUND- PROLOG
001D6               INIT:   EQU
                       INITIALIZATION STATE BACKGROUND- WHILE: LOOP
001D6   3A08FE          WHILE:    XBYT,STATE:,EQ,0     DO INIT LOOP WHILE COND EXISTS
001D9   FE00
001DB   C2EE01
001DE   CDF305          CALL      SELFTEST             CALL CONTROLLER SELF TEST SUBR
001E1   78              IF:       XBYT,B,EQ,0          DID CONTROLLER PASS SELF TEST
001E2   FE00
001E4   C2EB01
001E7   2108FE          INCBYT    STATE:               YES, MOVE TO NOT-READY STATE
001EA   34
                        ENDIF
001EB   C3D601          ENDWHILE
                       INITIALIZATION STATE BACKGROUND- EPILOG
001EE   2184F7          LXI       H,RDYFLGS:           H&L=ADDR OF FIRST RDY FLAG
001F1   060A            MVI       B,RDYFNUM:           B=NUMBER OF RDY FLAGS
001F3   1680            MVI       D,X'80'              D-REG TO SET FLAGS
001F5   78              WHILE:    XBYT,B,NE,0          DO LOOP = TO # IN B-REG
001F6   FE00
001F8   CA0102
001FB   72              MOV       M,D                  SET FLAG
001FC   23              INX       H                    H&L=ADDR OF NEXT FLAG
001FD   05              DCR       B                    DECR LOOP COUNTER
001FE   C3F501          ENDWHILE
                        LOOP TO SET ALL RDY FLAGS
00201   3E80            SFLG      2SD*ENAB
00203   325FF4
00206   3E80            SFLG      PROG*RDY             SET PROG ROUTINE READY
00208   3287F7
00208   3E80            SFLG      DSPL*SEL             INIT PROG TO DISPLAY QTY SELECT
0020D   3234F4
00210   2106FE          LXI       H,DIVD10:            H&L= ADDR OF 100 MSEC CNTR
00213   360A            MVI       M,10                 PRESET TO 10
00215   2120F8          LXI       H,TMRBASE:           H&L=ADDR OF 1ST 10 MSEC TIMER
00218   AF              XRA       A                    A=0 (SET 'Z' CONDITION CODE)
00219   C               ADI       TIMCNT1:+TIMCNT2:  A=TOTAL # OF TIMERS (10 & 100)
00218   1601            MVI       D,1                  SET ALL TIMERS TO TERMINAL CNT
0021D   CA2602          WHILE     CC,Z,C               WHILE # TIMERS .NE. 0...
00220   72              MOV       M,D                  HALT THE PRESENT TIMER
00221   23              INX       H                    MOVE TO NEXT TIMER LOC
00222   3D              DCR       A                    DECRM LOOP CNTR (# OF TIMERS)
00223   C31D02          ENDWHILE
00226   2121F7          LXI       H,FLT*TBL            INITIALIZE WHERE FLT HANDLER
00229   2279F8          SHLD      FLT*ADDR             STARTS TO LOOK FOR FAULTS
0022C   3E80            SFLG      FLT*TOP              USED TO INITIALIZE FAULT VALUE
0022E   325EF4
00231   21CB01          LXI       H,EV*STBY:           H&L= ADDR OF STBY EVENT TABLE
00234   2250F8          SHLD      EV*PTR:              SAVE FOR MACH CLK ROUTINE
00237   2EF0            MVI       A,X'F0'              LOAD 'RESET INTERRUPTS' DATA
00239   3200E6          STA       RSINTFF:             RESET ALL INTERRUPT FLIP-FLOPS
```

```
0023C   FB              EI                                  ENABLE INTERRUPT SYSTEM
0023D   21DCFF          SOBIT      PFO$OFF                  TURN OFF PITCH FADE-OUT LAMP
0024D   3E20
00242   F3
00243   B6
00244   77
00245   FB
00246   2131FF          SOBIT      24V$SPL                  TURN ON 24 VOLT SUPPLY
00249   3E20
0024B   F3
0024C   B6
0024D   77
0024E   FB
0024F   3E47            STIM       ILK*TIME,7000            SET BLOWER START-UP DELAY
00251   322FF8
00254   C9              RET                                 RETURN TO STATE CHECKER
                SYSTEM NOT-READY STATE BACKGROUND-          PROLOG
0032C   DC5C03  NRDY: CALL         NRDY:SSL                 DO SLW-SCAN BKGD AT LEAST ONCE
                SYSTEM NOT-READY STATE BACKGROUND-          WHILE: LOOP
00255   3A08FE  NRDY:  WHILE:  XBYT,STATE:,EQ,1             DO NRDY LOOP WHILE COND EXISTS
00258   FE01
0025A   C28002
0025D   CD2C06          CALL       STBYBKG:                 CALL COMMON STBY BKGND SUBRIS
00260   CD4B06          CALL       DELAY
00263   CD0000          CALL       FLT*DISP                 DISPLAY FAULT CODE
00266   CD0000          CALL       RED*BGND                 CONTROL LENS IN NRDY: STATE
00269   CD0000          CALL       SOS*SUS                  SOS JAM DETECTION
0026C   CD0000          CALL       BLK*NRDY                 BLINK THE WAIT LAMP
0026F   CD205           CALL       RDYTEST:                 CALL READY CONDITION TEST SUBR
00272   3A09F4          IF:        FLG,ALL*RDY,T            ARE ALL READY CONDITONS OK
00275   07
00276   D27D02
00279   2108FE          INCBYT     STATE:                   YES, MOVE TO RDY STATE
0027C   34
                        ENDIF
0027D   C35502          ENDWHILE
                SYSTEM NOT-READY STATE BACKGROUND.  EPILOG
00280   21E9FF          COBIT      WAIT$                    TURN OFF WAIT LAMP
00283   3EFE
00285   FE
00286   A6
00287   77
00288   FB
00289   C9              RET                                 RETURN TO STATE CHECKER
                SYSTEM READY STATE BACKGROUND- PROLOG
0028A   21E7FF  RDY: SOBIT         READY$                   TURN ON READY LAMP
0028D   3E01
0028F   F3
00290   B6
00291   77
00292   FB
00293   AF              CFLG       STRT:PRT                 DISALLOW PRINT UNTIL SWSK CALLS
00294   324EF4
                SYSTEM READY STATE BACKGROUND. WHILE: LOOP
00297   3A08FE          WHILE:     XBYT,STATE:,EQ,2         DO RDY LOOP WHILE COND EXISTS
0029A   FE02
0029C   C2C602
0029F   CD2C06          CALL       STBYBKG:                 CALL COMMON STBY BKGND SUBRIS
002A2   CD4B06          CALL       DELAY
002A5   CD0000          CALL       SFT*CALC                 CALC SHIFTED IMAGE VALUES
002A8   CDD205          CALL       RDYTEST:                 CALL READY CONDITION TEST SUBR
002AB   2108FE          LXI        H,STATE:                 H&L= ADDR OF STATE:
002AE   3A09F4          IF:        FLG,ALL*RDY,F            ARE ALL READY CONDITIONS OK
002B1   07
002B2   DABA02
002B5   3601            MVI        M,1                      NO, LOAD 1 INTO STATE: (NRDY)
```

```
002B7   C3C302           ELSE:                                ALL READY CONDITIONS MET
002BA   3A4EF4           IF:      FLG,STRT:PRT,T              HAS 'START PRINT' BEEN PUSHED
002BD   07
002BE   D2C302
002C1   3603             MVI      M,3                         YES, LOAD 3 INTO STATE: (PRINT)
                         ENDIF
                         ENDIF
002C3   C39702           ENDWHILE
                 SYSTEM READY STATE BACKGROUND- EPILOG
002C6   21E7FF           COBIT    READY$                      TURN OFF READY LAMP
002C9   3EFE
002CB   F3
002CC   A6
002CD   77
002CE   FB
002CF   C9               RET                                  RETURN TO STATE CHECKER
                 PRINT STATE BACKGROUND- PROLOG 1
002D0   AF       PRINT:  XRA      A                           CLR A-REG FOR USE AS CN3R
002D1   47               MOV      B,A                         CLR B-REG (0'S INTO SHIFTREG)
002D2   2100F8           LXI      H,SHIFTREG                  H&L= START ADDR OF SHIFTREG
002D5   FE20             WHILE:   XBYT,A,LT,32                WHILE STILL IN SR...(CLR SR)
002D7   D2E002
002DA   70               MOV      M,B                         CLR PRESENT SR LOCATION
002DB   23               INX      H                           MOVE TO NEXT SR LOCATION
002DC   3C               INR      A                           INCRM LOOP CNTR
002DD   C3D502           ENDWHILE
002E0   3E80             SFLG     910*DONE                    ALLOW FIRST PITCH RESET
002E2   3260F4
002E5   3E80             SFLG     SRSK*FLG                    SIGNAL NEW SR VALUE REQ'D
002E7   321CF4
002EA   AF               XRA      A
002EB   3207FE           STA      CYCUPCT:                    INIT CYCLE-UP CNTR TO 0
002EE   3205FE           STA      SR*VALU:                    INIT 'NEW SR VALUE' TO 0
002F1   3E03             MVI      A,3
002F3   320AFE           STA      NOIMGCT:                    INIT 'NO IMAGE CNTR' TO 3
002F6   CD0000           CALL     SRSK                        SHIFT REG SCHEDULER (INIT SR#0)
002F9   CD0000           CALL     TBLD*PRT                    BUILD NEW PITCH TABLE
002FC   3E51             STIM     SYS:TIMR,800                INIT 'OVER-RUN EVENT' TIMER
002FE   3221F8
00301   21F5FF           SOBIT    PRNT$RLY                    TURN ON PRINT RELAY (PRINT)
00304   3E08
00306   F3
00307   B6
00308   77
00309   FB
0030A   21DCFF           COBIT    PFO$OFF                     TURN ON FADE-OUT LAMP
0030D   3EDF
0030F   F3
00310   A6
00311   77
00312   FB
00313   AF               CFLG     NORM*DN:                    CLR NORMAL SHUTDOWN REQUEST
00314   3210F4
00317   AF               CFLG     SK1*DLY                     CLR SIDE 1 DELAY FLAG
00318   3216F4
0031B   AF               CFLG     TIME*DN:                    CLR TIMED SHUTDOWN REQUEST FLAG
0031C   324BF7
0031F   AF               CFLG     IMGMADE:                    CLR 1st IMAGE MADE FLAG
00320   320FF4
00323   AF               CFLG     CYCL*DN:                    CLR CYCLE-DOWN REQUEST FLAG
00324   3249F7
00327   AF               CFLG     IMED*DN:                    CLR IMMED SHUTDOWN REQUEST FLAG
00328   324AF7
0032B   AF               CFLG     SD1*TIMO                    CLR SIDE 1 TIME OUT FLAG
0032C   3207F4
0032F   AF               CFLG     PROC*JAM                    CLEAR IN CASE THERE WAS A JAM
```

```
00339   CD0000      CALL     PAP*SIZE CHECK PAPER WIDTH FOR FUSER
0033C   CD0000      CALL     PROG*UP              PROG INITIALIZATION SUBR
0033F   CD0000      CALL     CLBK*SPR             COLOR BKGRD HI BIAS AT SRT PRT
00342   CD0000      CALL     SET*UP               INITIALIZE ITEMS FOR PAPER PATH
00345   CD0000      CALL     FDR*PRT              CHECK FEEDER SELECTION
                    CALL TO EDGE*FB MUST BE AFTER CALL TO PAP*SIZE
00348   CD0000      CALL     EDGE*FO              DETERMINE WHICH EDGE FADE OUT
              PRINT STATE BACKGROUND- WHILE: LOOP
0034B   3A08FE      WHILE:   XBYT,STATE:,EQ,3     DO PRINT WHILE COND EXISTS
0034E   FE03
00350   C27404
00353   3A07FE      IF:      XBYT,CYCUPCT:,EQ,3   IS CYCLE-UP CNTR= 3
00356   FE03
00358   C26303
00358   3E80        SFLG     PRT*PRO2             YES, SET 'PRINT PROLOG 2' FLAG
0035D   3220F4
00360   C37D03      ORIF:    XBYT,A,EQ,4          NO, IS CYCLE-UP CNTR= 4
00363   FE04
00365   C27D03
00368   3A20F4      ANDIF:   FLG,PRT*PRO2,T       YES, AND IS PROLOG 2 FLAG SET
0036B   07
0036C   D27D03
0036F   AF          CFLG     PRT*PRO2             YES, DO PROLOG 2 AND CLR FLAG
00370   3220F4
              PRINT STATE BACKGROUND- PROLOG 2
00373   3A0FF4      IF:      FLG,IMGMADE:,T       HAS 1ST IMAGE BEEN MADE
00376   07
00377   D27D03
0037A   CD0000      CALL     PROG*UP              YES,CALL PROG INITIALIZATION
                    ENDIF
                    ENDIF
0037D   CD0000      CALL     SRSK                 SHIFT REG SCHEDULER SUBR
00380   CD0000      CALL     PRT*SWS              PRINT SWITCH SCAN SUBR
00389   CD4B06      CALL     DELAY
0038C   CD0000      CALL     READY*CK             CONTROL READY LAMP IN PRINT
0038F   CD0000      CALL     DSPL*CTL             CONTROL DIGITAL DISPLAY
00392   CD0000      CALL     RLTIM*DO             COMPLETE PROG PITCH EVENTS
00395   CD0000      CALL     FUS*RDUT             TEST FUSER FOR UNDER-TEMP
00398   CD0000      CALL     OIL*MSFD             STOP OIL IF MISFEED
0039B   CD0000      CALL     SOS*JMDT             SOS PRT JAM CHECK
003A1   CD0000      CALL     MANL*DN              CHECK MANUAL DN SW
003A4   CD0000      CALL     NM*ELV*P             MONITOR MAIN TRAY IN PRINT
003A7   CD0000      CALL     TON*DIS              TONER DISPENSE ROUTINE
003AA   CD0000      CALL     DVLMB*JM             DVL OPERATION IF MISFEED
003AD   CD0000      CALL     SETJ6TOG             CHECK JAM6 FOR EXIT OF COPY
003B0   CD0000      CALL     FDR*BK*R             RESET FEEDER HARDWARE
003B3   CD0000      CALL     FDR*BKF1             1ST SHEET FAULT DETECT (FDR)
003B6   CD0000
003B9   2108FE      LXI      H,STATE:             H&L= ADDR OF STATE: BYTE
003BC   3A4AF7      IF:      FLG,IMED*DN:,T       IS IMMED SHUTDOWN REQUESTED
003BF   07
003C0   D2C703
003C3   34          INR      M                    YES, MOVE TO RUNNPRT: STATE
003C4   C34B04      ELSE:                         IMMED SHUTDOWN NOT REQUESTED
003C7   3A0AFE      LDA      NOIMGCT:             PREPARE TO TEST 'NO IMAGE CNTR'
003CA   47          MOV      B,A                  B= <NO IMAGE CNTR>
003CB   3A49F7      IF:      FLG,CYCL*DN:,T       IS CYCLE-DOWN REQUESTED
003CE   07
003CF   D2F803
003D2   3A0FF4      IF:      FLG,IMGMADE:,F       YES, HAS 1ST IMAGE BEEN MADE
003D5   07
003D6   DADD03
003D9   34          INR      M                    NO, MOVE TO RUNNPRT: STATE
003DA   C3F503      ORIF:    FLG,SD1*TIMEO,T      IS PROC MAKING SIDE 1'S - DUPLEX
003DD   3A07F4
003E0   07
```

```
003E1   D2EE03
003E4   78          IF:      XBYT,B,GE,16       YES, WERE THERE)15 NO IMAGES
003E5   FE10
003E7   DAEB03
003EA   34          INR      M                  YES, MOVE TO RUNNPRT: STATE
                    ENDIF
003EB   C3F503      ORIF:    XBYT,B,GE,13       WERE THERE)12 NO IMAGES
003EE   78
003EF   FE0D
003F1   DAF503
003F4   34          INR      M                  YES, MOVE TO RUNNPRT: STATE
                    ENDIF
003F5   C34B04      ORIF:    FLG,NORM*DN:,T     IS A NORMAL SHUTDOWN REQUESTED
003F8   3A10F4
003FB   07
003FC   D20A04
003FF   3A0FF4      ANDIF:   FLG,IMGMADE:,F     YES, AND ARE O IMAGES FLASHED
00402   07
00403   DA0A04
00406   34          INR      M                  YES, MOVE TO RUNNPRT: STATE
00407   C34B04      ORIF:    FLG,SD1*TIMO,T     IS PROC MAKING SIDE 1'S- DUPLEX
0040A   3A07F4
0040D   07
0040E   D22C04
00411   3A39F4      IF:      FLG,ADH*MUTF,F     YES, IS ADH IN MULT FEED MODE
00414   07
00415   DA2204
00418   78          IF:      XBYT,B,GE,36       NO, WERE THERE)35 NO IMAGES
00419   FE24
0041B   DA1F04
0041E   34          INR      M                  YES, MOVE TO RUNNPRT: STATE
                    ENDIF
0041F   C32904      ELSE:
00422   78          IF:      XBYT,B,GE,16       WERE THERE > 15 NO IMAGES
00423   FE10
00425   DA2904
00428   34          INR      M                  YES, MOVE TO RUNNPRT: STATE
                    ENDIF
                    ENDIF
00429   C34B04      ORIF:    FLG,ADH*MUTF,F     IS ADH NOT IN MULTIPLE FEED
0042C   3A39F4
0042F   07
00430   DA4404
00433   3A38F4      ANDIF:   FLG,ADH*SINF,F     YES, AND IS IT NOT IN SINGLE
00436   07
00437   DA4404
0043A   78          IF:      XBYT,B,GE,21       NO, WERE THERE)20 NO IMAGES
0043B   FE15
0043D   DA4104
00440   34          INR      M                  YES, MOVE TO RUNNPRT: STATE
                    ENDIF
00441   C34B04      ELSE:                       ADH IS SELECTED
00444   78          IF:      XBYT,B,GE,13       WERE THERE)12 NO IMAGES
00445   FE0D
00447   DA4B04
0044A   34          INR      M                  YES, MOVE TO RUNNPRT: STATE
                    ENDIF
                    ENDIF
                    PRINT STATE BACKGROUND-EPILOG
0044B   3A10F4      IF:      FLG,NORM*DN:,F     IS NORMAL SHUTDOWN REQUESTED
0044E   07
0044F   DA6304
00452   3A49F7      ANDIF:   FLG,CYCL*DN:,F     NO, IS CYCLE-DOWN REQUESTED
00455   07
00456   DA6304
00459   3A16F4      ANDIF:   FLG,SD1*DLY,F      NO, IS PROC DEAD CYCLING
0045C   07
```

```
0045D   DA6304
00460   C37104       ELSE:                         1 OR BOTH COND'S REQUESTED
00463   3E02         MVI        A,2                LOAD 2 INTO CYCLE-UP CNTR TO
00465   3207FE       STA        CYCUPCT:           FORCE THE CYCLE-UP MODE AGAIN
00468   21DAFF       COBIT      ILLM$SPL           ILLM SPL OFF DURING DEAD CYCLE
0046B   3EF7
0046D   F3
0046E   A6
0046F   77
00470   FB
                     ENDIF
00471   C34B03       ENDWHILE
00474   21F5FF       COBIT      PRNT$RLY           TURN OFF PRINT RELAY
00477   3EF7
00479   F3
0047A   A6
0047B   77
0047C   FB
0047D   AF           CFLG       TBLD*FIN           SIGNAL NEW PITCH TABLE REQ'D
0047E   325DF4
00481   21CB01       LXI        H,EV*STBY:         H&L= ADDR STBY EVENT TABLE
00484   2250F8       SHLD       EV*PTR:            SAVE FOR MACH CLK ROUTINE
00487   21DCFF       COBIT      PFO$OFF            TURN OFF FADE-OUT LAMP
0048A   3EDF
0048C   F3
0048D   A6
0048E   77
0048F   FB
00490   21EEFF       COBIT      EFO$11             CLEAR 11 IN EDGE FADE-OUT LAMP
00493   3EF7
00495   F3
00496   A6
00497   77
00498   FB
00499   21D9FF       COBIT      EFO$12$5           CLEAR 12.5 IN EDGE FADE-OUT
0049C   3EF7
0049E   F3
0049F   A6
004A0   77
004A1   FB
004A2   CD0000       CALL       FUSNTRDY           TURN OFF FUSER STUFF
004A5   CD0000       CALL       SOS*STBY           CLEAR SOS ENABLE
004A8   21EEFF       COBIT      DTCK$EDG
004AB   3EBF
004AD   F3
004AE   A6
004AF   77
004B0   FB
004B1   21F6FF       COBIT      XER$CURR           TURN OFF TRANSFER CIRCUIT
004B4   3EBF
004B6   F3
004B7   A6
004B8   77
004B9   FB
004BA   21F0FF       COBIT      XER$LOAD           RELEASE TRANSFER ROLL
004BD   3EDF
004BF   F3
004C0   A6
004C1   77
004C2   FB
004C3   21F3FF       COBIT      AX$WT              TURN OFF AUXILIARY TRAY WAIT
004C6   3EFD
004C8   F3
004C9   A6
00004CA 77
004CB   FB
```

```
004CC   21F4FF        COBIT     MN$WT               TURN OFF MAIN TRAY WAIT
004CF   3EFD
004D1   F3
004D2   A6
004D3   77
004D4   FB
004D5   21FBFF        COBIT     AXFD$INT            TURN OFF AUXILIARY FEEDER
004D8   3EFD
004DA   F3
004DB   A6
004DC   77
004DD   FB
004DE   21FAFF        COBIT     MNFD$INT            TURN OF MAIN FEEDER
004E1   3EFD
004E3   F3
004E4   A6
004E5   77
004E6   FB
004E7   21DAFF        COBIT     ILLM$SPL            TURN OFF ILLUMINATION LAMP SUPPLY
004EA   3EF7
004EC   F3
004ED   A6
004EE   77
004Ef   FB
004F0   CD0000        CALL      DVL*NRDY            TURNS OFF DVL IF JAM
004F3   C9            RET                           RETURN TO STATE CHECKER
                SYS::EM RUNNING, NOT PRINT STATE :ACKGROUND- WHILE: LOOP
004F4   3A08FE  RUNNPRT  WHILE:  XBYT,STATE:,EQ,4   DO RUNNPRT WHILE COND EXISTS
004F7   FE04
004F9   C28805
004FC   CD0000        CALL      READY*CK            CONTROL READY LAMP IN RUNNPRT:
004FF   CD0000        CALL      DSPL*CTL            CONTROL DIGITAL DISPLAY
00502   CD0000        CALL      RLTIM*DO            COMPLETE PROG PITCH EVENTS
00505   CD0000        CALL      ILK*CK
00508   CD0000        CALL      RILK*CK
00508   CD0000        CALL      FUS*RDUT            TEST FUSER FOR UNDER-TEMP·
0050E   CD0000        CALL      MANL*DN             CHECK MANUAL DN SW
00511   CD0000        CALL      MN*ELV*S            MONITORS MAIN TRAY IN SDBY
00514   CD4B06        CALL      DELAY
00517   CD0000        CALL      SETJ6TOG            CHECK JAM6 SW FOR EXIT OF COPY
0051A   3A58F4        IF:       FLG,SRT*SETF,T      IS SRT SELECTED (SETS MADE)
0051D   07
0051E   D23205
00521   3A6EF4        ANDIF:    FLG,SRT*COPY,F      YES, AND ARE SRT COPIES ,NE.0
00524   07
00525   DA3205
00528   3A6CF4        ANDIF:    FLG,SRT*JAM,F       YES, AND IS SRT JAM-FREE
0052B   07
0052C   DA3205
                ALL TESTS PASSED- STAY IN RUNNPRT: STATE
0052F   C38505        ORIF:     FLG,SRT*STKF,T      IS SRT SELECTED (STKS MODE)
00532   3A59F4
00535   07
00536   D24A05
00539   3A6EF4        ANDIF:    FLG,SRT*COPY,F      YES, AND ARE SRT COPIES ,NE.0
0053C   07
0053D   DA4A05
00540   3A6CF4        ANDIF:    FLG,SRT*JAM,F       YES, AND IS SRT JAM-FREE
00543   07
00544   DA4A05
                ALL TESTS PASSED- STAY IN RUNNPRT: STATE
00547   C38505        ORIF:     FLG,SD1*TIMO,T      ARE SIDE 1 COPIES GOING TO AUX
0054A   3A07F4
0054D   07
0054E   D25C05
00551   3AF1FF        ANDIF:    OBIT,RET$MOT,T      YES, AND IS RETURN PATH MOTOR ON
```

```
00554    E608
0556     CA5C05
                ALL TESTS PASSED- STAY IN RUNNPRT: STATE
00559    C38505      ORIF:     FLG,SYS:TIME,T      HAS TIMER BEEN INITIATED (PLL
0055C    3A1FF4
0055F    07
00560    D27305
                                                   UNLOCKED LAST TIME THRU)
00563    3A21F8      IF:       TIM,SYS:TIMR,L      YES, IS TIMER TIMED OUT
00566    D601
00568    C27005
0056B    3E01        MVI       A,1                 YES, LOAD 1 INTO STATE: FORCING
0056D    3208FE      STA       STATE:              MOVE TO NRDY STATE
                     ENDIF
00570    C38505      ORIF:     XBYT,RIS#BYT,AND,PLL,NZ TIMER NOT USED: IS PLL LOCKED
00573    3A0036
00576    E610
00578    CA8505
00578    3E1F        STIM      SYS:TIMR,300        NO, SET TIMER TO 300 MSEC
0057D    3221F8
00580    3E80        SFLG      SYS:TIMF            SET 'TIMER IN USE' FLAG
00582    321FF4
                     ENDIF
00585    C3F404      ENDWHILE
                SYSTEM RUNNING, NOT PRINT STATE BACKGROUND-EPILOG
00588    CD0000      CALL      DEL*CK              CALC COPIES DELIVERED INFO
00588    21F3FF      COBIT     FUS$TRAP            INSURE FUSER TRAP SOL OFF
0058E    3EDF
00590    F3
00591    A6
00592    77
00593    FB
00594    C9          RET                           RETURN TO STATE CHECKER
                TECH REP STATE BACKGROUND- WHILE: LOOP
00595    3A08FE TECHREP: WHILE XBYT,STATE:,EQ,5    DO TECHREP WHILE COND EXISTS
00598    FE05
0059A    C2AB05
0059D    CD0000      CALL      ILK*CK
005A0    CD0000      CALL      NRILK*CK
005A3    3E01        MVI       A,1                 LOAD 1 INTO STATE: TO FORCE A
005A5    3208FE      STA       STATE:              CHANGE TO NRDY STATE
005A8    C39505      ENDWHILE
005AB    C9          RET                           RETURN TO STATE CHECKER
```

TABLE II

FIXED PITCH EVENT TABLE

```
0001E    0200        EVENT     2,3,TRN2CUPR
00020    03
00021    0000
00023    0300        EVENT     3,2,ADC*ACT
00025    02
00026    0000
00028    0700        EVENT     7,0,SPLYS*ON
0002A    00
0002B    0000
0002D    0A00        EVENT     10,2,FUS*LOAD
0002F    02
00030    0000
00032    3000        EVENT     48,8,DECG*INV       DECISION GATE FOR INVTD COPIES
00034    08
00035    0000
00037    3600        EVENT     54,5,FUS*NTLD       FUSER LOADED TEST
00039    05
```

```
0003A   0000
0003C   3C00      EVENT    60,3,FDR6MELT       CHECK IF MAIN FDR STILL ON
0003E   03
0003F   0000
00041   4000      EVENT    64,2,FDR2MNFD       MAIN FEED TIME
00043   02
00044   0000
00046   5D00      EVENT    93,8, JAM6*NON      PAPER PATH JAM SW PITCH EVENT
00048   08
00049   0000
0004B   7600      EVENT    118,9,JAM5*INV      PAPER PATH MAM SW PITCH EVENT
0004D   09
0004E   0000
00050   7800      EVENT    120,0,FSH*OFF
00052   00
00053   0000
00055   8200      EVENT    130,0,FLASHINC
00057   00
00058   0000
0005A   8700      EVENT    135,0,PROG&HST      PROG HISTORY FILE UPDATE
0005C   00
0005D   0000
0005F   8F00      EVENT    143,6,JAM4&CHK      PAPER PATH JAM SW PITCH EVENT
00061   06
00062   0000
00064   AA00      EVENT    170,10,RET2*CHK     PAPER PATH JAM SW PITCH EVENT
00066   0A
00067   0000
00069   CF00      EVENT    207,3,SOS*CLN
0006B   03
0006C   0000
0006E   D100      EVENT    209,2,TRN5CURR
00070   02
00071   0000
00073   E300      EVENT    227,5,JAM*CHK       PAPER PATH JAM SW PITCH EVENT
00075   05
00076   0000
00078   0901      EVENT    265,2,FDR3EDG       ENABLE AUX EDR WT SENSOR
0007A   02
0007B   0000
0007D   0B01      EVENT    267,4,JAM2*CHK      PAPER PATH JAM SW PITCH EVENT
0007F   04
00080   0000
00082   0E01      EVENT    270,8,RET1*CHK      PAPER PATH JAM SW PITCH EVENT
00084   08
00085   0000
00087   4201      EVENT    322,0,200US
00089   00
0008A   0000
0008C   6901      EVENT    361,3,TRN3DTCK
0008E   03
0008F   0000
00091   6C01      EVENT    364,2,FDR4MFDG      ENABLE MAIN WT SENSOR
00093   02
00094   0000
00096   7A01      EVENT    378,0,DVLMR418
00098   00
00099   0000
0009B   B901      EVENT    441,9,JAM6*INV      PAPER PATH JAM SW PITCH EVENT
0009D   09
0009E   0000
000A0   C201      EVENT    450,4,FUS*UNLD
000A2   04
000A3   0000
000A5   C301      EVENT    451,2,TRN1ROLL
000A7   02
```

```
000A8   0000
000AA   F401        EVENT     500,0,SMPL*ON
000AC   00
000AD   0000
000AF   F501        EVENT     501,0,SMPL*OFF
000B1   00
000B2   0000
000B4   0F02        EVENT     526,3,TRN4DICK
000B6   03
000B7   0000
000B9   2602        EVENT     550,0,200US
000BB   00
000BD   0000
000BE   5802        EVENT     600,0,BIL*PLOP     TEST FOR PLATEN OPEN (BLG)
000C0   00
000C1   0000
000C3   7602        EVENT     630,5,INVTRCTL     INVTR GATE & RETURN CONTROL
000C5   05
000C6   0000
000C8   8A02        EVENT     650,6,DECG*NON     DECISION GATE FOR NON-INVTD
000CA   06
000CB   0000
000CD   9A02        EVENT     660,0,JAM*DLY
000CF   00
000D0   0000
000D2   BC02        EVENT     700,7,JAM5*NON     PAPER PATH JAM SW PITCH EVENT
000D4   07
000D5   0000
000D7   E702        EVENT     743,0,200US
000D9   00
000DA   0000
000DC   EE02        EVENT     750,0,200US
000DE   00
000DF   0000
000E1   1C03        EVENT     796,0,200US
000E3   00
000E4   0000
000E6   2003        EVENT     800,0,PROGMODE
000E8   00
000E9   0000
000EB   2203        EVENT     802,0,FSH*FNB
000ED   00
000EE   0000
000F0   5203        EVENT     850,4,SRSK&EV      INIT SRSK & SRT MOTOR
000F2   04
000F3   0000
000F5   6B03        EVENT     875,0,200US
000F7   00
00078   0000
000FA   6F03        EVENT     878,2,FDR5AFLT     CHECK IF AUX FOR STILL ON
000FC   02
000FD   0000
000FF   7203        EVENT     882,1,FDR1AXFD     AUX FEED TIME
00101   01
00102   0000
00104   8403        EVENT     900,0,200US
00106   00
00107   0000
00109   8E03        EVENT     910,0,91*FV
0010B   00
0010C   0000
0010E   E703        EVENT     999,0,OVER*RUN
00110   00
00111   0000
                    ENDTABLE
```

TABLE III

VARIABLE PITCH EVENT TABLE

```
   00    01     FLSH*BSE  FQU      1
   00    0F     FO&ONBSE  FQU      15
   00    6F     FO*OFFBS  FQU      111
00000    0100   ROM*FSH   DW       FLSH*BSE
00002    00               DB       0
00003    0000             DW       FSH*ON
00005    6F00   ROM*OFF   DW       FO*OFFBS
00007    00               DB       0
00008    0000             DW       FO*OFF
0000A    0F00   ROM*ON    DW       FO*ONBSE
0000C    00               DB       0
0000D    0000             DW       FO*ON
0000F    0100   ROM*FSHS  DW       FLSH*BSE
00011    00               DB       0
00012    0000             DW       FSH*ON*S
00014    6F00   ROM*OFFS  DW       FO*OFFBS
00016    00               DB       0
00017    0000             DW       FO*OFF*S
```

TABLE IV

PITCH TABLE BUILDER

```
00113   2A0000   TBLD*PRT  LHLD  ROM*FSH          H&L= BASE CNT OF FLASH
00116   EB                 XCHG                   D&E= BASE CNT OF FLASH
00117   2A56F8             LHLD  1FLSH*ON         H&L= RED ADJ
0011A   19                 DAD   D                H&L= BASE + ADJ
0011B   2283F8             SHLD  RAM*FSH          RAM*FSH= BASE + ADJ
0011E   2AC500             LHLD  ROM*OFF          H&L= BASE CNT OF FO OFF
00121   EB                 XCHG                   B&E= BASE CNT OF FO OFF
00122   2A58F8             LHLD  1FO*OFF          H&L= BASE ADJ + TRIM ADJ
00125   19                 DAD   D                H&L= BASE + ADJ
00126   2288F8             SHLD  RAM*OFF          RAM*OFF= BASE + ADJ
00129   2A0A00             LHLD  ROM*ON           H&L= BASE CNT OF FO ON
0012C   EB                 XCHG                   B&E= BASE CNT OF FO ON
0012D   2A5AF8             LHLD  1FO*ON           H&L= RED ADJ + TRIM ADJ
00130   19                 DAD   D                H&L= BASE + ADJ
00131   CD0303             CALL  ON*MOD           CALL MOD ROUTINE TO MOD IF  0
00134   228DF8             SHLD  RAM*ON           RAM*ON= RESULTS OF ABOVE
00137   3A1DF4             IF:   FLG,IMG*SFT,T    IS THERE IMAGE SHIFT
0013A   07
0013B   D26F01
0013E   3E06               MVI   A,6              YES, # OF VAR EVENTS TO USE= 6
00140   47                 MOV   B,A              SET UP B-REG FOR LOOP CONTROL
00141   3215FE             STA   TBLD*NUM         STORE # OF VAR EVENTS
00144   3D                 DCR   A                SET UP # OF TIMES TO GO
00145   3221FE             STA   TBLD*TMP         THRU SORT
00148   2A0F00             LHLD  ROM*FSHS         UPDATE ROM*FSHS TO
0014B   EB                 SCHG                   INCLUDE RED MODE ADJ + SHIFT
0014C   2A5CF8             LHLD  2FLSH*ON         ADJ AND SAVE FOR THE
0014F   19                 DAD   D                IMAGE SHIFT
00150   2292F8             SHLD  RAM*FSHS         FLASH EVENT
00153   2A1400             LHLD  ROM*OFFS         UPDATE ROM*OFFS TO INCLUDE
00156   EB                 XCHG                   RED MODE ADJ + TRIM ADJ +
00157   2A5EF8             LHLD  2FO*OFF          SHIFT ADJ AND SAVE
0015A   19                 DAD   D                FOR THE IMAGE SHIFT
0015B   2297F8             SHLD  RAM*OFFS         FADE OUT EVENT
0015E   2A1900             LHLD  ROM*ONS          UPDATE ROM*ONS TO INCLUDE
```

```
00161  EB       XCHG                             RED MODE ADJ + TRIM ADJ +
00162  2A60F8   LHLD     2FO*ON                  SHIFT ADJ
00165  19       DAD      D
00166  CD0303   CALL     ON*MOD                  CALL MOD ROUTINE TO MOD IF  0
00169  229CF8   SHLD     RAM*ONS                 SAVE THE RESULTS
0016C  C37901   ELSE:
0016F  3F303    MVI      A,3                     IF IMAGE SHIFT NOT SET
00171  47       MOV      B,A                     #OF VAR EVENTS TO USE = 3
00172  3215FE   STA      TBLD*NUM                SET UP B-REG LOOP CONTROL
00175  3D       DCR      A                       STORE # OF VAR EVENTS & SETUP
00176  3221FE   STA      TBLD&TMP                #OF TIMES TO GO THRU SORT
                ENDIF
```

TABLE V

SORTS VARIABLE RAM EVENT TABLE BY
ABS CLK COUNT & LOWEST ENDS IN EV*RAM

```
00197  2183F8   1XI      H,FV*RAM                H&L= ADDR OF TOP OF VAR RAM TBL
0019A  3A21FE   WHILE:   XBYT,TBLD*TMP,NE,0      TIMES TO GO THRU OUTER LOOP
0019D  FE00
0019F  CA1602
001A2  3223FE   STA      IN*LP*CT                INTER LOOP CNT=OUTER LOOP CNT
001A5  3E80     SFLG     TBLD*1ST                SET 1ST FLAG FOR THIS POSITION
001A7  3261F4
001AA  227FF8   SHLD     FIX*ADDR                ADDR OF POSITION TO FULL
001AD  B7       ORA      A                       CLEAR Z CONDITION BIT
001AE  CA0802   WHILE:   CC,Z,C
001B1  5F       MOV      E,M                     E= LS PART OF ABS CLK COUNT
001B2  23       INX      H
001B3  56       MOV      D,M                     D= MS PART OF ABS CLK COUNT
001B4  D5       PUSH     D                       STORE ABS CLK CNT OF FILL POS
001B5  3A61F4   IF:      FLG,TB1D*1ST,T          IS IT 1ST TIME FOR THIS POS
001B8  07
001B9  D2C701
001BC  AF       CFLG     TB1D*1ST                YES, CLEAR ITS FLAG
001BD  3261F4
001C0  23       INX      H                       AND INCREMENT
001C1  23       INX      H                       POINTER TO LS PART OF
001C2  23       INX      H                       ABS CLK COUNT OF NEXT
001C3  23       INX      H                       EVENT
001C4  C3CF01   ELSE:
001C7  2A7DF8   1HLD     VAR*ADDR                H&L= ADDR
001CA  23       INX      H                       OF LS PART OF
001CB  23       INX      H                       ABS CLK COUNT TO
001CC  23       INX      H                       COMPARE TO FILL
001CD  23       INX      H                       POSITION
001CE  23       INX      H
                ENDIF
001CF  227DF8   SHLD     VAR*ADDR                STORE POINTER TO COMPARE EVENT
001D2  5F       MOV      EM,                     F= LS PART OF COMPARE ABS CLK
001D3  23       INX      H
001D4  56       MOV      D,M                     D= MS PART OF COMPARE ABS CLK
001D5  E1       POP      H                       H&L= ABS CLK COUNT OF FILL POS
001D6  EB       IF:      XWRD,D,LT,H             IS CLK OF COMPARE <FILL
001D7  CD0000
001DA  D2FE01
001DD  2A7DF8   LHLD     VAR*ADDR                YES, SWITCH THE 2 EVENTS
001E0  EB       XCHG                             D&F= ADDR LOWER CLK VALUE
001E1  2A7FF8   LHLD     FIX*ADDR                H&L= ADDR LARGER CLK VALUE
001E4  3FFB     MVI      A,-5                    INITIALIZE LOOP COUNTER TO 5
001E6  3222FE   STA      TSW*NUM                 WHICH = # OF ITEMS TO MOVE
001E9  B7       ORA      A                       CLEAR Z CONDITION BIT
001EA  CAFE01   WHILE:   CC,Z,C
```

```
001ED  1A       LDAX     D            A= CONTAINS OF COMPARE EVENT
001EE  46       MOV      B,M          B= CONTAINS OF FILL EVENT
001EF  77       MOV      M,A          UPDATE FILL POS
001F0  78       MOV      A,B          UPDATE COMPARE POS
001F1  12       STAX     D            WITH NEW VALUE
001F2  13       INX      D            MOVE POINTERS TO
001F3  23       INX      H            NEXT ITEM
001F4  3A22FE   LDA      TSW*NUM      INC MOVE
001F7  3C       INR      A            LOOP CONTROL
001F8  3222FE   STA      TSW*NUM      COUNTER
001FB  C3EA01   ENDWHILE
                ENDIF
001FE  2123FE   DECBYT   IN*LP*CT     DECRM INNER LOOP CNTR
00201  35
00202  2A7FF8   LHLD     FIX*ADDR     H&L= ADDR OF FILL POSITION
00205  C3AE01   ENDWHILE
00208  110500   LXI      D,5          MOV H&L TO LOOK AT NEXT EVENT
0020B  19       DAD      D            POSITION TO FILL
0020C  3A21FE   LDA      TBLD*TMP     DECREMENT # OF EVENTS
0020F  3D       DCR      A            TO SORT
00210  3221FE   STA      TBLD*TMP
00213  C39A01   ENDWHILE
```

TABLE VI

MOVE THE SR# & EVENT ADDR FROM ROM TABLE TO RAM TABLE

```
00179  1183F8   1XI      D,RAM*FSH    D&F= ADDR OF RAM TABLE
0017C  210000   1XI      H,ROM*FSH    H&L= ADDR OF ROM TABLE
0017F  BO       ORA      B            CLEAR Z CONDITION BIT
00180  CA9701   WHILE:   CC,Z,C
00183  23       INX      H            INCREMENT H&L AND D&E
00184  23       INX      H            POINTERS OVER THE
00185  13       INX      D            ABS CLK COUNT
00186  13       INX      D
00187  7E       MOV      A,M          LOAD A WITH SR#
00188  12       STAX     D            STORE SR# IN RAM TABLE
00189  23       INX      H            MOVE POINTERS TO LS
0018A  13       INX      D            ADDR OF EVENT
0018B  7F       MOC      A,M          LOAD A WITH LS ADDR OF EVENT
0018C  1P       STAX     D            & STORE IT IN RAM TABLE
0018D  23       INX      H            MOVE POINTERS TO MS
0018E  13       INX      D            ADDR OF EVENT
0018F  7E       MOV      A,M          MOVE MS ADDR OF EVENT
00190  12       STAX     D            TO RAM
00191  23       INX      H            MOVES POINTERS TO
00192  13       INX      D            LS PART OF ABS CLK COUNT
00193  05       DCR      B            DECREMENT LOOP COUNTER
00194  C38001   ENDWHILE
```

TABLE VII

MERGE VARIABLE PITCH EVENT TABLE & FIXED EVENT TABLE CALCULATING THE REL DIFFERENCE WITH THE RESULTS GOING INTO THE RUN EVENT TABLE

```
00216  2A83F8   LHLD     EV*RAM       INITIALIZE VAR*CLK TO ABS CLK
00219  227BF8   SHLD     VAR*CLK      COUNT OF 1ST VAR PITCH EVENT
0021C  2183F8   LXI      H,EV*RAM     INITIALIZE VAR*ADDR TO ADDR OF
0021F  227DF8   SHLD     VAR*ADDR     1ST VAR PITCH EVENT
00222  211E00   1XI      H,EV*ROM     INITIALIZE FIX*ADDR TO ADDR OF
```

```
00225   227FF8    SHLD      FIX*ADDR            1ST FIXED PITCH EVENT
00228   3E80      SFLG      TB1D*1ST            NOTES 1ST EVENT TO RUN TABLE
0022A   3261F4
0022D   3E31      MVI       A,TABLENUM          INITIALIZE TSW*NUM TO # OF
0022F   3222FE    STA       TSW*NUM             EVENTS IN FIXED PITCH TABLE
00232   2A1E00    LHLD      EV*ROM              INITIALIZE D&E WITH ABS CLOCK
00235   EB        XCHG                          COUNT OF 1ST FIXED EVENT
00236   AF        CFLG      VAR*DONE            FLAG DENOTES VAR EVENTS
00237   3262F4
0023A   3A62F4    WHILE:    FLG,VAR*DONE,F      WHILE THERE ARE MORE VAR EVENTS
0023D   07
0023E   DA8802
00241   2A7BF8    IF:       XWRD,VAR*CLK,LE,D   IS VAR CLK CNT = FIXED CLK CNT
00244   CD0000
00247   DA4D02
0024A   C27202
0024D   2A7DF8    LHLD      VAR*ADDR            YES, H&L= VAR EVENT ADDR
00250   CDAC02    CALL      TBLD*UPD            PLACE VAR EVENT AT END RUN TBL
00253   3A15FE    LDA       TBLD*NUM            DECREMENT # OF
00256   3D        DCR       A                   VARIABLE EVENTS LEFT
00257   3215FE    STA       TBLD*NUM            TO MERGE
0025A   C26502    IF:       CC,Z,S              DID TBLD*NUM GO TO 0
0025D   3F80      SFLG      VAR*DONE            YES, DENOTE NO MORE VAR EVENTS
0025F   3262F4
00262   036F02    ELSE:
00265   227DF8    SHLD      VAR*ADDR            STORE ADDR OF NEXT VAR EVENT
00268   5F        MOV       E,M                 UPDATE VAR*CLK TO
00269   23        INX       H                   VALUE OF ABS CLK COUNT
0026A   56        MOV       D,M                 OF PRESENT VARIABLE
0026B   EB        XCHG                          EVENT
0026C   227BF8    SHLD      VAR*CLK
                  ENDIF
0026F   C37F02    ELSE:                         IF FIXED TABLE CLK COUNT IS
00272   2A7FF8    LHLD      FIX*ADDR            LESS THEN VAR TABLE UPDATE THE
00275   CDAC02    CALL      TBLD*UPD            RUN TABLE WITH THAT EVENT
00278   227FF8    SHLD      FIX*ADDR            UPDATE TO NEXT FIXED EVENT
0027B   2122FE    LXI       H,TSW*NUM           DECREMENT # OF FIXED EVENTS
0027E   35        DCR       M                   LEFT
                  ENDIF
0027F   2A7EF8    LHLD      FIX*ADDR
00282   5F        MOV       E,M                 UPDATE D&L TO =
00283   23        INX       H                   ABS CLK CNT VALUE
00284   56        MOV       D,M                 OF PRESENT FIXED TABLE
00285   C33A02    ENDWHILE
00288   3FFF      MVI       A,X'FF'             CLEAR Z CONDITION
0028A   B7        ORA       A                   BIT FOR LOOP
0028B   2A7FF8    LHLD      FIX*ADDR            NO MORE VAR EVENTS, USE FIXED
0028E   CA9D02    WHILE:    CC,Z,C              DONE WITH FIXED TABLE
00291   CDAC02    CALL      TBLD*UPD            NO, UPDATE RUN TABLE
00294   EB        XCHG                          SAVE H&L IN D&F
00295   2122FE    LXI       H,TSW*NUM           DECREMENT # OF FIXED
00298   35        DCR       M                   EVENTS LEFT
00299   EB        XCHG                          RESTORE H&L
0029A   C38E02    ENDWHILE
0029D   2A81F8    LHLD      P*TBL*A             H&L= ADDR OF LAST MS ADDR IN RUN
002A0   2B        DCX       H                   MOVE H&L POINTER BACK TO PRINT
002A1   2B        DCX       H                   AT THE EGINNING OF THE LAST
002A2   2B        DCX       H                   EVENT (OVER*RUN) & STORE IT
002A3   2250F8    SHLD      EV*PTR:             FOR MACH CLK INTERRUPT HANDLER
002A6   3E80      SFLG      TB1D*FIN            DENOTES PITCH TABLE IS COMPLETE
002A8   325DF4
002AB   C9        RET
```

TABLE VIII

```
                         PITCH RESET INTERRUPT HANDLER
  00    01          C     SET     1                   ALLOW THE USE OF C-REG
000EE   FB          RSET:EI                           RE-ENABLE INTERRUPTS
000EF   F5                PUSH    PSW                 SAVE A-REG & CONDITION BITS
000F0   3A5DF4            IF:     FLG,TBLD*FIN,T      IS RUN TABLE BUILD FINISHED
000F3   07
000F4   D25401
000F7   3A21F4            IF:     FLG,SR*DONE,T       YES, IS THERE A NEW SR VALUE
000FA   07
000FB   D24A01
00145   3A60F4            ANDIF   FLG,910*DONE,T      YET,DID 910 EVENT GET DONE
00148   07
00149   D29B01
000FE   AF                CFLG    SR*DONE             YES, CLR FLAG FOR NEXT SR EVENT
000FF   3221F4
00102   E5                PUSH    H                   SAVE H&L
00103   2101FE            LXI     H,SR*PTR:           H&L= ADDR OF REL PNTR TO SR#0
00106   7E                MOV     A,M                 A= REL PNTR TO SR#0
00107   D601              SUI     1                   MOVE PNTR BACK 1 SR POSITION
                                                      (DECREMENT SR PTR)
00109   E61F              ANI     SR*ADJ:             CORRECT FOR POSSIBLE OVERFLOW
0010B   77                MOV     M,A                 SAVE NEW REL SR PNTR IN SR*PTR:
0010C   26F8              MVI     H,SR*BASE:
0010E   6F                MOV     L,A                 H&L= ABS ADDR OF SR#0
0010F   3A05FE            LDA     SR*VALU:            A= NEW SR VALUE
00112   77                MOV     M,A                 UPDATE CONTENTS OF SR#0
00113   211FFE            LXI     H,EV*1*TIM          H&L= ADDR OF TIME TO 1ST EVENT
00116   4E                MOV     C,M                 C= REL DIFF TO 1ST EVENT
00117   2100FB            LXI     H,EV*BASE:          H&L= ADDR OF 1ST EVENT
0011A   2250F8            SHLD    EV*PTR:             SAVE IN EV*PTR:
0011D   3A10F4            IF:     FLG,NORM*DN:,F      IS NORMAL SHUTDOWN REQUESTED
00120   07
00121   DA4601
00124   3A49F7            ANDIF:  FLG,CYCL*DN:,F      NO, IS CYCLE-DOWN REQUESTED
00127   07
00128   DA4601
00128   3A16F4            ANDIF:  FLG,SD1*DLY,F       NO, IS PROC DEAD CYCLING
0012E   07
0012F   DA4601
00132   2107FE            LXI     C,CYCUPCT:          NO, H&L= ADDR OF CYCLE-UP CNTR
00135   7E                IF:     XBYT,M,NE,5         IS PROC IN CYCLE-UP MODE
00136   FE05
00138   CA4601
0013B   FE04              IF:     XBYT,A,EQ,4         YES, IS IT RDY TO MAKE 1ST IMG
0013D   C24501
00140   3E80              SFLG    IMGMADE:            YES, SIGNAL 1ST IMAGE MADE
00142   320FF4
                          ENDIF
00145   34                INR     M                   INCRM CYCLE-UP CNTR (UNTIL= 5)
                          ENDIF
                          ENDIF
00146   E1                POP     H                   RESTORE H&L
00147   C35401            ELSE:                       NEW SR VALUE NOT AVAILABLE
0014A   3E80              SFLG    IMED*DN:            REQUEST AN IMED SHUTDOWN
0014C   324AF7
0014F   3E80              SFLG    E*PR*FLT            SIGNAL EARLY PITCH RESET FAULT
                          ENDIF
                          ENDIF
00154   3EFE              MVI     A,RSETFF:           LOAD FLIP-FLOP RESET INSTR
00156   3200E6            STA     RSINTFF:            RESET PITCH RESET FLIP-FLOP
00159   F1                POP     PSW                 RESTORE A-REG & CONDITION BITS
0015A   C9                RET                         RETURN TO INTERRUPTED ROUTINE
```

TABLE IX

```
                         MACHINE CLOCK INTERRUPT HANDLER
   00     01                  SET       1                   ALLOW THE USE OF THE C-REG
   06     2B                  ORIGIN    X'38'
00038     F5             MCLK PUSH      PSW                 SAVE A-REG & CONDITION CODES
00039     0D                  DCR       C                   DECRM MACH CLOCK CNTR
0003A     C26400              IF:       CC,Z,S              IT IS ,EQ,0
0003D     E5                  PUSH      H                   YES, PREPARE TO DO EVENT
0003E     D5                  PUSH      D                   SAVE H&L AND D&E
0003F     2A50F8              LHLD      EV*PTR:             H&L= EVENT TABLE PNTR
00042     4E                  MOV       C,M                 C= REL DIFF (CLOCK COUNTS)
00043     C5                  PUSH      B                   SAVE B&C (C-REG NOT AFFECTED)
00044     23                  INX       H                   H&L NOW PNT TO REL SR IN TABLE
00045     3A01FE              LDA       SR*PTR:             A= PNTR TO '0' SR POSITION
00048     86                  ADD       M                   A= PNTR TO PROPER SR POSITION
00049     E61F                ANI       SR*ADJ:             ADJUST A-REG FOR TABLE OVERFLOW
0004B     5F                  MOV       E,A                 E= LO ADDR OF PROPER SR
0004C     47                  MOV       B,A                 B= LO ADDR OF PROPER SR
0004D     16F8                MVI       D,SR*BASE:          D= HI ADDR OF SHIFT REGS
0004F     1A                  LDAX      D                   A= <PROPER SR>
00050     23                  INX       H                   H&L NOW PNT TO LO EVENT ADDR
00051     5E                  MOV       E,M                 E= LO EVENT ADDR
00052     23                  INX       H                   H&L NOW PNT TO HI EVENT ADDR
00053     56                  MOV       D,M                 D= HI EVENT ADDR
00054     23                  INX       H                   H&L NOW PNT TO REL DIFF FOR
                                                            NEXT EVENT
00055     2250F8              SHLD      EV*PTR:             SAVE H&L FOR NEXT EVENT TIME
00058     EB                  XCHG                          H&L= ADDR OF EVENT SUBR
00059     115E00              LXI       D,RTN:              D&E= RETURN ADDR FOR EVENT SUBR
0005C     D5                  PUSH      D                   SAVE ON STACK (EVENTS USE RET)
0005D     E9                  PCHL                          'CALL' PROPER EVENT SUBR
0005E     C1             RTN: POP       B                   RESTORE B&C
0005F     D1                  POP       D                   RESTORE D&E
00060     E1                  POP       H                   RESTORE H&L
00061     C36D00              ELSE:
00064     79                  IF:       XBYT,C,AND,1,NZ     IS IT TIME FOR A REFRESH
00065     E601
00067     CA6D00
0006A     3202E6              REFRESH                       YES, INITIATE AN OUTPUT REFRESH
                              ENDIF
                              ENDIF
0006D     FB                  EI                            RE-ENABLE INTERRUPT SYSTEM
0006E     3EFD                MVI       A,MCLKFF:
00070     3200E6              STA       RSINTFF:            RESET MCLK INTERRUPT FLIP-FLOP
00073     F1                  POP       PSW                 RESTORE A-REG & CONDITION BITS
00074     C9                  RET                           RETURN TO INTERRUPTED ROUTINE
   00     09                  SET       9                   DISALLOW THE USE OF THE C-REG
```

TABLE X

AUTOMATIC DOCUMENT HANDLER INTERRUPT HANDLER

```
 00000001      C          SET       1                 ALLOW PUSH B TO SAVE B ON STACK
00075     FB      ADHCLK: FI                          ENABLE INTERRUPTS
00076     F5              PUSH      PSW               SAVE A-REG & CONDITION CODES
00077     E5              PUSH      H                 SAVE H&L
00078     212FFE          IXI       H,AD*D*CNT        INR COUNTER TO COUNT CLK COUNTS
0007B     34              INR       M                 BETWEEN EVENTS FOR DIAGNOSTICS
0007C     2116FE          IXI       H,AD*CLK          DEC COUNTER WHICH CONTENTS
0007F     35              DCR       M                 IS ADH CLK CNTS BETWEEN EVENTS
00080     C2B300          IF:       CC,Z,S            HAS IT GONE TO ZERO
```

```
00083  D5          PUSH     D                  SAVE D&E
00084  C5          PUSH     B                  DAVE B&C
00085  3A17FE      CASE:    VBYT,AD*STATE      GO TO THE CORRECT SEQ SUB-
00088  11B000
0008B  FF10
0008D  CD0000
00090  0000        C,0      AD0STATE           ROUTINE
00092  0000        C,1      AD1STATE
00094  0000        C,2      AD2STATE
00096  0000        C,3      AD3STATE
00098  0000        C,4      AD4STATE
0009A  0000        C,5      AD5STATE
0009C  0000        C,6      AD6STATE
0009E  0000        C,7      AD7STATE
000A0  0000        C,8      AD8STATE
000A2  0000        C,9      AD9STATE
000A4  0000        C,10     ADASTATE
000A6  0000        C,11     ADBSTATE
000A8  0000        C,12     AD0STATE
000AA  0000        C,13     AD0STATE
000AC  0000        C,14     AD0STATE
000AE  0000        C,15     ADESTATE
                   FINDCASE
000B0  E1          POP      H                  PULL B&C OFF STACK
000B1  44          MOV      B,H                RESTORE ONLY B-REG
00082  D1          POP      D                  RESTORE D&E
                   ENDIF
000B3  E1          POP      H                  RESTORE H&L
000B4  3FFB        MVI      A,ADHFF:           RESET ADH INTERRUPT
00086  3200E6      STA      RSINTFF:           FLIP-FLOP
000B9  F1          POP      PSW                RESTORE A & CONDITION CODES
000BA  C9          RET                         RETURN TO WHERE IT CAME FROM
   0000009    C.   SET      9                  DISALLOW USE FOR C-REG
```

TABLE XI

```
                REAL TIME CLOCK INTERRUPT HANDLER
000A6  FB       RTC: EI                         RE-ENABLE INTERRUPTS
000A7  F5            PUSH     PSW               SAVE A-REG & CONDITION BITS
000A8  E5            PUSH     H                 SAVE H&L
000A9  D5            PUSH     D                 SAVE D&E
000AA  2120F8        LXI      H,TMRBASE:        H&L= ADDR OF 1ST 10 MSEC TIMER
000AD  160F          MVI      D,TIMCNTL:        D= # OF 10 MSEC TIMERS
000AF  3A55F4        IF:      FLG,DOOR*OPN,T    IS THERE AN INTERLOCK OPEN
000B2  07
000B3  D2B800
000B6  160D          MVI      D,TIMCNTL:-2      YES, PUT 2 TIMERS INTO HOLD
                     ENDIF
000B8  5A            MOV      E,D               D=E= # 10 MSEC TIMERS TO DECRM
000B9  AF            XRA      A                 A= 0 (SET 'Z' CONDITION CODE)
000BA  3C            INR      A                 A= 1 (TIMER TERMINAL COUNT)
000BB  CAC800        WHILE:   CC,Z,C            WHILE '# TIMERS' .NE. 0...
000BE  35            DCR      M                 DECRM PRESENT 10 MSEC TIMER
000BF  C2C300        IF:      CC,Z,S            IS PRESENT TIMER .EQ. 0
000C2  77            MOV      M,A               YES, RESET TO 1 (TERMINAL CNT)
                     ENDIF
000C3  23            INX      H                 H&L= NEXT TIMER ADDR
000C4  1D            DCR      E                 DECRM LOOP CNTR (# OF TIMERS)
000C5  C3BB00        ENDWHILE
000C8  2106FE        LXI      H,DIVD10:         H&L= ADDR OF DIVD BY 10 CNTR
000CB  35            DCR      M                 DECRM DIVD BY 10 CNTR
000CC  C2E500        IF:      CC,Z,S            IS IT .EQ.0
000CF  360A          MVI      M,10              YES, RESET IT TO 10
000D1  212FF8        LXI      H,TMRBASE:+TIMCNTL:H&L= ADDR OF 1ST 100 MSEC TIMER
```

```
000D4   7A       MOV       A,D                    A= # TIMERS USED IN 1ST LOOP
000D5   D60A     SUI       TIMCNT1:-TIMCNT2:      A= # 100 MSEC TIMERS TO DECRM
000D7   1C       INR       E                      E= 1 (TIMER TERMINAL COUNT)
000D8   CAE500   WHILE:    CC,Z,C                 WHILE '# TIMERS' .NE. 0...
000DB   35       DCR       M                      DECRM PRESENT 100 MSEC TIMER
000DC   C2E000   IF:       CC,Z,S                 IS PRESENT TIMER .EQ. 0
000DF   73       MOV       M,E                    YES, RESET TO 1 (TERMINAL CNT)
                 ENDIF
000E0   23       INX       H                      H&L= NEXT TIMER ADDR
000E1   3D       DCR       A                      DECRM '# OF TIMERS' CNTR
000E2   C3D800   ENDWHILE
                 ENDIF
000E5   D1       POP       D                      RESTORE D&E
000E6   E1       POP       H                      RESTORE H&L
000E7   3EF7     MVI       A,RTCFF:               LOAD FLIP-FLOP RESET INSTR
000E9   3200E6   STA       RSINTFF:               RESET RTC INTERRUPT FLIP-FLOP
000EC   F1       POP       PSW                    RESTORE A-REG & CONDITION BITS
000ED   C9       RET                              RETURN TO INTERRUPTED ROUTINE
```

Referring particularly to the timing chart shown in FIG. 33, an exemplary copy run wherein three copies of each of two simplex or one-sided originals in duplex mode is made. Referring to FIG. 24, the appropriate button of copy selector 808 is set for the number of copies desired, i.e. 3 and document handler button 822, sorter select button 825 and two sided (duplex) button 811 depressed. The originals, in this case, two simplex or one-sided originals are loaded into tray 233 of document handler 16 (FIG. 22) and the Print button 805 depressed. On depression of button 805, the host machine 10 enters the PRINT state and the Run Event Table for the exemplary copy run programmed is built by controller 18 and stored in RAM section 546. As described, the Run Event Table together with Background routines serve, via the multiple interrupt system and output refresh (through D.M.A.) to operate the various components of host machine 10 in integrated timed relationship to produce the copies programmed.

During the run, the first original is advanced onto platen 35 by document handler 16 where, as seen in FIG. 33, three exposures (1ST FLASH SIDE 1) are made producing three latent electrostatic images on belt 20 in succession. As described earlier, the images are developed at developing station 28 and transferred to individual copy sheets fed forward (1ST FEED SIDE 1) from main paper tray 100. The sheets bearing the images are carried from the transfer roll/belt nip by vacuum transport 155 to fuser 150 where the images are fixed. Following fusing, the copy sheets are routed by deflector 184 to return transport 182 and carried to auxiliary tray 102. The image bearing sheets entering tray 102 are aligned by edge patter 187 in preparation for refeeding thereof.

Following delivery of the last copy sheet to auxiliary tray 102, the document handler 16 is activated to remove the first original from platen 35 and bring the second original into registered position on platen 35. The second original is exposed three times (FLASH SIDE 2), the resulting images being developed on belt 20 at developing station 28 and transferred to the opposite or second side of the previously processed copy sheets which are now advanced (FEED SIDE 2) in timed relationship from auxiliary tray 102. Following transfer, the side two images are fused by fuser 150 and routed, by gate 184 toward stop 190, the latter being raised for this purpose. Abutment of the leading edge of the copy sheet with stop 190 causes the sheet trailing edge to be guided into discharge chute 186, effectively inverting the sheet, now bearing images on both sides. The inverted sheet is fed onto transport 181 and into sorter 14 where the sheets are placed in successive ones of the first three trays 212 of either the upper of lower arrays 210, 211 respectively depending on the disposition of deflector 220.

Other copy run programs, both simplex and duplex with and without sorter 14 and document handler 16 may be envisioned.

While the invention has been described with reference to the structure disclosed, it is not confined to the details set forth, but is intended to cover such modifications or changes as may come within the scope of the following claims.

What is claimed is:

1. In a reproduction machine for producing impressions of an original, the reproduction machine having a photosensitive member and plural discrete operating components cooperable with one another and the photosensitive member to electrostatically produce impressions on a support material, the combination of:

a controller for operating said machine components in accordance with a program whereby to produce the impressions desired, said program being comprised of both background machine control routines and foreground machine control routines;

interrupt means to temporarily interrupt the machine control routine in progress to refresh control data outputted to said machine components; and control means effective within a preset interval in relation to said refresh to stop said machine.

2. The reproduction machine according to claim 1 in which said control means includes timing means for tolling said preset interval, said timing means being actuated on each refresh to toll said preset interval.

3. The reproduction machine according to claim 1 in which said control means includes timing means for tolling said preset interval, said timing means producing a control signal at the expiration of said preset interval;

means to actuate said timing means and initiate tolling of said preset interval to the next refresh; and stop means responsive to said control signal to stop said machine.

4. The reproduction machine according to claim 1 including output buffer means for temporarily storing control data for said machine components, said interrupt means being adapted to refresh control data in said output buffer means;

said control means including timer means for tolling said preset interval, said interrupt means being adapted to reset said timer means to toll the interval, said timer means producing a control signal at the expiration of said preset interval, and means responsive to said control signal to stop said machine.

5. The reproduction machine according to claim 4 including means to clear said output buffer in response to said control signal.

6. The reproduction machine according to claim 1 including means for periodically generating a refresh command signal;

said interrupt means being responsive to said refresh command signal to initiate said refresh, said control means including timing means for tolling said preset interval, and means for actuating said timing means in response to said refresh command signal.

7. The reproduction machine according to claim 6 in which said machine includes driving means for driving said machine components, and means for operating said refresh command signal generating means in synchronism with said drive means whereby said refresh command signals are generated in synchronism with operation of said machine components.

8. In a reproduction machine for producing impressions of an original, the reproduction machine having a machine clock, a photosensitive member, and plural discrete operating components to electrostatically produce the impressions on a support material, the combination of:

a shift register;

a timer electrically connected to the shift register, the timer and the shift register associated with one of the operating components of the reproduction machine;

a microprocessor;

address and data buses controlled by the microprocessor;

a random access memory having an output buffer containing data;

an interface electrically connecting the microprocessor, the address and data buses, and the random access memory to the reproduction machine, the interface having a priority and storage means responsive to periodic signals from the machine clock for generating a predetermined signal;

a latch responsive to the predetermined signal for initiating a predetermined code;

a refresh signal generator responsive to the predetermined code to initiate transfer of control of the address and data buses to the interface, the interface periodically inputting the data of the output buffer into the shift register, the signal generator providing a signal for activating the timer to set a time period for inputting of the data into the shift register.

9. In a reproduction machine for producing impressions of an original, the reproduction machine having a photosensitive member and plural discrete operating components cooperable with one another to electrostatically produce the impressions on a support material, the combination of:

a controller;

address and data buses;

a memory, the memory containing data relating to the operating components of the reproduction machine;

the address and data buses electrically connecting the controller and the memory with the reproduction machine;

data refresh means electrically connected to the memory for inputting the data contained in the memory to the operating components, the data comprising either a new instruction or a repetition of an old instruction for the operating components of the reproduction machine; and means for periodically actuating the data refresh means for inputting the new and old instructions to the operating components.

10. The reproduction machine of claim 9 wherein the controller is a microprocessor and the data refresh means includes a register, the register being associated with at least one of the discrete operating components;

the data refresh means controlling the input of the data to the register.

11. The reproduction machine of claim 10 including a plurality of latches;

drivers associated with the latches; and a LOAD signal, the latches being electrically connected to the register, the register responsive to the load signal to prevent shifting of data from the register to the latches during input of data into the register, the drivers responsive to the latches to activate predetermined discrete operating components.

12. The reproduction machine of claim 11, including a timer and wherein the discrete operating components comprise a document handler, an illumination and optics system, a developer, a transfer mechanism, and a fuser, the removal of the LOAD signal enabling shifting of data from the register to the latches and conveyance of the data to the drivers for controlling the discrete operating components, the timer imposing a time limit for inputting data to the register.

13. The reproduction machine of claim 12 wherein upon failure to input data to the register the timer initiates the resetting of the register and arresting operation of the reproduction machine.

14. The reproduction machine of claim 9 wherein the means for periodically actuating the data refresh means includes a machine clock and a filter signal conditioner responsive to the operation of the reproduction machine for generating signals to the data refresh means.

15. The reproduction machine of claim 9 including a priority and storage means for generating a predetermined signal and a decoder responsive to the signal for initiating a predetermined code, the data refresh means responsive to the code for inputting the data of the memory to the discrete operating components.

16. The reproduction machine of claim 9 including a timer wherein upon failure of the data refresh means to convey the data of the memory to the discrete operating components within a predetermined time period, the timer initiates the stopping of the reproduction machine.

* * * * *